United States Patent
Yamashita et al.

(10) Patent No.: US 11,697,754 B2
(45) Date of Patent: Jul. 11, 2023

(54) THERMAL CONDUCTIVE LAYER, PHOTOSENSITIVE LAYER, PHOTOSENSITIVE COMPOSITION, MANUFACTURING METHOD FOR THERMAL CONDUCTIVE LAYER, AND LAMINATE AND SEMICONDUCTOR DEVICE

(71) Applicant: FUJIFILM Corporation, Tokyo (JP)

(72) Inventors: Kosuke Yamashita, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/072,001

(22) Filed: Oct. 15, 2020

(65) Prior Publication Data
US 2021/0040370 A1 Feb. 11, 2021

Related U.S. Application Data

(63) Continuation of application No. PCT/JP2019/016086, filed on Apr. 15, 2019.

(30) Foreign Application Priority Data

Apr. 20, 2018 (JP) ................ 2018-081904
Sep. 28, 2018 (JP) ................ 2018-185069
Mar. 7, 2019 (JP) ................ 2019-041304

(51) Int. Cl.
*C09K 5/14* (2006.01)
*C08K 3/04* (2006.01)
(Continued)

(52) U.S. Cl.
CPC ............ *C09K 5/14* (2013.01); *C08K 3/042* (2017.05); *C08K 3/22* (2013.01); *C08K 3/28* (2013.01);
(Continued)

(58) Field of Classification Search
CPC . C09K 5/14; C09K 5/08; C08K 3/042; C08K 3/22; C08K 3/11; C08K 3/34;
(Continued)

(56) References Cited

U.S. PATENT DOCUMENTS 9,416,243 B2 8/2016 Choi et al.
2003/0091844 A1* 5/2003 Inaba .................. H05K 3/4661
428/480

(Continued)

FOREIGN PATENT DOCUMENTS

CN 101189551 5/2008
CN 102959006 B * 2/2015 .............. C08L 63/00
(Continued)

OTHER PUBLICATIONS

EPO machine translation of JP 2006337481A to Daiko et al., published Dec. 14, 2006 (Year: 2006).*
(Continued)

*Primary Examiner* — Jane L Stanley
(74) *Attorney, Agent, or Firm* — JCIPRNET

(57) ABSTRACT

The present invention relates to a thermal conductive layer that includes at least one filler, has a thermal diffusivity of $5.0\times10^{-7}$ $m^2s^{-1}$ or more, and has a volume resistivity of $1.0\times10^{11}$ Ω·cm or more. Further, the present invention relates to a photosensitive layer to which the thermal conductive layer is applied, a photosensitive composition, a manufacturing method for a thermal conductive layer, and a laminate and a semiconductor device.

19 Claims, 2 Drawing Sheets

(51) Int. Cl.
  *C08K 3/22* (2006.01)
  *C08K 3/28* (2006.01)
  *C08K 3/34* (2006.01)
  *C08K 3/38* (2006.01)
  *C08K 7/04* (2006.01)
  *C08K 9/02* (2006.01)
  *H01L 23/373* (2006.01)
  *G03F 7/32* (2006.01)

(52) U.S. Cl.
  CPC .............. *C08K 3/34* (2013.01); *C08K 3/38* (2013.01); *C08K 7/04* (2013.01); *C08K 9/02* (2013.01); *H01L 23/3737* (2013.01); C08K 2003/2227 (2013.01); C08K 2003/2241 (2013.01); C08K 2003/282 (2013.01); C08K 2003/385 (2013.01); C08K 2201/001 (2013.01); C08K 2201/005 (2013.01); C08K 2201/016 (2013.01); *G03F 7/322* (2013.01)

(58) Field of Classification Search
  CPC ... C08K 3/38; C08K 9/02; C08K 7/00; C08K 7/04; C08K 7/18; C08K 2003/2227; C08K 2003/2217; C08K 2003/2296; C08K 2003/2206; C08K 2003/282; C08K 2003/385; C08F 2/44; C08F 2/46; G03F 7/004; G03F 7/029; G03F 7/038; G03F 7/32; G03F 7/322; G03F 7/325
  See application file for complete search history.

(56) References Cited

U.S. PATENT DOCUMENTS

| | | | | |
|---|---|---|---|---|
| 2008/0007890 | A1* | 1/2008 | Harmon | C09K 5/14 361/321.5 |
| 2008/0176167 | A1* | 7/2008 | Kawamori | H01L 21/2007 430/286.1 |
| 2010/0143673 | A1* | 6/2010 | Mitsukura | H01L 23/24 156/330 |
| 2015/0044610 | A1* | 2/2015 | Matsuba | G03F 7/0388 430/280.1 |
| 2015/0252242 | A1* | 9/2015 | Pham | C08K 3/38 252/75 |
| 2017/0283645 | A1* | 10/2017 | Sakaguchi | C09D 133/14 |
| 2020/0247963 | A1* | 8/2020 | Ito | C08L 23/16 |
| 2022/0380213 | A1* | 12/2022 | Tahara | C08G 59/50 |

FOREIGN PATENT DOCUMENTS

| | | |
|---|---|---|
| JP | H03295863 | 12/1991 |
| JP | H05261948 | 10/1993 |
| JP | 2006337481 | 12/2006 |
| JP | 2010234678 | 10/2010 |
| JP | 2013080916 | 5/2013 |
| JP | 2016511314 | 4/2016 |
| TW | 200710571 | 3/2007 |

OTHER PUBLICATIONS

Machine translation of CN 102959006 B to Kanagawa et al. published Feb. 25, 2015 (Year: 2015).*

"Office Action of Korea Counterpart Application" with English translation thereof, dated Sep. 7, 2021, p. 1-p. 15.

"International Search Report (Form PCT/ISA/210) of PCT/JP2019/016086", dated Jun. 4, 2019, with English translation thereof, pp. 1-5.

"Written Opinion of the International Searching Authourity (Form/ISA/237) of PCT/JP2019/016086", dated Jun. 4, 2019, with English translation thereof, p. 1-p. 21.

"Office Action of Japan Counterpart Application" with English translation thereof, dated Jun. 29, 2021, p. 1-p. 14.

"Office Action of China Counterpart Application", dated Nov. 17, 2021, with English translation thereof, p. 1-p. 22.

The Editing Committee Group of the Technical Branch of the Chinese Institute of Electronics, "Microelectronics Packaging Technology," University of Science and Technology of China Press, Apr. 2003, with concise explanation of relevance from English translation of First Office Action, pp. 1-3.

Sun Zhongxian et al., "Electronic chemicals," Chiemical Industry Press, Mar. 2001, with concise explanation of relevance from English translation of First Office Action, pp. 1-4.

Yang Ruicheng et al., "Introduction to Materials Science and Engineering," Harbin Institute of Technology Press, May 2002, with concise explanation of relevance from English translation of First Office Action, pp. 1-3.

"Office Action of Taiwan Counterpart Application", dated Jul. 22, 2022, with English translation thereof, pp. 1-18.

"Office Action of China Counterpart Application", dated Aug. 8, 2022, with English translation thereof, pp. 1-24.

N.A. Adlova et al, "Polyimides", Machine Industry Press, May 1981, pp. 1-2.

"Decision of Refusal of China Counterpart Application", issued on Dec. 26, 2022, with partial English translation thereof, p. 1-p. 19.

* cited by examiner

THERMAL CONDUCTIVE LAYER, PHOTOSENSITIVE LAYER, PHOTOSENSITIVE COMPOSITION, MANUFACTURING METHOD FOR THERMAL CONDUCTIVE LAYER, AND LAMINATE AND SEMICONDUCTOR DEVICE

CROSS-REFERENCE TO RELATED APPLICATIONS

This application is a Continuation of PCT International Application No. PCT/JP2019/016086 filed on Apr. 15, 2019, which claims priority under 35 U.S.C. § 119(a) to Japanese Patent Application No. 2018-081904 filed on Apr. 20, 2018, Japanese Patent Application No. 2018-185069 filed on Sep. 28, 2018 and Japanese Patent Application No. 2019-041304 filed on Mar. 7, 2019. Each of the above application(s) is hereby expressly incorporated by reference, in its entirety, into the present application.

BACKGROUND OF THE INVENTION

1. Field of the Invention

The present invention relates to a thermal conductive layer which is used in electronic equipment such as a semiconductor device. Further, the present invention relates to a photosensitive layer for forming the thermal conductive layer, a manufacturing method for the thermal conductive layer, a laminate having the thermal conductive layer or the photosensitive layer, and a semiconductor device.

2. Description of the Related Art

In recent years, a ubiquitous network society has become a reality with the spread of information network equipment such as a smartphone. It is expected that a demand for achieving higher performance of electronic information equipment such as a portable information terminal will increase in the future, and therefore achieving further higher performance and lower power consumption of a large-scale integrated circuit (LSI) device is essential in order to cope with such a demand. Up to now, high performance and high integration of an LSI device have been achieved by miniaturizing a transistor which is a minimum constitutional unit of the LSI device. However, a three-dimensional lamination integration technique capable of achieving high integration without depending on miniaturization of a transistor has been attracting attention, since physical limitations on transistor miniaturization are approaching.

As the performance of a three-dimensionally laminated LSI device (hereinafter, also referred to as "laminated LSI") becomes higher, an increase in power consumption and the problem of heat generation due to the increased power consumption have become important issues in design technology and packaging technology. In the laminated LSI, the heat generated from an inside LSI device cannot be appropriately dissipated by a conventional method of dissipating heat from a package surface. In a case where the heat dissipation is insufficient, the temperature inside the laminated LSI locally rises, and the transistor characteristics change due to the high temperature. Therefore, there is a concern about an increase in leak current that leads to an increase in power consumption, and a malfunction of a circuit. Furthermore, the heat has various adverse effects not only on the laminated LSI itself, but also on the electronic equipment incorporating the same. Above all, attention should be paid to the effects on safety, performance, and reliability (for example, reduction in operation speed and life).

Therefore, measures against heat in the entire semiconductor package are essential in order to avoid the adverse effects of heat as described above and to put the laminated LSI into practical use.

For example, JP2006-337481A discloses a curable resin composition containing a carboxy group-containing copolymer resin, a photopolymerization initiator, and an inorganic filler having a thermal conductivity of 15 W/m·K or more, in which a content of the inorganic filler is 80% by mass or more in the solid content. Then, it is disclosed that such a curable resin composition has excellent thermal conductivity and excellent moisture resistance and is useful for a package substrate, a resin insulating layer in a surface-mounted light emitting diode, and the like.

JP2016-511314A discloses a dry film solder resist obtained from a resin composition and a circuit board including the dry film solder resist. Then, it is disclosed that the resin composition includes an acid-modified oligomer, a photopolymerizable monomer, a thermosetting binder resin, a photoinitiator, two or more types of spherical alumina particles having different particle sizes, and an organic solvent.

SUMMARY OF THE INVENTION

However, the thermal conductive layer consisting of the conventional materials described in JP2006-337481A and JP2016-511314A may not be able to achieve the thermal conductivity required in recent years.

The present invention has been made in view of the above problems, and an object of the present invention is to provide a novel thermal conductive layer having more excellent thermal conductivity and more excellent electrical insulation.

Another object of the present invention is to provide a photosensitive layer for forming the thermal conductive layer and a manufacturing method for the thermal conductive layer. A further object of the present invention is to provide a laminate having the thermal conductive layer or the photosensitive layer, and a semiconductor device having the thermal conductive layer or the laminate.

It has been found that the above-mentioned objects can be achieved by highly adjusting a thermal diffusivity that contributes to thermal conductivity and a volume resistivity that contributes to electrical insulation within a predetermined range. Specifically, the above-mentioned objects are achieved by the following means <1>, preferably <2> to <21>.

<1> A thermal conductive layer comprising:
at least one filler,
in which the thermal conductive layer has a thermal diffusivity of $5.0 \times 10^{-7}$ m$^2$ s$^{-1}$ or more and a volume resistivity of $1.0 \times 10^{11}$ Ω·cm or more.

<2> The thermal conductive layer according to <1>, in which the filler has a thermal diffusivity of $1.0 \times 10^{-6}$ m$^2$ s$^{-1}$ or more and a volume resistivity of $1.0 \times 10^{11}$ Ω·cm or more.

<3> The thermal conductive layer according to <1> or <2>, in which a material of the filler is at least one of boron nitride, aluminum nitride, silicon nitride, aluminum oxide, magnesium oxide, zinc oxide, or beryllium oxide.

<4> The thermal conductive layer according to any one of <1> to <3>, in which the filler has an average primary particle diameter of 10 μm or less.

<5> The thermal conductive layer according to any one of <1> to <4>, in which the filler has an aspect ratio of 2 or more.

<6> The thermal conductive layer according to any one of <1> to <5>, in which a content of the filler is 20% to 60% by volume.

<7> The thermal conductive layer according to any one of <1> to <6>, in which the thermal conductive layer includes at least one of a polyimide resin, an acrylic resin, or a compound having an epoxy group.

<8> The thermal conductive layer according to any one of <1> to <7>, in which the thermal conductive layer has a patterned shape.

<9> A photosensitive layer for forming the thermal conductive layer according to any one of <1> to <8>, the photosensitive layer comprising:
    at least one filler; and
    a photosensitive material.

<10> The photosensitive layer according to <9>, in which the photosensitive material consists of a photosensitizer and a material that is cured by an action of a photosensitizer.

<11> The photosensitive layer according to <9> or <10>, in which the photosensitive layer is used for alkaline development.

<12> The photosensitive layer according to <9> or <10>, in which the photosensitive layer is used for development with a developer containing 50% by mass or more of an organic solvent.

<13> The photosensitive layer according to any one of <9> to <12>, in which the photosensitive layer has a volume reduction rate of 5% or more in a case where the thermal conductive layer is formed.

<14> A photosensitive composition for forming the thermal conductive layer according to any one of <1> to <8> or for forming the photosensitive layer according to any one of <9> to <13>, the photosensitive composition comprising:
    at least one filler; and
    a photosensitive material.

<15> The photosensitive composition according to <14>, in which the photosensitive composition contains a solvent in an amount of 20% to 75% by mass with respect to all components.

<16> A manufacturing method for a thermal conductive layer, comprising:
    a step of applying the photosensitive composition according to <14> or <15> onto a base material to form a photosensitive layer for forming a thermal conductive layer; and
    a step of exposing the photosensitive layer to light.

<17> The manufacturing method according to <16>, further comprising:
    a step of developing the exposed photosensitive layer.

<18> A laminate comprising:
    the thermal conductive layer according to any one of <1> to <8>; and a base material.

<19> The laminate according to <18>, in which the laminate has a heat absorbing portion that is in contact with the thermal conductive layer.

<20> A laminate comprising:
    the photosensitive layer according to any one of <9> to <13>; and
    a base material.

<21> A semiconductor device comprising:
    the thermal conductive layer according to any one of <1> to <8> or the laminate according to <18> or <19>.

According to the thermal conductive layer according to an aspect of the present invention, it is possible to obtain a thermal conductive layer which has thermal conductivity and electrical insulation superior to those of a conventional thermal conductive layer and can be suitably used in recent semiconductor devices. Then, the photosensitive layer and the manufacturing method according to the aspect of the present invention enable the formation of such a thermal conductive layer, and the laminate and the semiconductor device according to the aspect of the present invention suppress the adverse effects of heat generated inside the equipment.

Figure 4:
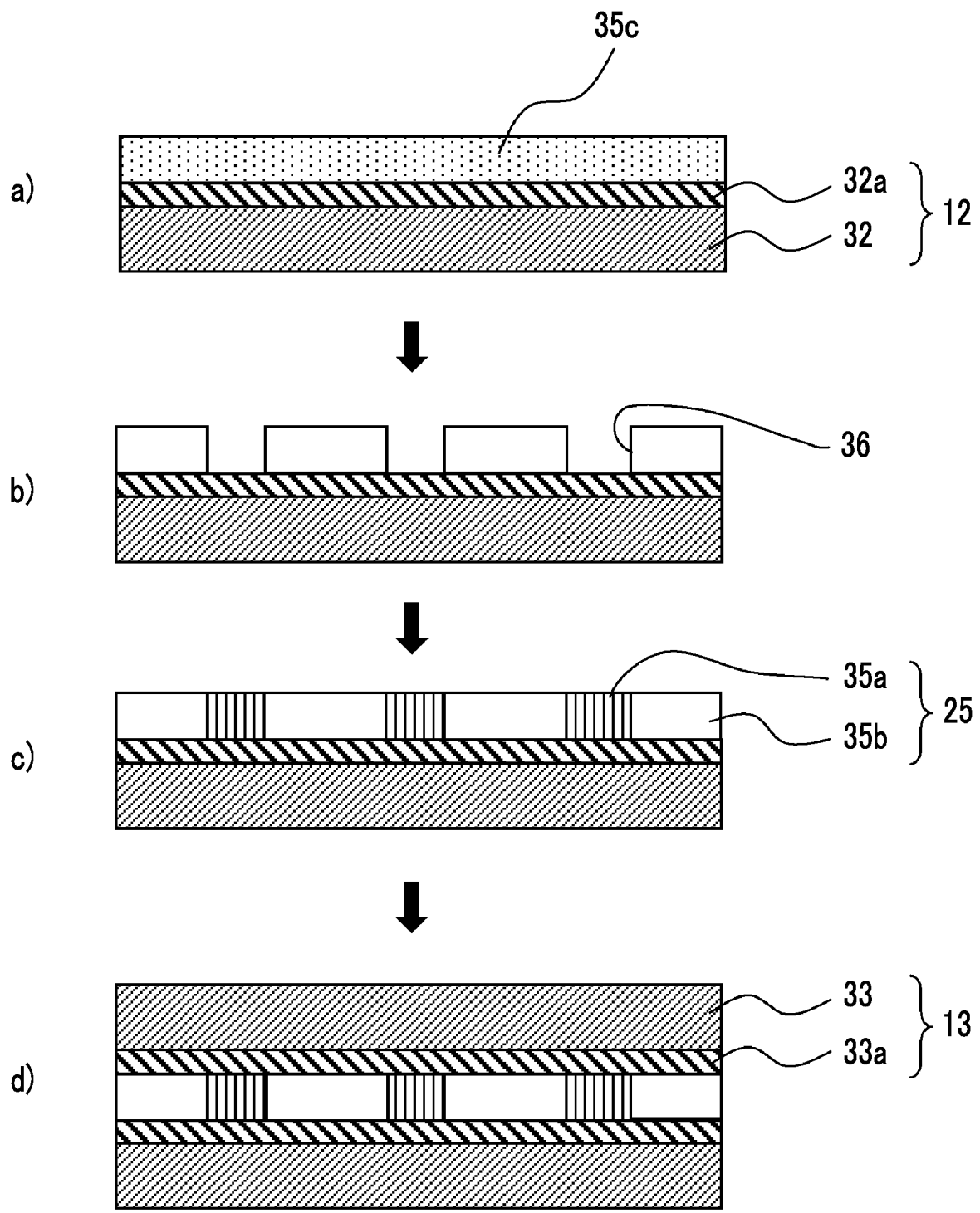

(a) to (d) of FIG. 4 are conceptual diagrams showing a part of a manufacturing process of a laminated LSI.

DESCRIPTION OF THE PREFERRED EMBODIMENTS

Hereinafter, main embodiments of the present invention will be described. However, the present invention is not limited thereto.

The description of the constitutive elements of the present invention as described below may be made based on the representative embodiments of the present invention, but the present invention is not limited to such embodiments.

In a case where substitution or non-substitution is not explicitly indicated in the description of a group (atomic group) in the present specification, the group (atomic group) is intended to include not only a group (atomic group) having no substituent but also a group (atomic group) having a substituent. For example, the term "alkyl group" includes not only an alkyl group having no substituent (unsubstituted alkyl group) but also an alkyl group having a substituent (substituted alkyl group).

In the present specification, the term "exposure" includes not only exposure using light but also lithography using a particle beam such as an electron beam or an ion beam, unless otherwise specified. In addition, the light used for the exposure generally includes a bright line spectrum of a mercury lamp, far ultraviolet rays typified by an excimer laser, extreme ultraviolet rays (EUV light), actinic rays such as X-rays or electron rays, or radiation.

In the present specification, the term "(meth)acrylate" represents both or either of "acrylate" and "methacrylate", the term "(meth)acrylic" represents both or either of "acrylic" and "methacrylic", and the term "(meth)acryloyl" represents both or either of "acryloyl" and "methacryloyl".

In the present specification, the scope of the term "step" includes an independent step as well as a step that cannot be clearly distinguished from other steps but still achieves the desired object of the step of interest.

In the present specification, the solid content refers to a mass percentage of other components excluding a solvent with respect to a total mass of a composition. In addition, temperature refers to 23° C. unless otherwise specified.

In the present specification, the weight-average molecular weight (Mw) and the number-average molecular weight (Mn) are each defined as a value in terms of polystyrene according to gel permeation chromatography (GPC measurement), unless otherwise specified.

In the present specification, the weight-average molecular weight (Mw) and the number-average molecular weight (Mn) can be determined, for example, by using HLC-8220 (manufactured by Tosoh Corporation), and using guard columns HZ-L, TSKgel Super HZM-M, TSKgel Super HZ4000, TSKgel Super HZ3000, and TSKgel Super HZ2000 (all manufactured by Tosoh Corporation) as columns. The eluent is tetrahydrofuran (THF) unless otherwise specified. In addition, unless otherwise specified, the detection is carried out using a detector having a wavelength of 254 nm of UV rays (ultraviolet rays).

<Thermal Conductive Layer and Composition>

Figure 1:
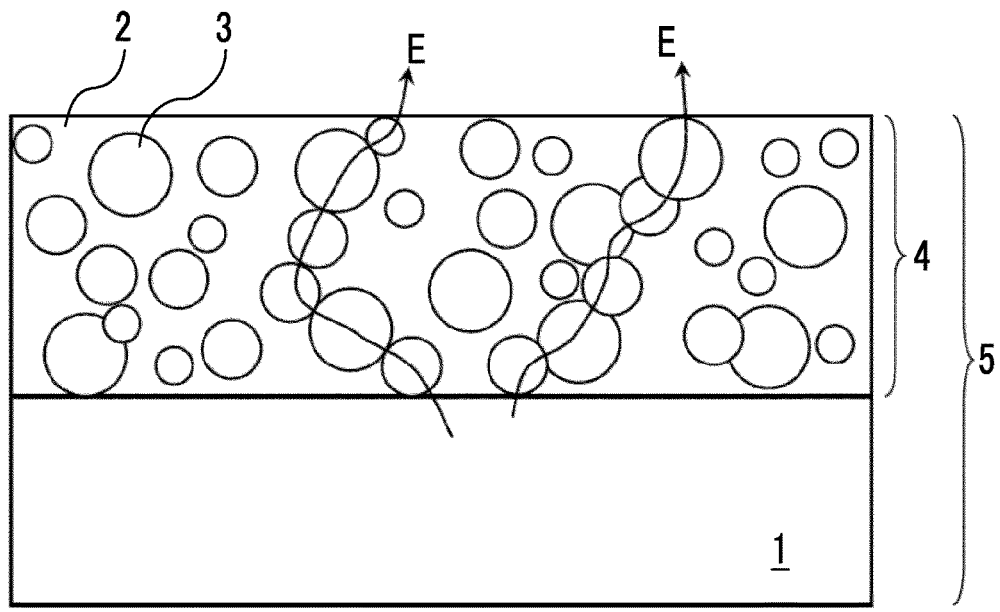
FIG. 1 is a schematic cross-sectional view showing a thermal conductive layer and a laminate according to an embodiment of the present invention.

The thermal conductive layer according to the embodiment of the present invention is characterized by containing at least one filler and having a thermal diffusivity of $5.0 \times 10^{-7}$ m$^2$ s$^{-1}$ or more and a volume resistivity of $1.0 \times 10^{11}$ Ω·cm or more. Such a thermal conductive layer has excellent thermal conductivity and excellent electrical insulation, and therefore can be suitably used as a heat dissipation resin insulating layer for a semiconductor device such as an LSI device. The thermal conductive layer can be formed, for example, by applying the composition according to the embodiment of the present invention containing at least one filler and a resin onto a base material and then drying or curing the applied film. At this time, for example, as shown in FIG. 1, a thermal conductive layer 4 according to the embodiment of the present invention has a structure in which a filler 3 is dispersed in a resin film 2 formed on a base material 1. Since the thermal conductive layer 4 contains the filler 3 and has a thermal diffusivity of $5.0 \times 10^{-7}$ m$^2$ s$^{-1}$ or more, it exhibits higher thermal conductivity as compared with a conventional thermal conductive layer. Therefore, heat energy E transmitted to the thermal conductive layer 4 is rapidly transmitted particularly to a region where the filler 3 is present while being rapidly released from the opposite side. In addition, the thermal conductive layer according to the embodiment of the present invention may have a patterned shape depending on a semiconductor device to which the thermal conductive layer is applied.

The thermal diffusivity of the thermal conductive layer is preferably $5.0 \times 10^{-7}$ m$^2$ s$^{-1}$ or more and particularly preferably $1.0 \times 10^{-7}$ m$^2$ s$^{-1}$ or more. The upper limit of the thermal diffusivity of the thermal conductive layer is not particularly limited, but is $1.0 \times 10^{-4}$ m$^2$ s$^{-1}$ or less for practical use. In addition, the volume resistivity of the thermal conductive layer is preferably $1.0 \times 10^{11}$ Ω·cm or more and particularly preferably $5.0 \times 10^{11}$ Ω·cm or more. The upper limit of the volume resistivity of the thermal conductive layer is not particularly limited, but is $1.0 \times 10^{18}$ Ω·cm for practical use.

<<Filler>>

The composition according to the embodiment of the present invention includes a filler. The filler is preferably thermally conductive. The filler may be electrically insulating, may be a semiconductor, or may be electrically conductive. The degree of electrical insulation and electrical conductivity is appropriately selected depending on the design and purpose. For example, in a case of an electrically insulating filler, the lower limit of the volume resistivity of the filler is preferably $1.0 \times 10^{11}$ Ω·cm or more, more preferably $5.0 \times 10^{11}$ Ω·cm or more, and particularly preferably $1.0 \times 10^{12}$ f·cm or more. In addition, the upper limit of the volume resistivity is not particularly limited, but is $1.0 \times 10^{18}$ Ω·cm for practical use.

On the other hand, in a case of a semiconductor or an electrically conductive filler, the lower limit of the volume resistivity of the filler is not particularly limited, but it is $1.0 \times 10^{-7}$ Ω·cm or more for practical use. In addition, the upper limit of the volume resistivity is preferably less than $1.0 \times 10^{11}$ Ω·cm.

The thermal diffusivity of the filler is, for example, $1.0 \times 10^{-6}$ m$^2$ s$^{-1}$ or more, preferably $2.0 \times 10^{-6}$ m$^2$ s$^{-1}$ or more, and particularly preferably $5.0 \times 10^{-6}$ m$^2$ s$^{-1}$ or more. In addition, the upper limit of the thermal diffusivity of the filler is not particularly limited, but is $1.0 \times 10^{-4}$ m$^2$ s$^{-1}$ or less for practical use.

The density of the filler is, for example, 4.0 g/cm$^3$ or less and more preferably 3.0 g/cm$^3$ or less. In addition, the lower limit of the density of the filler is not particularly limited, but is 1.0 g/cm$^3$ or more for practical use. In a case where the filler is one having voids or cavities such as porous or hollow particles, the density of the filler in the present specification means the density of the solid content of the components constituting the filler.

Preferably, the filler includes an electrically insulating material. The electrically insulating filler material is, for example, an electrically insulating ceramic consisting of a nitrogen compound, an oxygen compound, a silicon compound, a boron compound, a carbon compound, and a composite compound thereof. Examples of the nitrogen compound include boron nitride, aluminum nitride, and silicon nitride. Examples of the oxygen compound include metal oxides such as aluminum oxide (alumina), magnesium oxide (magnesia), zinc oxide, silicon oxide (silica), beryllium oxide, titanium oxide (titania), copper oxide, and cuprous oxide. Examples of the silicon compound and the carbon compound include silicon carbides. Examples of the boron compound include metal borides such as titanium boride. The other carbon compound is, for example, a carbon substrate material in which a bond is dominant, such as diamond. Examples of the composite compound include mineral-based ceramics such as magnesite (magnesium carbonate), perovskite (calcium titanate), talc, mica, kaolin, bentonite, and pyroferrite. In addition, the electrically insulating filler material may be a metal hydroxide such as magnesium hydroxide or aluminum hydroxide.

Above all, from the viewpoint of thermal conductivity or the like, the filler material preferably contains at least one of a ceramic consisting of a nitrogen compound, a ceramic consisting of a metal oxide, or a metal hydroxide. The filler material preferably contains, for example, at least one of boron nitride, aluminum nitride, silicon nitride, aluminum oxide, magnesium oxide, zinc oxide, beryllium oxide, or aluminum hydroxide. Above all, the filler material is particularly preferably at least one of boron nitride, aluminum nitride, silicon nitride, aluminum oxide, magnesium oxide, zinc oxide, or beryllium oxide. The boron nitride may have any structure such as c-BN (cubic crystal structure), w-BN (wurtzite structure), h-BN (hexagonal crystal structure), r-BN (rhombohedral crystal structure) or t-BN (turbulent layer structure). The boron nitride has a spherical shape or a scaly shape, and both spherical boron nitride and scaly boron nitride can be used.

Examples of the electrically conductive filler material include carbon substrate materials in which bonds are dominant, such as graphite, carbon black, graphite, carbon fiber (pitch-based carbon fiber or PAN-based carbon fiber), carbon nanotube (CNT), and carbon nanofiber (CNF). In addition, such a filler material may be a metal such as silver, copper, iron, nickel, aluminum or titanium, or an alloy such as stainless steel (SUS). Furthermore, an electrically conductive metal oxide such as zinc oxide doped with a different element, or an electrically conductive ceramic such as ferrite can also be used as such a filler material.

The filler may have a configuration in which a semiconductor or an electrically conductive, thermally conductive particle is coated or surface-treated with an electrically insulating material such as silica. According to such an aspect, it is easy to individually control the thermal conductivity and the electrical insulation, and thus it is easy to adjust the thermal conductivity and the electrical insulation. For example, a water glass method or a sol-gel method can be mentioned as a method for forming a silica film on the surface.

These fillers can be used alone or in combination of two or more thereof. Also, regarding the shape of the filler, it is possible to use fillers of a variety of shapes, examples of which include a fibrous shape, a plate shape, a scale shape, a rod shape, a spherical shape, a tube shape, a curved plate shape, and a needle shape.

The filler may be subjected to a surface treatment such as a silane coupling treatment, a titanate coupling treatment, an epoxy treatment, a urethane treatment, or an oxidation treatment. Examples of a surface treatment agent used for the surface treatment include polyol, aluminum oxide, aluminum hydroxide, silica (silicon oxide), hydrous silica, alkanolamine, stearic acid, organosiloxane, zirconium oxide, hydrogen dimethicone, a silane coupling agent, and a titanate coupling agent. Of these, a silane coupling agent is preferable.

Regarding the size of the filler, the average primary particle diameter of the filler is preferably 0.01 to 30 µm. The lower limit of the average primary particle diameter of the filler is more preferably 0.05 µm or more, still more preferably 0.1 µm or more, and particularly preferably 0.5 µm or more. The upper limit of the average primary particle diameter of the filler is more preferably 20 µm or less, still more preferably 15 µm or less, and particularly preferably 10 µm or less. The "average primary particle diameter" of the filler can be obtained by observing the filler in a dispersion liquid with a transmission electron microscope (TEM) and observing a portion where the filler particles are not aggregated (primary particles). Specifically, a transmission electron micrograph of primary particles of the filler was taken using a transmission electron microscope, and then the micrograph is subjected to image processing using an image processing apparatus to measure the particle size distribution of the filler. Then, a number-based arithmetic average diameter calculated from the particle size distribution is adopted as the "average primary particle diameter" of the filler. For example, an electron microscope (H-7000, manufactured by Hitachi, Ltd.) is used as the transmission electron microscope, and LUZEX AP (manufactured by Nireco Corporation) is used as the image processing apparatus.

The filler may include a granular mixture in which at least two types of particle groups having different average primary particle diameters are mixed. The "average primary particle diameter" of a certain particle group is also obtained in the same manner as in a case of the "average primary particle diameter" of the filler. With such a configuration, as shown in FIG. 1, as compared with a case where small particles are embedded between large particles and only single-diameter fillers are included, the spacing between the fillers is reduced and the number of contact points is increased, which results in improved thermal conductivity. For example, in a case where two types of particle groups having different average primary particle diameters are mixed, two peaks are observed in the particle size distribution of the filler containing these particle groups. Therefore, by confirming the number of peaks in the particle size distribution of the filler, it is possible to confirm how many types of particle groups having different average primary particle diameters are included in the granular mixture that is the filler.

In a case where there are a plurality of peaks in the particle size distribution of the filler, a peak particle diameter ratio (ratio of particle diameters corresponding to peak apexes) is preferably 1.5 to 50 between at least two peaks. The lower limit of the peak particle diameter ratio is preferably 2 or more and more preferably 4 or more. The upper limit of the peak particle diameter ratio is preferably 40 or less and more preferably 20 or less. In a case where the peak ratio is in the above range, it becomes easy for the small-diameter fillers to occupy the space between the large-diameter fillers while suppressing the large-diameter fillers from becoming coarse particles. In addition, a peak intensity ratio of a large particle size peak to a small particle size peak is preferably 0.2 to 5.0 between at least two peaks. The lower limit of the peak intensity ratio is preferably 0.2 or more and more preferably 0.5 or more. The upper limit of the peak intensity ratio is preferably 5.0 or less and more preferably 3.0 or less.

The filler has an aspect ratio of preferably 2 or more, more preferably 4 or more, and particularly preferably 5 or more. In addition, the upper limit of the aspect ratio is preferably 1000 or less, more preferably 500 or less, and particularly preferably 100 or less. The "aspect ratio" of the filler is a ratio of a minimum length to a maximum length (maximum length/minimum length) of a three-dimensional length.

The content of the filler in the composition is preferably 1% by volume or more, more preferably 5% by volume or more, particularly preferably 10% by volume or more, and most preferably 20% by volume or more, with respect to the volume of the total solid content of the composition. In addition, from the viewpoint of workability by lithography, the content of the filler in the composition is more preferably 85% by volume or less, still more preferably 81% by volume or less, particularly preferably 75% by volume or less, and most preferably 60% by volume or less, with respect to the volume of the total solid content of the composition. In addition, the content of the filler in the composition is preferably 10% by mass or more and more preferably 30% by mass or more, with respect to the mass of the total solid content of the composition. From the viewpoint of workability by lithography, the upper limit of the content of the filler in the composition is preferably 90% by mass or less and particularly preferably 70% by mass or less. As described above, by considering the workability in addition to the thermal conductivity and the electrical insulation, the thermal conductive layer having high thermal conductivity and high electrical insulation can be formed at a desired position and in a desired pattern.

The percentage of the particle group having an average primary particle diameter of 0.5 to 15 µm in the filler is preferably 50% by mass or more and more preferably 80% by mass or more. The upper limit of this percentage may be 100% by mass or 99% by mass or less. From the viewpoint of workability by lithography, this percentage is preferably 99% by mass or less and more preferably 95% by mass or less.

As described above, the fillers may be used alone or in combination of two or more thereof, and in a case where two or more types of fillers are contained, the total amount thereof is preferably within the above range.

<<Resin>>

The resin used in the manufacturing of the thermal conductive layer according to the embodiment of the present invention may contain, for example, a binder used for the purpose of bonding fillers together, a dispersant used for the purpose of dispersing the fillers in the composition, a polymerizable monomer used for the purpose of forming an insulating layer, and
a polymerization accelerator used for the purpose of accelerating a polymerization reaction of the polymerizable monomer. However, such use of the resin is an example, and the resin may be used for purposes other than such use. The resin preferably contains at least one of a polyimide resin, an acrylic resin, or a compound having an epoxy group. Hereinafter, the resin will be described in detail.

The weight-average molecular weight (Mw) of the resin is preferably 2,000 to 2,000,000. The upper limit of Mw of the resin is preferably 1,000,000 or less and more preferably 500,000 or less. The lower limit of Mw of the resin is preferably 3,000 or more and more preferably 5,000 or more.

The content of the resin is preferably 0.1% to 90% by mass with respect to the total solid content of the composition. The lower limit of the content of the resin is preferably 5% by mass or more and more preferably 10% by mass or more. The upper limit of the content of the resin is preferably 50% by mass or less and more preferably 30% by mass or less. The resin may be constituted of only one resin or may contain two or more resins. In a case where two or more types of resins are contained, the total amount thereof is preferably within the above range.

The resin used in the thermal conductive layer according to the embodiment of the present invention preferably contains a binder. Including the binder leads to an improvement in film properties such as film hardness. Any known binder can be used. Radical polymers having a carboxy group in a side chain thereof, for example, the resins described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A), JP1984-053836A (JP-S59-053836A), and JP1984-071048A (JP-S59-071048A) can be used as such a resin. Such a resin is, for example, a resin obtained by homopolymerizing or copolymerizing a monomer having a carboxy group, a resin obtained by homopolymerizing or copolymerizing a monomer having an acid anhydride to hydrolyze or half-esterify or half-amidate the acid anhydride unit, or an epoxy acrylate obtained by modifying an epoxy resin with an unsaturated monocarboxylic acid and an acid anhydride. Examples of the monomer having a carboxy group include acrylic acid, methacrylic acid, itaconic acid, crotonic acid, maleic acid, fumaric acid, and 4-carboxystyrene; and examples of the monomer having an acid anhydride include maleic acid anhydride. In addition, the alkali-soluble resin may be an acidic cellulose derivative having a carboxy group in a side chain thereof or a polymer obtained by adding a cyclic acid anhydride to a polymer having a hydroxyl group.

The resin used in the thermal conductive layer according to the embodiment of the present invention preferably contains a resin (hereinafter, referred to as "resin (A)") including a repeating unit having a group (hereinafter, also referred to as "acid-decomposable group") that is decomposed by the action of an acid to increase the polarity.

A known resin can be appropriately used as the resin (A). For example, known resins disclosed in paragraphs [0055] to [0191] of US2016/0274458A, the contents of which are incorporated herein by reference, paragraphs [0035] to [0085] of US2015/0004544A, the contents of which are incorporated herein by reference, and paragraphs [0045] to [0090] of US2016/0147150A, the contents of which are incorporated herein by reference, can be suitably used as the resin (A).

The acid-decomposable group preferably has a structure in which a polar group is protected by a group (leaving group) capable of decomposing and leaving by the action of an acid.

Examples of the polar group include acid groups (groups that dissociate in a 2.38% by mass tetramethylammonium hydroxide aqueous solution) such as a carboxy group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group; and alcoholic hydroxyl groups.

The alcoholic hydroxyl group is a hydroxyl group bonded to a hydrocarbon group and refers to a hydroxyl group other than a hydroxyl group directly bonded to an aromatic ring (phenolic hydroxyl group), and excludes an aliphatic alcohol group (for example, a hexafluoroisopropanol group) in which the α-position as the hydroxyl group is substituted with an electron withdrawing group such as a fluorine atom. The alcoholic hydroxyl group is preferably a hydroxyl group having a pKa (acid dissociation constant) of 12 or more and 20 or less.

Preferred examples of the polar group include a carboxy group, a phenolic hydroxyl group, a fluorinated alcohol group (preferably, a hexafluoroisopropanol group), and a sulfonic acid group.

The preferred group as the acid-decomposable group is a group in which the hydrogen atom of these groups is substituted with a group capable of leaving by the action of an acid (leaving group). Examples of the group capable of leaving by the action of an acid (leaving group) include —$C(R_{36})(R_{37})(R_{38})$, —$C(R_{36})(R_{37})(OR_{39})$, and —$C(R_{01})(R_{02})(OR_{39})$.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of each of $R_{36}$ to $R_{39}$, $R_{01}$, and $R_{02}$ is preferably an alkyl group having 1 to 8 carbon atoms, examples of which include a methyl group, an ethyl group, a propyl group, an n-butyl group, a sec-butyl group, a hexyl group, and an octyl group.

The cycloalkyl group of each of $R_{36}$ to $R_{39}$, $R_{01}$, and $R_{02}$ may be monocyclic or polycyclic. The monocyclic cycloalkyl group is preferably a cycloalkyl group having 3 to 8 carbon atoms, examples of which include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, examples of which include an adamantyl group, a norbornyl group, an isobornyl group, a camphanyl group, a dicyclopentyl group, an α-pinenyl group, a tricyclodecanyl group, a tetracyclododecyl group, and an androstanyl group.

At least one carbon atom in the cycloalkyl group may be substituted with a hetero atom such as an oxygen atom.

The aryl group of each of $R_{36}$ to $R_{39}$, $R_{01}$, and $R_{02}$ is preferably an aryl group having 6 to 10 carbon atoms, examples of which include a phenyl group, a naphthyl group, and an anthryl group.

The aralkyl group of each of $R_{36}$ to $R_{39}$, $R_{01}$, and $R_{02}$ is preferably an aralkyl group having 7 to 12 carbon atoms, examples of which include a benzyl group, a phenethyl group, and a naphthylmethyl group.

The alkenyl group of each of $R_{36}$ to $R_{39}$, $R_{01}$, and $R_{02}$ is preferably an alkenyl group having 2 to 8 carbon atoms, examples of which include a vinyl group, an allyl group, a butenyl group, and a cyclohexenyl group.

The ring formed by bonding $R_{36}$ and $R_{37}$ to each other is preferably a cycloalkyl group (which is monocyclic or polycyclic). The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The acid-decomposable group is preferably a cumyl ester group, an enol ester group, an acetal ester group, a tertiary alkyl ester group, or the like and more preferably an acetal ester group or a tertiary alkyl ester group.

The resin (A) preferably has a repeating unit represented by Formula (AI) as the repeating unit having an acid-decomposable group.

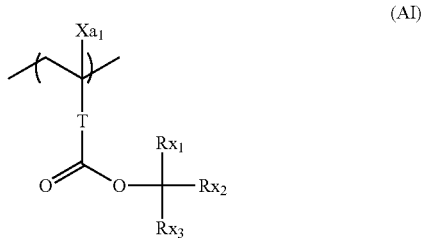

(AI)

In Formula (AI), $Xa_1$ represents a hydrogen atom, a halogen atom, or a monovalent organic group.

T represents a single bond or a divalent linking group.

$Rx_1$ to $Rx_3$ each independently represent an alkyl group or a cycloalkyl group.

Any two of $Rx_1$ to $Rx_3$ may be bonded to form a ring structure, or may not be bonded to form a ring structure.

Examples of the divalent linking group of T include an alkylene group, an arylene group, —COO-Rt-, and —O-Rt-. In the formula, Rt represents an alkylene group, a cycloalkylene group, or an arylene group.

T is preferably a single bond or —COO-Rt-. Rt is preferably a chain-like alkylene group having 1 to 5 carbon atoms, and more preferably —$CH_2$—, —$(CH_2)_2$—, or —$(CH_2)_3$—. T is more preferably a single bond.

$Xa_1$ is preferably a hydrogen atom or an alkyl group.

The alkyl group of $Xa_1$ may have a substituent, and examples of the substituent include a hydroxyl group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

The alkyl group of each of $Rx_1$, $Rx_2$, and $Rx_3$ may be linear or branched, and preferred examples thereof include a methyl group, an ethyl group, an n-propyl group, an isopropyl group, an n-butyl group, an isobutyl group, and a t-butyl group. The alkyl group preferably has 1 to 10 carbon atoms, more preferably 1 to 5 carbon atoms, and still more preferably 1 to 3 carbon atoms. In the alkyl group of each of $Rx_1$, $Rx_2$, and $Rx_3$, a part of carbon-carbon bonds may be a double bond.

The cycloalkyl group of each of $Rx_1$, $Rx_2$, and $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The ring structure formed by bonding two of $Rx_1$, $Rx_2$, and $Rx_3$ is preferably a monocyclic cycloalkane ring such as a cyclopentyl ring, a cyclohexyl ring, a cycloheptyl ring, or a cyclooctane ring, or a polycyclic cycloalkyl ring such as a norbornane ring, a tetracyclodecane ring, a tetracyclododecane ring, or an adamantane ring. The ring structure formed by bonding two of $Rx_1$, $Rx_2$, and $Rx_3$ is more preferably a cyclopentyl ring, a cyclohexyl ring, or an adamantane ring. A structure shown below is also preferable as the ring structure formed by bonding two of $Rx_1$, $Rx_2$, and $Rx_3$.

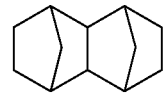 [SMILES: C1CC2CC1C1C3CCC(C3)C21]

Specific examples of the monomer corresponding to the repeating unit represented by Formula (AI) are shown below, but the present invention is not limited to these specific examples. The following specific examples correspond to the case where $Xa_1$ in Formula (AI) is a methyl group, but $Xa_1$ can be optionally substituted with a hydrogen atom, a halogen atom, or a monovalent organic group.

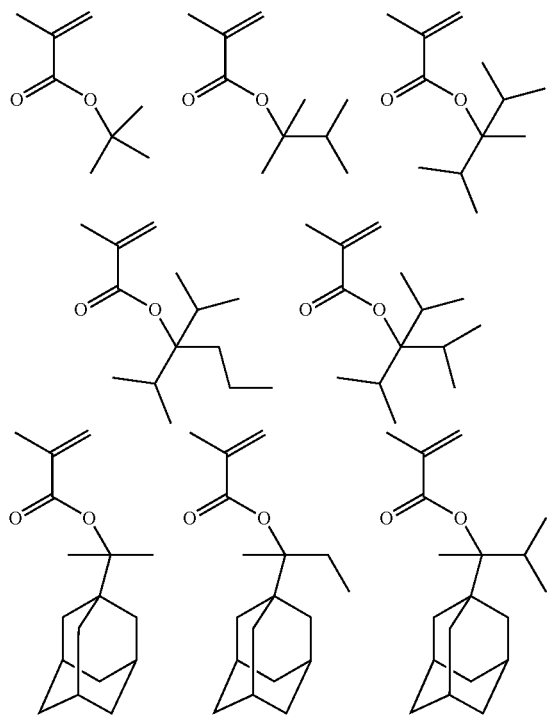

-continued

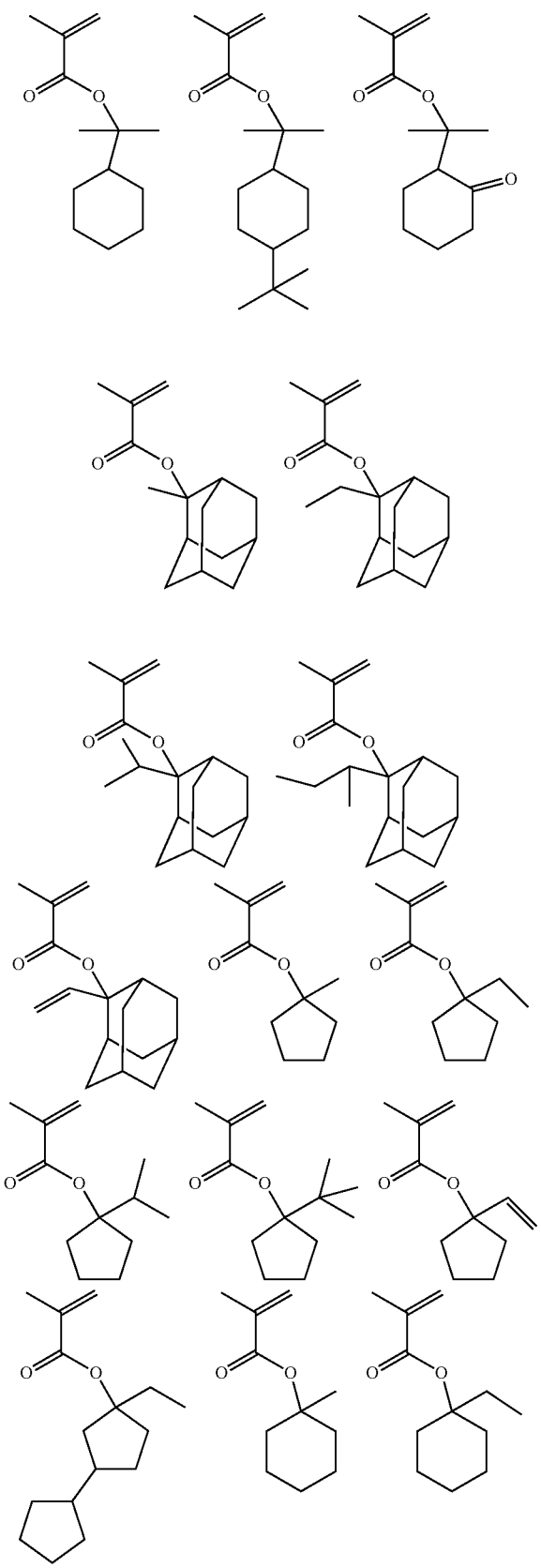

-continued

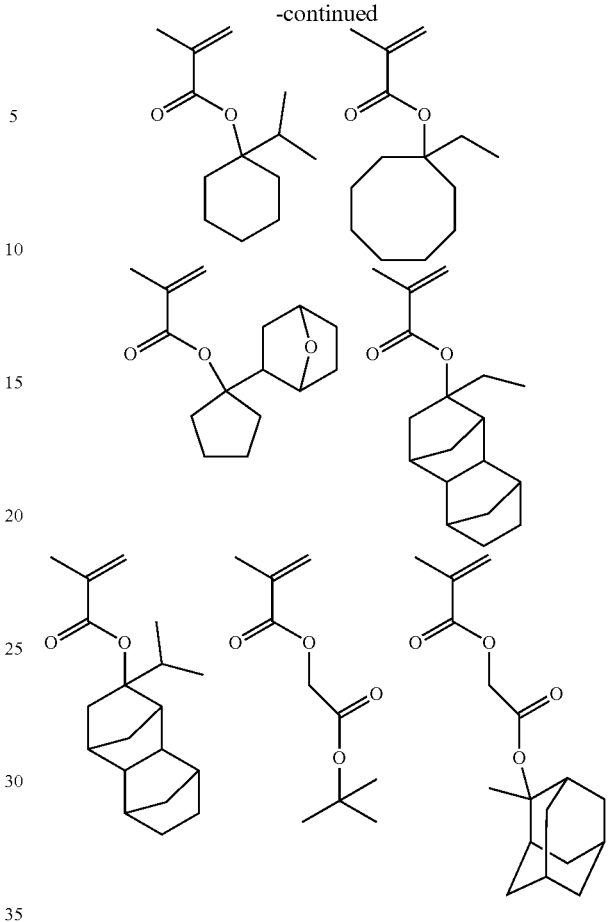

It is also preferable that the resin (A) has a repeating unit described in paragraphs [0336] to [0369] of US2016/0070167A, the contents of which are incorporated herein by reference, as the repeating unit having an acid-decomposable group.

In addition, the resin (A) may have a repeating unit containing a group that decomposes by the action of an acid to produce an alcoholic hydroxyl group, which is described in paragraphs [0363] to [0364] of US2016/0070167A, the contents of which are incorporated herein by reference, as the repeating unit having an acid-decomposable group.

The resin (A) may contain one type of repeating unit having an acid-decomposable group, or may contain two or more types of repeating units having an acid-decomposable group in combination.

The content of the repeating unit having an acid-decomposable group contained in the resin (A) (total content of repeating units in a case where there are a plurality of repeating units having an acid-decomposable group) is preferably 10 to 90 mol %, more preferably 20 to 80 mol %, and still more preferably 30 to 70 mol % with respect to all the repeating units of the resin (A).

The resin (A) preferably has a repeating unit having at least one selected from the group consisting of a lactone structure, a sultone structure, and a carbonate structure.

Any lactone structure or sultone structure may be used as long as it has a lactone structure or a sultone structure, but the lactone structure or sultone structure is preferably a 5- to 7-membered ring lactone structure or a 5- to 7-membered ring sultone structure and more preferably a 5- to 7-membered ring lactone structure to which another ring structure is fused to form a bicyclo structure or a spiro structure, or a 5- to 7-membered ring sultone structure to which another ring structure is fused to form a bicyclo structure or a spiro structure. The resin (A) still more preferably has a repeating unit having a lactone structure represented by any of Formulae (LC1-1) to (LC1-21), or a sultone structure represented by any of Formulae (SL1-1) to (SL1-3). In addition, the lactone structure or the sultone structure may be directly bonded to the main chain. Preferred structures are (LC1-1), (LC1-4), (LC1-5), (LC1-8), (LC1-16), (LC1-21), and (SL1-1).

LC1-1

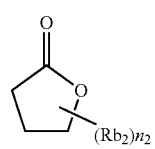

LC1-2

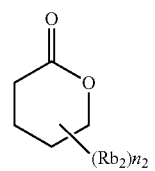

LC1-3

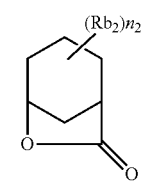

LC1-4

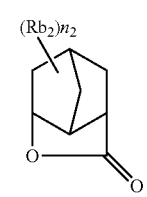

LC1-5

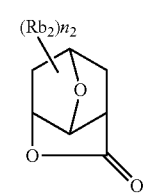

LC1-6

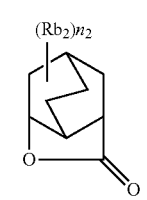

LC1-7

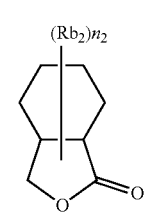

LC1-8

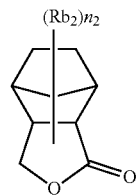

LC1-9

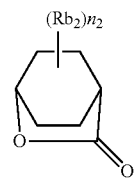

LC1-10

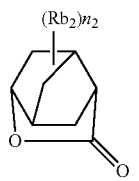

LC1-11

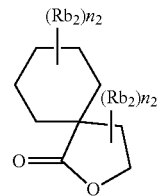

LC1-12

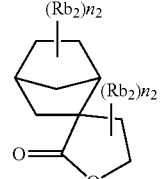

LC1-13

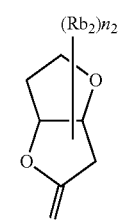

LC1-14

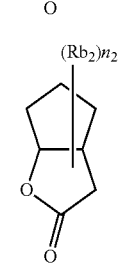

LC1-15 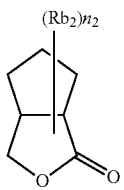

LC1-16 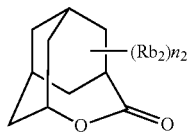

LC1-17 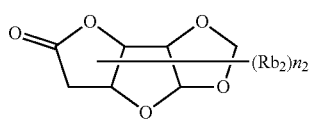

LC1-18 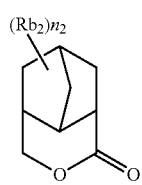

LC1-19 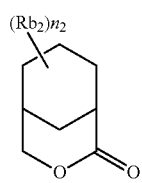

LC1-20 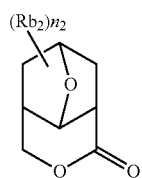

LC1-21 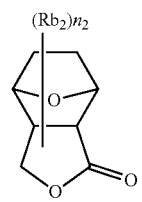

SL1-1 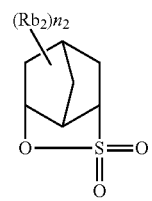

SL1-2 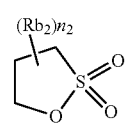

SL1-3 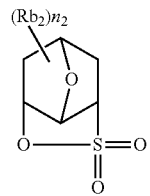

The lactone structure or sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, and an acid-decomposable group. Among these, an alkyl group having 1 to 4 carbon atoms, a cyano group, and an acid-decomposable group are more preferred. $n_2$ represents an integer of 0 to 4. In a case where $n_2$ is 2 or more, a plurality of substituents ($Rb_2$'s) may be the same as or different from each other. In addition, the plurality of substituents ($Rb_2$'s) may be bonded to each other to form a ring.

The repeating unit having a lactone structure or a sultone structure is preferably a repeating unit represented by Formula (III).

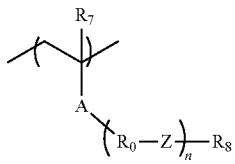 (III)

In Formula (III), A represents an ester bond (a group represented by —COO—) or an amide bond (a group represented by —CONH—).

n is the repetition number of the structure represented by —$R_0$—Z— and represents an integer of 0 to 5, preferably 0 or 1, and more preferably 0. In a case where n is 0, —$R_0$—Z— does not exist and a single bond is formed.

$R_0$ represents an alkylene group, a cycloalkylene group, or a combination thereof. In a case where a plurality of $R_0$'s are present, each $R_0$ independently represents an alkylene group, a cycloalkylene group, or a combination thereof.

Z represents a single bond, an ether bond, an ester bond, an amide bond, a urethane bond, or a urea bond. In a case where a plurality of Z's are present, each Z independently represents a single bond, an ether bond, an ester bond, an amide bond, a urethane bond, or a urea bond.

$R_8$ represents a monovalent organic group having a lactone structure or a sultone structure.

$R_7$ represents a hydrogen atom, a halogen atom, or a monovalent organic group (preferably a methyl group).

The alkylene group or cycloalkylene group of $R_0$ may have a substituent.

Z is preferably an ether bond or an ester bond and more preferably an ester bond.

Specific examples of the monomer corresponding to the repeating unit represented by Formula (III) and specific examples of the monomer corresponding to the repeating unit represented by Formula (A-1) are shown below, but the present invention is not limited to these specific examples.

The following specific examples correspond to the case where $R_7$ in Formula (III) and $R_A^1$ in Formula (A-1) are methyl groups, but $R_7$ and $R_A^1$ can be optionally substituted with a hydrogen atom, a halogen atom, or a monovalent organic group.
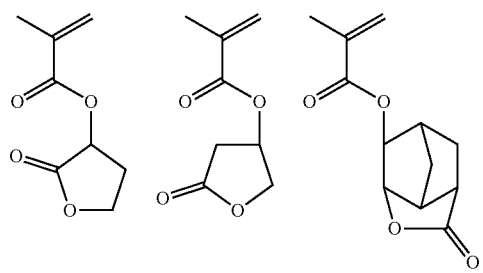
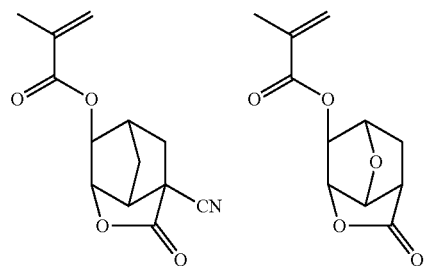
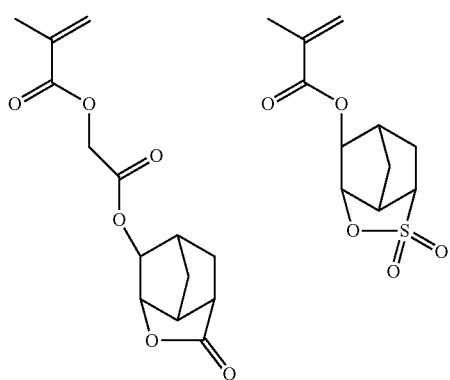
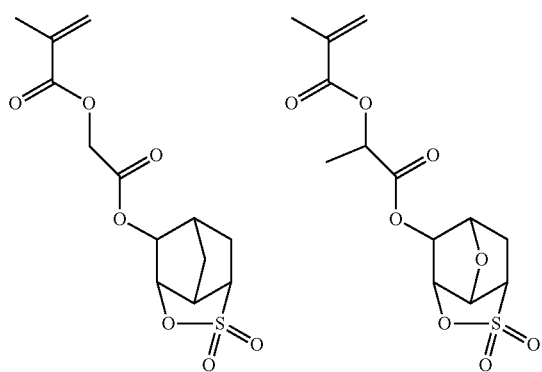
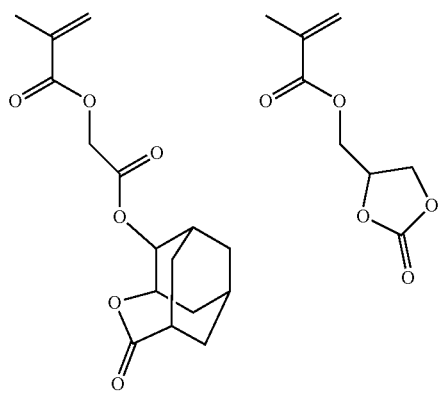
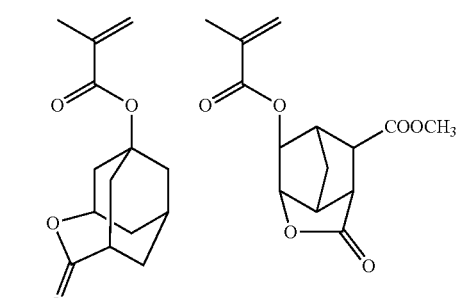
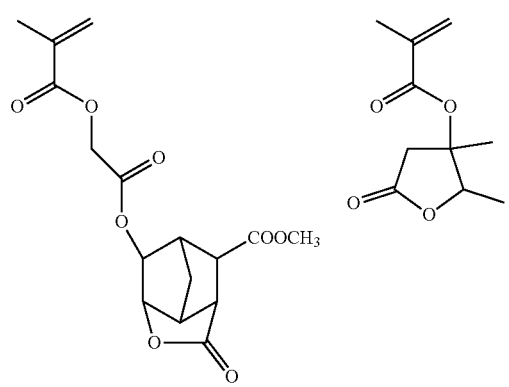
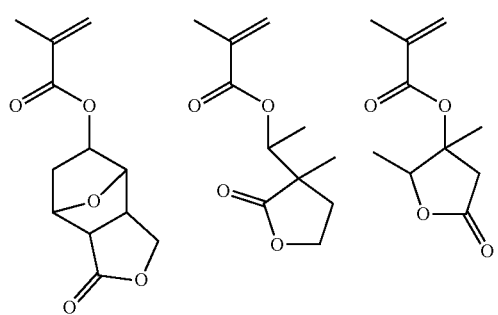

-continued

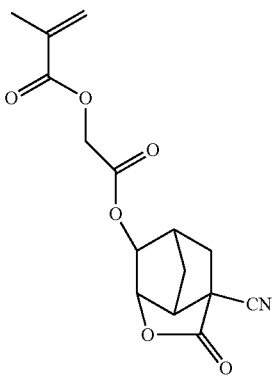

In addition to the above monomers, the following monomers are also suitably used as the raw material for the resin (A).

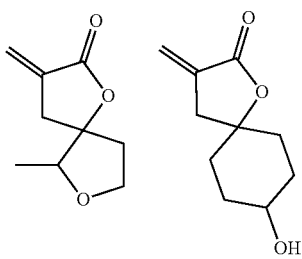

The resin (A) may have a repeating unit having a carbonate structure. The carbonate structure is preferably a cyclic carbonic acid ester structure. The repeating unit having a cyclic carbonic acid ester structure is preferably a repeating unit represented by Formula (A-1).

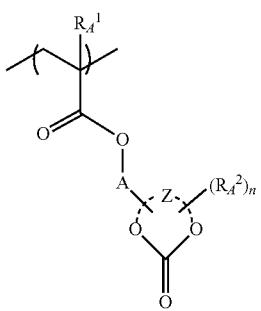
(A-1)

In Formula (A-1), $R_A^1$ represents a hydrogen atom, a halogen atom, or a monovalent organic group (preferably a methyl group).

n represents an integer of 0 or more.

$R_A^2$ represents a substituent. $R_A^2$'s each independently represent a substituent in a case where n is 2 or more.

A represents a single bond or a divalent linking group.

Z represents an atomic group forming a monocyclic structure or a polycyclic structure with a group represented by —O—C(=O)—O— in the formula.

It is also preferable that the resin (A) has a repeating unit described in paragraphs [0370] to [0414] of US2016/ 0070167A, the contents of which are incorporated herein by reference, as the repeating unit having at least one selected from the group consisting of a lactone structure, a sultone structure, and a carbonate structure.

The resin (A) may contain one type of repeating unit having at least one selected from the group consisting of a lactone structure, a sultone structure, and a carbonate structure, or may contain two or more types of repeating units having at least one selected from the group consisting of a lactone structure, a sultone structure, and a carbonate structure in combination.

The content of the repeating unit having at least one selected from the group consisting of a lactone structure, a sultone structure, and a carbonate structure contained in the resin (A) (total content of repeating units in a case where a plurality of repeating units having at least one selected from the group consisting of a lactone structure, a sultone structure, and a carbonate structure) is preferably 5 to 70 mol %, more preferably 10 to 65 mol %, and still more preferably 20 to 60 mol % with respect to all the repeating units of the resin (A).

The resin (A) preferably has a repeating unit having a polar group. Examples of the polar group include a hydroxyl group, a cyano group, a carboxy group, and a fluorinated alcohol group. The repeating unit having a polar group is preferably a repeating unit having an alicyclic hydrocarbon structure substituted with a polar group. In addition, the repeating unit having a polar group preferably does not have an acid-decomposable group. The alicyclic hydrocarbon structure in the alicyclic hydrocarbon structure substituted with a polar group is preferably an adamantyl group or a norbornane group.

Specific examples of the monomer corresponding to the repeating unit having a polar group are shown below, but the present invention is not limited to these specific examples.

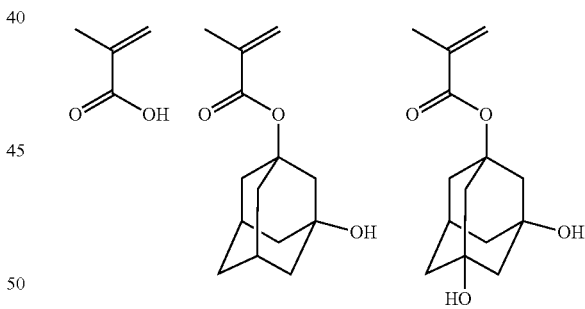

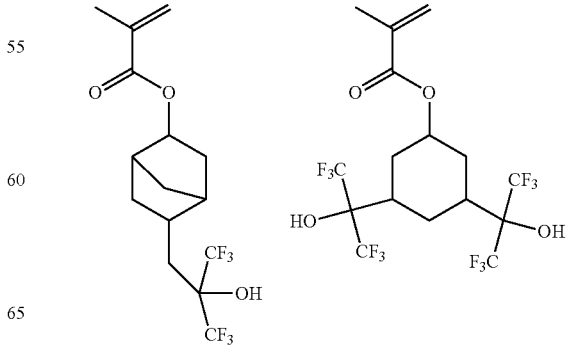

-continued

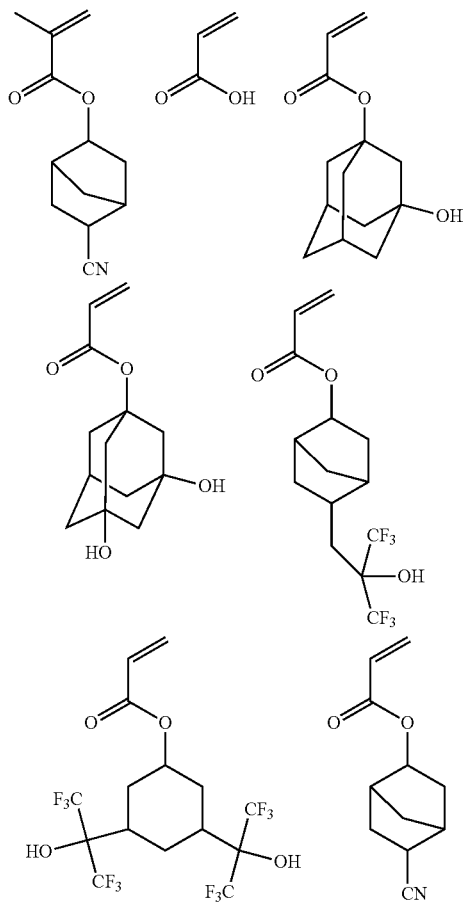

Specific examples of the repeating unit having a polar group include the repeating units disclosed in paragraphs [0415] to [0433] of US2016/0070167A, the contents of which are incorporated herein by reference, in addition to these repeating units.

The content of the repeating unit having a polar group is preferably 5 to 40 mol %, more preferably 5 to 30 mol %, and still more preferably 10 to 25 mol % with respect to all the repeating units in the resin (A).

The resin (A) may contain one type of repeating unit having a polar group, or may contain two or more types of repeating units having a polar group in combination. In a case where the resin (A) contains two or more types of repeating units having a polar group, the total amount thereof is preferably within the above numerical range.

The resin (A) can further have a repeating unit having neither an acid-decomposable group nor a polar group. The repeating unit having neither an acid-decomposable group nor a polar group preferably has an alicyclic hydrocarbon structure. Examples of the repeating unit having neither an acid-decomposable group nor a polar group include the repeating units described in paragraphs [0236] and [0237] of US2016/0026083A, the contents of which are incorporated herein by reference. Preferred examples of the monomer corresponding to the repeating unit having neither an acid-decomposable group nor a polar group are shown below.

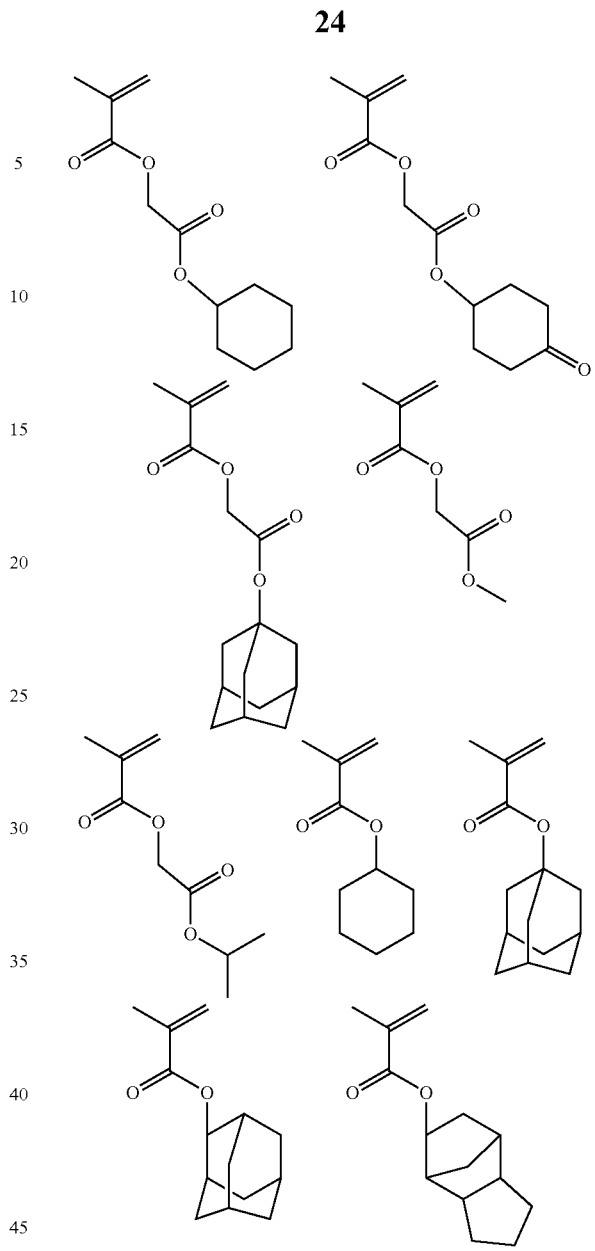

Specific examples of the repeating unit having neither an acid-decomposable group nor a polar group include the repeating units disclosed in paragraph [0433] of US2016/0070167A, the contents of which are incorporated herein by reference, in addition to these repeating units.

The content of the repeating unit having neither an acid-decomposable group nor a polar group is preferably 5 to 40 mol %, more preferably 5 to 30 mol %, and still more preferably 5 to 25 mol % with respect to all the repeating units in the resin (A).

The resin (A) may contain one type of repeating unit having neither an acid-decomposable group nor a polar group, or may contain two or more types of repeating units having neither an acid-decomposable group nor a polar group in combination. In a case where the resin (A) contains two or more types of such repeating units, the total amount thereof is preferably within the above numerical range.

The resin (A) can have various repeating structural units for the purpose of adjusting dry etching resistance, suitability for a standard developer, adhesiveness to substrate, resist profile, and resolution, heat resistance, sensitivity, and the like which are generally required properties of a resist, in addition to the repeating structural units described above. Examples of such repeating structural units include, but are not limited to, repeating structural units corresponding to monomers.

Examples of the monomer include compounds having one addition-polymerizable unsaturated bond, which are selected from acrylic acid esters, methacrylic acid esters, acrylamides, methacrylamides, allyl compounds, vinyl ethers, vinyl esters, and the like.

In addition, any addition-polymerizable unsaturated compound that is copolymerizable with the monomers corresponding to the above-mentioned various repeating structural units may be copolymerized.

In the resin (A), the content molar ratio of each repeating structural unit is appropriately set in order to adjust various performances.

In addition, the resin used in the thermal conductive layer according to the embodiment of the present invention preferably includes a resin which is soluble in an alkali developer.

The alkali-soluble resin may be a linear organic polymer and can be appropriately selected from polymers having at least one group that promotes alkali dissolution in a molecule (preferably a molecule having an acrylic copolymer or a styrene-based copolymer as a main chain). The same resin may act as the binder and the alkali-soluble resin.

The weight-average molecular weight (Mw) of the alkali-soluble resin is not particularly limited and is preferably 5,000 to 200,000. The upper limit of Mw of the alkali-soluble resin is preferably 100,000 or less and more preferably 20,000 or less. In addition, the number-average molecular weight (Mn) of the alkali-soluble resin is preferably 1,000 to 20,000.

The acid value of the alkali-soluble resin is preferably 30 to 500 mgKOH/g. The lower limit of the acid value of the alkali-soluble resin is more preferably 50 mgKOH/g or more and still more preferably 70 mgKOH/g or more. The upper limit of the acid value of the alkali-soluble resin is more preferably 400 mgKOH/g or less, still more preferably 200 mgKOH/g or less, particularly preferably 150 mgKOH/g or less, and most preferably 120 mgKOH/g or less.

From the viewpoint of heat resistance, the alkali-soluble resin is preferably a polyhydroxystyrene-based resin, a polysiloxane-based resin, an acrylic resin, an acrylamide-based resin, or an acryl/acrylamide copolymer resin. Of these, the alkali-soluble resin is preferably an acrylic resin, an acrylamide-based resin, or an acryl/acrylamide copolymer resin from the viewpoint of developability control. Examples of the group that promotes alkali dissolution (hereinafter, also referred to as "acid group") include a carboxy group, a phosphate group, a sulfo group, and a phenolic hydroxyl group, among which a carboxy group is particularly preferable. The acid group may be only one type or may be two or more types.

The alkali-soluble resin can be synthesized, for example, by a known radical polymerization method. Polymerization conditions such as temperature, pressure, type and amount of radical initiator, and type of solvent in a case of manufacturing an alkali-soluble resin by a radical polymerization method can be easily set by those skilled in the art, and the conditions can be determined experimentally.

The alkali-soluble resin is preferably a polymer having a carboxy group in a side chain thereof, examples of which include a methacrylic acid copolymer, an acrylic acid copolymer, an itaconic acid copolymer, a crotonic acid copolymer, a maleic acid copolymer, a partially esterified maleic acid copolymer, an alkali-soluble phenolic resin such as a novolac type resin, an acidic cellulose derivative having a carboxy group in a side chain thereof, and a product obtained by adding an acid anhydride to a polymer having a hydroxyl group. In particular, a copolymer of (meth) acrylic acid and the other monomer copolymerizable therewith is suitable as the alkali-soluble resin. Examples of the other monomer copolymerizable with (meth)acrylic acid include the monomers described in paragraphs [0017] to [0019] of JP2015-034961A. For example, mention may be made of an alkyl (meth)acrylate, an aryl (meth)acrylate, a vinyl compound, and an N-substituted maleimide monomer.

Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, cyclohexyl (meth)acrylate, glycidyl methacrylate, and tetrahydrofurfuryl methacrylate.

Examples of the vinyl compound include styrene, α-methylstyrene, vinyl toluene, acrylonitrile, vinyl acetate, N-vinylpyrrolidone, polystyrene macromonomer, and polymethylmethacrylate macromonomer. Examples of the N-substituted maleimide monomer include N-phenylmaleimide and N-cyclohexylmaleimide described in JP1998-300922A (JP-H10-300922A). In addition, the other monomer copolymerizable with these (meth)acrylic acids may be only one type or may be two or more types.

The alkali-soluble resin is preferably a multi-component copolymer consisting of a benzyl (meth)acrylate/(meth) acrylic acid copolymer, a benzyl (meth)acrylate/(meth) acrylic acid/2-hydroxyethyl (meth)acrylate copolymer, and a benzyl (meth)acrylate/(meth)acrylic acid/other monomer. In addition, the alkali-soluble resin may be a copolymer of 2-hydroxyethyl (meth)acrylate. Further, it is also preferable that the alkali-soluble resin is a 2-hydroxypropyl(meth) acrylate/polystyrene macromonomer/benzylmethacrylate/ methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, or a 2-hydroxyethyl methacrylate/polystyrene macromonomer/benzyl methacrylate/ methacrylic acid copolymer, each of which is described in JP1995-140654A (JP-H07-140654A). In addition, for example, FF-426 (manufactured by Fujikura Kasei Co., Ltd.) can be used as a commercially available product of the alkali-soluble resin.

In addition, an alkali-soluble resin having a polymerizable group may be used as the alkali-soluble resin. According to this aspect, the solvent resistance of the obtained film tends to be improved. Examples of the polymerizable group include an allyl group and a (meth)acryloyl group. An alkali-soluble resin having a polymerizable group in a side chain thereof is useful as the alkali-soluble resin having a polymerizable group. Examples of the alkali-soluble resin having a polymerizable group include DIANAL NR series (manufactured by Mitsubishi Rayon Co., Ltd.), PHOTOMER 6173 (a poly urethane acrylic oligomer containing COOH, manufactured by Diamond Shamrock Co., Ltd.), VISCOAT R-264 and KS RESIST 106 (all manufactured by Osaka Organic Chemical Industry Ltd.), CYCLOMER P series (for example, ACA230AA) and PLACCEL CF200 series (all manufactured by DAICEL Corporation), EBE- CRYL 3800 (manufactured by Daicel-UCB Co., Ltd.), and ACRYCURE RD-F8 (manufactured by Nippon Shokubai Co., Ltd.).

The alkali-soluble resin also preferably contains a polymer obtained by polymerizing a monomer component containing a compound represented by Formula (ED1) and/or a compound represented by Formula (ED2) (hereinafter, these compounds may be referred to as "ether dimer"). With regard to the details of the polymer obtained by polymerizing a monomer component containing an ether dimer, reference can be made to paragraphs [0022] to [0031] of JP2015-034961A, the contents of which are incorporated herein by reference.

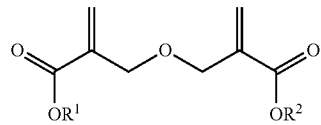
(ED1)

In Formula (ED1), $R^1$ and $R^2$ each independently represent a hydrogen atom or a hydrocarbon group having 1 to 25 carbon atoms which may have a substituent.

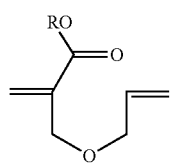
(ED2)

In Formula (ED2), R represents a hydrogen atom or an organic group having 1 to 30 carbon atoms. With regard to specific examples of Formula (ED2), reference can be made to the description in JP2010-168539A.

With regard to specific examples of the ether dimer, for example, reference can be made to paragraph [0317] of JP2013-029760A, the contents of which are incorporated herein by reference. The ether dimer may be only one type or may be two or more types. The compounds represented by Formula (ED1) and Formula (ED2) may be copolymerized with the other monomer to form a polymer.

The alkali-soluble resin may contain a structural unit derived from a compound represented by Formula (X).

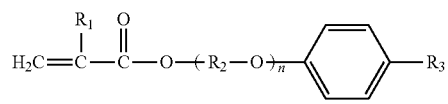
(X)

In Formula (X), $R^1$ represents a hydrogen atom or a methyl group, $R^2$ represents an alkylene group having 2 to 10 carbon atoms, and $R^3$ represents a hydrogen atom or an alkyl group having 1 to 20 carbon atoms which may contain a benzene ring. n represents an integer of 1 to 15.

In Formula (X), the alkylene group of $R^2$ preferably has 2 to 3 carbon atoms. The alkyl group of $R^3$ has 1 to 20 carbon atoms and more preferably 1 to 10 carbon atoms, and the alkyl group of $R^3$ may contain a benzene ring. Examples of the benzene ring-containing alkyl group represented by $R^3$ include a benzyl group and a 2-phenyl(iso)propyl group.

Specific examples of the alkali-soluble resin include the following resins. The numerical value written together with each repeating unit represents the content [molar ratio] of each repeating unit. Here, Me represents a methyl group. Further specific examples of the alkali-soluble resin include the resins described in paragraph [0037] of JP2015-034961A.

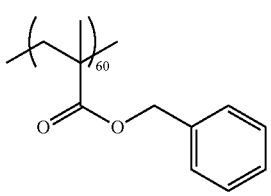
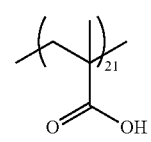
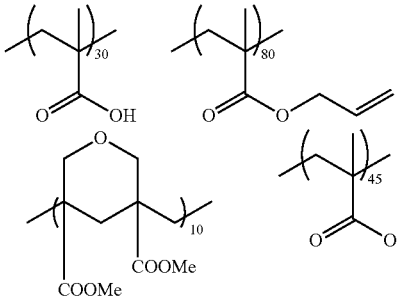
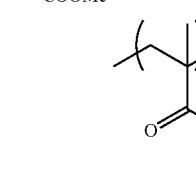
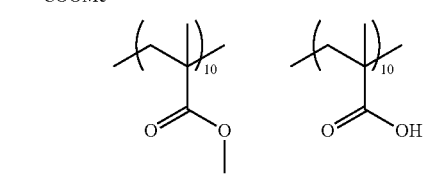
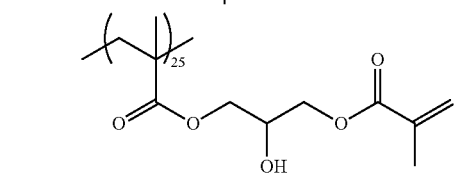
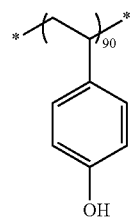
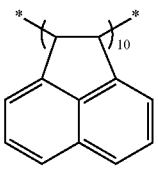

(P-1)

Mw = 11700
Mw/Mn = 1.2

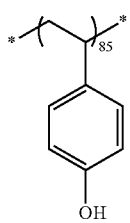
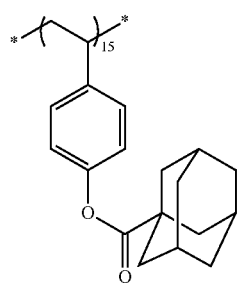
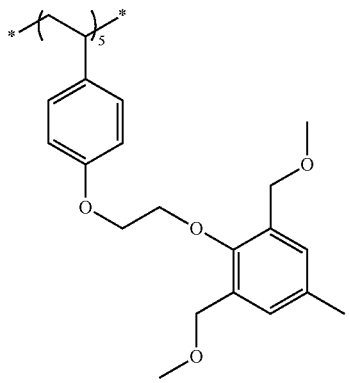

With regard to the alkali-soluble resin, reference can be made to the description in paragraphs [0558] to [0571] of JP2012-208494A (<0685> to <0700> in corresponding US2012/0235099A), the contents of which are incorporated herein by reference. Further, the copolymer (B) described in paragraphs [0029] to [0063] of JP2012-032767A, the contents of which are incorporated herein by reference and the alkali-soluble resins used in the Examples; the binder resins described in paragraphs [0088] to [0098] of JP2012-208474A, the contents of which are incorporated herein by reference and the binder resins used in the Examples; the binder resins described in paragraphs [0022] to [0032] of JP2012-137531A, the contents of which are incorporated herein by reference and the binder resins used in the Examples; the binder resins described in paragraphs [0132] to [0143] of JP2013-024934A, the contents of which are incorporated herein by reference and the binder resins used in the Examples; the binder resins used in the paragraphs [0092] to [0098] of JP2011-242752A, the contents of which are incorporated herein by reference and the Examples; and the binder resins described in paragraphs [0030] to [0072] of JP2012-032770A, the contents of which are incorporated herein by reference can also be used.

The content of the binder is preferably 0.5% to 60% by mass with respect to the total solid content of the composition. The lower limit of the content of the binder is preferably 1% by mass or more and more preferably 2% by mass or more. The upper limit of the content of the binder is preferably 40% by mass or less and more preferably 30% by mass or less. The composition may contain only one type of binder or may contain two or more types of binders. In a case where two or more types of binders are contained, the total amount thereof is preferably within the above range.

The resin used in the thermal conductive layer according to the embodiment of the present invention may contain a dispersant. The dispersant is, for example, a resin having an amine group (such as a polyamide amine or a salt thereof), an oligoimine-based resin, a polycarboxylic acid or a salt thereof, a high molecular weight unsaturated acid ester, a modified polyurethane, a modified polyester, a modified poly(meth)acrylate, a (meth)acrylic copolymer, or a naphthalenesulfonic acid formalin condensate.

The dispersant preferably has a site having an adsorptivity for a filler (hereinafter, referred to as "adsorption site"). The adsorption site may be, for example, a monovalent substituent having at least one selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxyl group. The adsorption site is preferably an acid-based adsorption site.

Examples of the acid-based adsorption site include acid groups. Above all, the acid-based adsorption site is preferably at least one of a phosphorus atom-containing group or a carboxy group. Examples of the phosphorus atom-containing group include a phosphoric acid ester group, a polyphosphoric acid ester group, and a phosphate group. With regard to the details of the adsorption site, reference can be made to paragraphs [0073] to [0080] of JP2015-034961A, the contents of which are incorporated herein by reference.

In the present invention, the dispersant is preferably a resin represented by Formula (1).

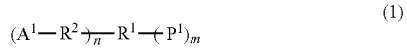

(1)

In Formula (1), $R^1$ represents an (m+n)-valent linking group, and $R^2$ represents a single bond or a divalent linking group. $A^1$ represents a monovalent substituent having at least one selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxyl group. n pieces of $A^1$ and n pieces of $R^2$ each may be the same as or different from each other. m represents a positive number of 8 or less, n represents 1 to 9, and m+n satisfies an integer of 3 to 10. $P^1$ represents a monovalent polymer chain. m pieces of $P^1$ may be the same as or different from each other.

The substituent $A^1$ contained in the resin represented by Formula (1) can interact with a filler (for example, an inorganic particle such as titanium oxide). Therefore, the resin represented by Formula (1) has n (1 to 9) pieces of substituents $A^1$ and thus can strongly interact with the filler to improve the dispersibility of the filler in the composition. In addition, since m pieces of polymer chains $P^1$'s in the resin represented by Formula (I) can function as a steric repulsion group, the presence of m pieces of polymer chains P's enables to exhibit a good steric repulsion force, thus resulting in uniform dispersion of the filler. With regard to the details of the monovalent substituent represented by $A^1$, reference can be made to paragraphs [0041] to [0070] of JP2007-277514A, the contents of which are incorporated herein by reference.

In Formula (1), $R^1$ represents an (m+n)-valent linking group. The (m+n)-valent linking group includes a group consisting of 1 to 100 carbon atoms, 0 to 10 nitrogen atoms, 0 to 50 oxygen atoms, 1 to 200 hydrogen atoms, and 0 to 20 sulfur atoms. The (m+n)-valent linking group is, for example, one of the following structural units or a group formed by combining two or more of the following structural units (which may form a ring structure). With regard to the details of the (m+n)-valent linking group, reference can be made to paragraphs [0076] to [0084] of JP2007-277514A, the contents of which are incorporated herein by reference.

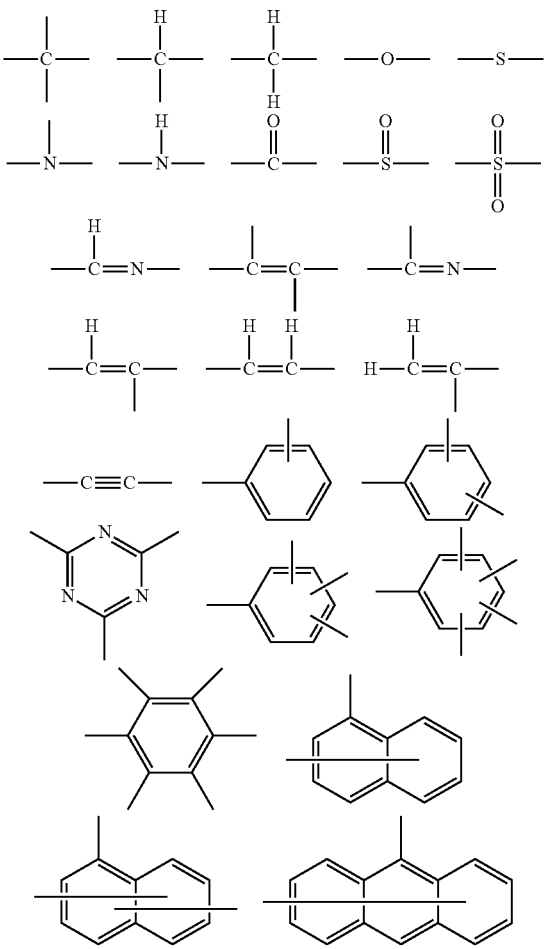

In Formula (1), $P^1$ represents a monovalent polymer chain. The monovalent polymer chain is preferably a monovalent polymer chain having a repeating unit derived from a vinyl compound. With regard to the details of the polymer chain, reference can be made to paragraphs [0087] to [0098] of JP2007-277514A, the contents of which are incorporated herein by reference.

In Formula (1), $R^2$ represents a single bond or a divalent linking group. The divalent linking group includes a group consisting of 1 to 100 carbon atoms, 0 to 10 nitrogen atoms, 0 to 50 oxygen atoms, 1 to 200 hydrogen atoms, and 0 to 20 sulfur atoms and may be unsubstituted or may further have a substituent. The divalent linking group is, for example, one of the above structural units or a group formed by combining two or more of the above structural units, similarly to $R^1$ of Formula (1). With regard to the details of the divalent linking group, reference can be made to paragraphs [0071] to [0075] of JP2007-277514A, the contents of which are incorporated herein by reference.

With regard to the polymer dispersant represented by Formula (1), reference can be made to the description in paragraph [0039] of JP2007-277514A (<0053> of corresponding US2010/0233595A), the contents of which are incorporated herein, and the description in paragraphs [0081] to [0117] of JP2015-034961A, the contents of which are incorporated herein.

In the present invention, a graft copolymer containing a repeating unit represented by any of Formula (11) to Formula (14) can be used as the dispersant.

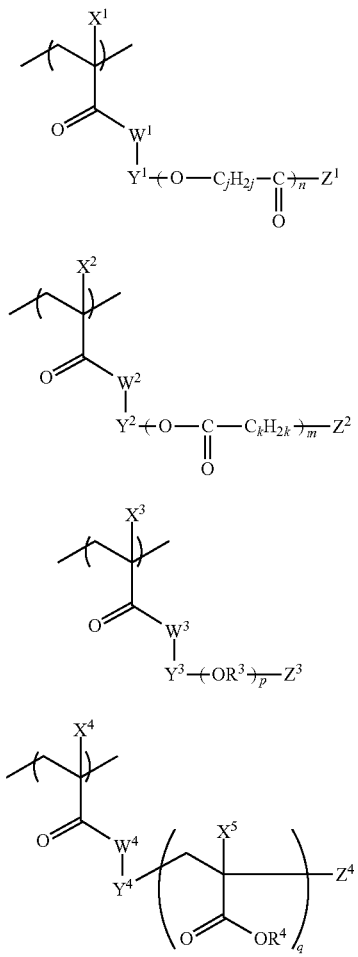

In Formula (11) to Formula (14), $W^1$, $W^2$, $W^3$, and $W^4$ each independently represent an oxygen atom or NH; $X^1$, $X^2$, $X^3$, $X^4$, and $X^5$ each independently represent a hydrogen atom or a monovalent organic group; $Y^1$, $Y^2$, $Y^3$, and $Y^4$ each independently represent a divalent linking group; $Z^1$, $Z^2$, $Z^3$, and $Z^4$ each independently represent a monovalent organic group; $R_3$ represents an alkylene group; $R^4$ represents a hydrogen atom or a monovalent organic group; n, m, p, and q each independently represent an integer of 1 to 500; j and k each independently represent an integer of 2 to 8; in Formula (13), in a case where p is 2 to 500, a plurality of $R^3$'s are the same as or different from each other; and in Formula (14), in a case where q is 2 to 500, a plurality of $X^5$'s and a plurality of $R^4$'s each may be the same as or different from each other.

$W^1$, $W^2$, $W^3$, and $W^4$ are each preferably an oxygen atom. $X^1$, $X^2$, $X^3$, $X^4$, and $X^5$ are each independently preferably a hydrogen atom or an alkyl group having 1 to 12 carbon atoms, more preferably a hydrogen atom or a methyl group, and particularly preferably a methyl group. $Y^1$, $Y^2$, $Y^3$, and $Y^4$ each independently represent a divalent linking group, and the linking group is not particularly limited in structure. The structures of the monovalent organic groups represented by $Z^1$, $Z^2$, $Z^3$, and $Z^4$ are not particularly limited, and specific examples thereof include an alkyl group, a hydroxyl group, an alkoxy group, an aryloxy group, a heteroaryloxy group, an alkylthioether group, an arylthioether group, a heteroarylthioether group, and an amino group. Above all, the organic groups represented by $Z^1$, $Z^2$, $Z^3$, and $Z^4$ are each preferably a group having a steric repulsion effect particularly from the viewpoint of improving dispersibility and are each independently preferably an alkyl group having 5 to 24 carbon atoms or an alkoxy group having 5 to 24 carbon atoms. Above all, the organic groups represented by $Z^1$, $Z^2$, $Z^3$, and $Z^4$ are each independently particularly preferably a branched alkyl group having 5 to 24 carbon atoms, a cycloalkyl group having 5 to 24 carbon atoms, or an alkoxy group having 5 to 24 carbon atoms. The alkyl group contained in the alkoxy group may be linear, branched, or cyclic.

From the viewpoint of dispersion stability and developability, j and k in Formula (11) and Formula (12) are each preferably an integer of 4 to 6 and most preferably 5.

In Formula (13), $R^3$ is preferably an alkylene group having 2 to 10 carbon atoms and more preferably an alkylene group having 2 or 3 carbon atoms. In a case where p is 2 to 500, a plurality of $R^3$'s may be the same as or different from each other.

In Formula (14), the monovalent organic group of $R^4$ is not particularly limited in structure. $R^4$ is preferably a hydrogen atom, an alkyl group, an aryl group, or a heteroaryl group, and more preferably a hydrogen atom or an alkyl group. In a case where $R^4$ is an alkyl group, a linear alkyl group having 1 to 20 carbon atoms, a branched alkyl group having 3 to 20 carbon atoms, or a cycloalkyl group having 5 to 20 carbon atoms is preferable, a linear alkyl group having 1 to 20 carbon atoms is more preferable, and a linear alkyl group having 1 to 6 carbon atoms is particularly preferable. In Formula (14), in a case where q is 2 to 500, a plurality of $X^5$ and a plurality of $R^4$ present in the graft copolymer may be the same as or different from each other.

With regard to the graft copolymer, reference can be made to the description in paragraphs [0025] to [0094] of JP2012-255128A, the contents of which are incorporated herein by reference. The graft copolymer is, for example, a resin having the following structure. In addition, the above graft copolymer is, for example, the resin described in paragraphs [0072] to [0094] of JP2012-255128A, the contents of which are incorporated herein by reference.

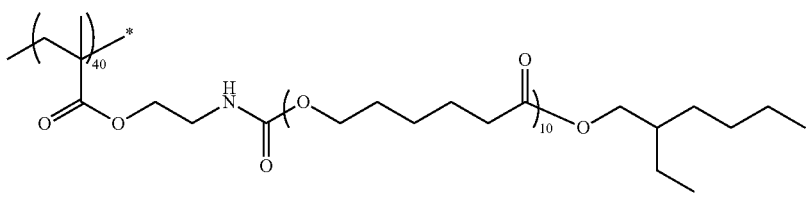

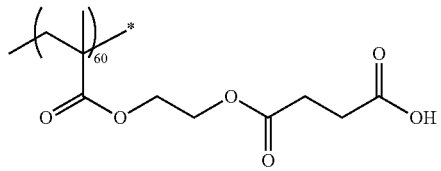

In the present invention, the dispersant is also preferably an oligoimine-based dispersant containing a basic nitrogen atom in at least one of a main chain or a side chain. The oligoimine-based dispersant is preferably a resin which has a repeating unit having a partial structure X containing a functional group with a pKa of 14 or less and a side chain containing an oligomer chain or polymer chain Y having 40 to 10,000 atoms, and has a basic nitrogen atom on at least one of a main chain or a side chain. This resin interacts with a filler (for example, an inorganic particle such as titanium oxide) at both the nitrogen atom and the functional group having a pKa of 14 or less contained in the partial structure X, and the dispersant has a oligomer chain or polymer chain Y having 40 to 10,000 atoms, for example, the oligomer chain or polymer chain Y functions as a steric repulsion group, which enables to exhibit good dispersibility, resulting in uniform dispersion of the filler. In addition, the interaction between the oligomer chain or polymer chain Y and the solvent can suppress the sedimentation of the filler for a long period of time. Further, since the oligomer chain or polymer chain Y functions as a steric repulsion group to prevent the aggregation of the filler, excellent dispersibility can be obtained even in a case where the content of the filler is increased.

Here, the basic nitrogen atom is not particularly limited as long as it is a nitrogen atom exhibiting basicity, but the resin preferably contains a structure having a nitrogen atom with a pKb of 14 or less and more preferably a structure having a nitrogen atom with a pKb of 10 or less. In the present invention, pKb (basic strength) refers to a pKb in water at 25° C., which is one of the parameters for quantitatively expressing the strength of a base, and has the same definition as the basicity constant. The basic strength pKb and the acidic strength pKa have a relationship of pKb=14–pKa.

The functional group with a pKa of 14 or less contained in the partial structure X is not particularly limited, and the structure or the like thereof is not particularly limited as long as the physical properties satisfy this condition. A functional group with a pKa of 12 or less is particularly preferable and a functional group with a pKa of 11 or less is most preferable. Specific examples of the functional group include a carboxy group (pKa: approximately 3 to 5), a sulfo group (pKa: approximately −3 to −2), a —COCH$_2$CO— group (pKa: approximately 8 to 10), a —COCH$_2$CN group (pKa: approximately 8 to 11), a —CONHCO— group, a phenolic hydroxyl group, a —R$_F$CH$_2$OH group, or a —(R$_F$)$_2$CHOH group (R$_F$ represents a perfluoroalkyl group, pKa: approximately 9 to 11), and a sulfonamido group (pKa: approximately 9 to 11). The partial structure X having a functional group with a pKa of 14 or less is preferably directly bonded to a basic nitrogen atom in a repeating unit containing a nitrogen atom; but the basic nitrogen atom of the repeating unit containing a basic nitrogen atom and the partial structure X may be linked to each other through a covalent bond as well as an ionic bond such that a salt is formed.

The oligoimine-based dispersant is preferably a resin having a repeating unit containing a basic nitrogen atom to which the partial structure X having a functional group with a pKa of 14 or less is bonded, and an oligomer chain or polymer chain Y having 40 to 10,000 atoms in a side chain. Further, in such an oligoimine-based dispersant, the repeating unit is more preferably at least one selected from a poly(lower alkyleneimine)-based repeating unit, a polyallylamine-based repeating unit, a polydiallylamine-based repeating unit, a metaxylenediamine-epichlorohydrin polycondensate-based repeating unit, or a polyvinylamine-based repeating unit. Further, in the present invention, the term "lower" in the poly(lower alkyleneimine) means that the number of carbon atoms is 1 to 5, and the term "lower alkyleneimine" means an alkyleneimine having 1 to 5 carbon atoms.

Examples of the oligomer chain or polymer chain Y having 40 to 10,000 atoms include known polymer chains such as a polyester, a polyamide, a polyimide, and a poly(meth)acrylic acid ester, which can be linked to the main chain portion of the dispersant. The bonding site in the oligomer chain or polymer chain Y to the resin is preferably the terminal of the oligomer chain or polymer chain Y.

The oligomer chain or polymer chain Y is preferably bonded to the nitrogen atom in at least one repeating unit selected from a poly(lower alkyleneimine)-based repeating unit, a polyallylamine-based repeating unit, a polydiallylamine-based repeating unit, a metaxylenediamine-epichlorohydrin polycondensate-based repeating unit, or a polyvinylamine-based repeating unit. The bonding mode between the oligomer chain or polymer chain Y and the main chain portion having the repeating unit as described above is a covalent bond, an ionic bond, or a mixture of a covalent bond and an ionic bond. The ratio of such a bonding mode in terms of covalent bonds:ionic bonds is preferably 100:0 to 0:100 and more preferably 95:5 to 5:95. The oligomer chain or polymer chain Y is preferably bonded to a nitrogen atom of a repeating unit containing the nitrogen atom through an amide bond, or through an ionic bond as a carboxylate.

The number of atoms in the oligomer chain or polymer chain Y is preferably 50 to 5,000 and more preferably 60 to 3,000 from the viewpoint of dispersibility, dispersion stability, and developability. In addition, the number-average molecular weight of the oligomer chain or polymer chain Y can be measured as a value in terms of polystyrene according to a GPC method. The number-average molecular weight of the oligomer chain or polymer chain Y is preferably 1,000 to 50,000 and more preferably 1,000 to 30,000.

The oligoimine-based dispersant is, for example, a resin containing a repeating unit represented by Formula (I-1), a repeating unit represented by Formula (I-2), and/or a repeating unit represented by Formula (I-2a).

$$*\!-\!\!\left[\!(CR^1R^2)_a\!-\!\underset{\underset{X}{\overset{|}{L}}}{N}\!\right]\!-\!*\quad (I\text{-}1)$$

$$*\!-\!\!\left[\!(CR^1R^2)_a\!-\!\underset{\underset{Y}{\overset{|}{L}}}{N}\!\right]\!-\!*\quad (I\text{-}2)$$

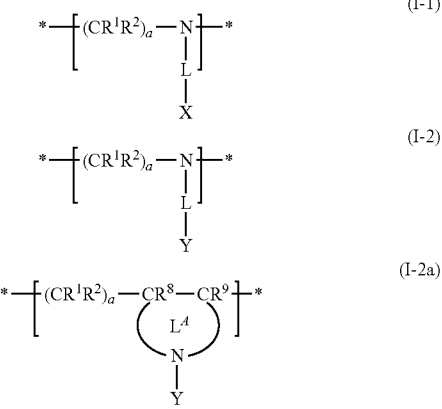
(I-2a)

$R^1$ and $R^2$ each independently represent a hydrogen atom, a halogen atom, or an alkyl group (which preferably has 1 to 6 carbon atoms).

$a$ each independently represents an integer of 1 to 5. * represents a linking portion between repeating units.

$R^8$ and $R^9$ are each independently a group having the same definition as in $R^1$.

L is a single bond, an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group which is related to a combination thereof. Among these, a single bond or —$CR^5R^6$—$NR^7$— (an imino group is toward X or Y) is preferable.

Here, $R^5$ and $R^6$ each independently represent a hydrogen atom, a halogen atom, or an alkyl group (which preferably has 1 to 6 carbon atoms). $R^7$ is a hydrogen atom or an alkyl group having 1 to 6 carbon atoms.

$L^a$ is a structural moiety which forms a ring structure along with $CR^8CR^9$ and an N atom. $L^a$ is preferably a structural moiety which forms a non-aromatic heterocyclic ring having 3 to 7 carbon atoms along with carbon atoms of $CR^8CR^9$. $L^a$ is more preferably a structural moiety which forms a 5- to 7-membered non-aromatic heterocyclic ring along with carbon atoms of $CR^8CR^9$ and an N atom (nitrogen atom). $L^a$ is still more preferably a structural moiety which forms a 5-membered non-aromatic heterocyclic ring and particularly preferably a structural moiety which forms pyrrolidine. $L^a$ may further have a substituent such as an alkyl group.

X represents a group which has a functional group with a pKa of 14 or less.

Y represents an oligomer chain or polymer chain having 40 to 10,000 atoms.

The dispersant (oligoimine-based dispersant) may further contain one or more selected from repeating units represented by Formula (I-3), Formula (I-4), and Formula (I-5) as a copolymerization component. The dispersion performance of the filler can be further improved by incorporating such a repeating unit into the dispersant.

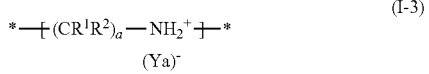
(I-3)

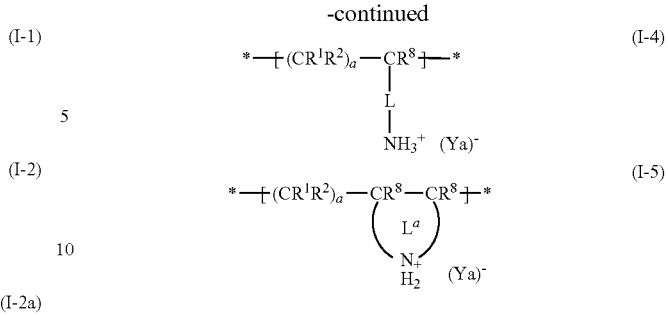

$R^1$, $R^2$, $R^8$, $R^9$, L, La, a, and * each have the same definition as in Formulae (I-1), (I-2) and (I-2a).

Ya represents an oligomer chain or polymer chain having 40 to 10,000 atoms, which has an anion group.

With regard to the oligoimine-based dispersant, reference can be made to the description in paragraphs [0118] to [0190] of JP2015-034961A, the contents of which are incorporated herein by reference. The oligoimine-based dispersant is, for example, a resin X-4 shown below or the resin described in paragraphs [0169] to [0190] of JP2015-034961A.

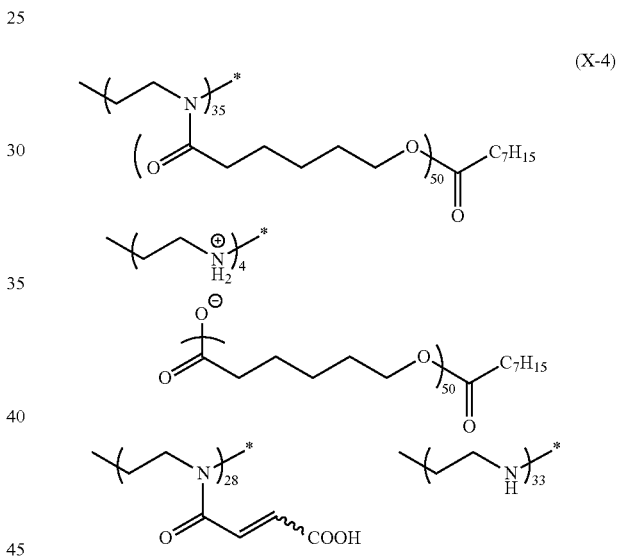

The dispersant is also available as a commercial product. Examples of such a dispersant include DISPERBYK-101 (polyamidoamine phosphate), DISPERBYK-107 (carboxylic acid ester), DISPERBYK-110 and -180 (copolymer containing an acid group), DISPERBYK-130 (polyamide), DISPERBYK-161, -162, -163, -164, -165, -166 and -170 (high molecular weight copolymer) and BYK-P104 and -P105 (high-molecular-weight unsaturated polycarboxylic acid) (manufactured by BYK-Chemie GmbH); EFKA 4047, 4050, 4010 and 4165 (polyurethane-based), EFKA 4330 and 4340 (block copolymer) and EFKA 4400 and 4402 (modified polyacrylate), EFKA 5010 (polyester amide), EFKA 5765 (high molecular weight polycarboxylic acid salt), EFKA 6220 (fatty acid polyester), EFKA 6745 (phthalocyanine derivative), and EFKA 6750 (azo pigment derivative) (manufactured by Efka Ltd.); AJISPER PB821 and PB822 (manufactured by Ajinomoto Fine-Techno Co., Inc.); FLOWLEN TG-710 (urethane oligomer) and POLYFLOW No. 50E and No. 300 (acrylic copolymer) (manufactured by Kyoeisha Chemical Co., Ltd.); DISPARLON KS-860, 873SN, 874, and #2150 (aliphatic polycarboxylic acid), DISPARLON #7004 (polyether ester), DISPARLON DA-703-50, DA-705, and DA-725 (manufactured by Kusumoto Chemicals, Ltd.); DEMOL RN and N (naphthalenesulfonic acid formalin polycondensate), DEMOL MS, C, and SN—B (aromatic sulfonic acid formalin polycondensate), HOMOGENOL L-18 (high molecular weight polycarboxylic acid), EMULGEN 920, 930, 935 and 985 (polyoxyethylene nonylphenyl ether), ACETAMIN 86 (stearylamine acetate) (manufactured by Kao Corporation); SOLSPERSE 5000 (phthalocyanine derivative), SOLSPERSE 22000 (azo pigment derivative), SOLSPERSE 13240 (polyester amine), SOLSPERSE 3000, 17000 and 27000 (polymer having a functional moiety at a terminal thereof), SOLSPERSE 24000, 26000, 28000, 32000, 36000, and 38500 (graft polymer), and SOLSPERSE 41000 (manufactured by Lubrizol Corporation); and NIKKOL T106 (polyoxyethylene sorbitan monooleate) and NIKKOL MYS-IEX (polyoxyethylene monostearate) (manufactured by Nikko Chemicals Co., Ltd.).

In addition, examples of a commercially available product of the dispersant having a phosphorus atom-containing group (for example, a phosphate group) as an acid-based adsorption site include SOLSPERSE 26000, 36000, and 41000 (manufactured by Lubrizol Corporation).

The content of the dispersant is preferably 0.01% to 20% by mass with respect to the total solid content of the composition. The upper limit of the content of the dispersant is preferably 10% by mass or less and more preferably 5% by mass or less. The lower limit of the content of the dispersant is preferably 0.05% by mass or more and more preferably 0.1% by mass or more.

In addition, the content of the dispersant is preferably 0.1% to 50% by mass with respect to 100 parts by mass of the filler. The upper limit of the content of the dispersant is preferably 40% by mass or less and more preferably 30% by mass or less. The lower limit of the content of the dispersant is preferably 0.2% by mass or more and more preferably 0.5% by mass or more.

The dispersant may be used alone or in combination of two or more thereof. In a case where two or more types of dispersants are contained, the total amount thereof is preferably within the above range.

In addition, the resin used in the thermal conductive layer according to the embodiment of the present invention may contain polyimide, polybenzoxazole, and precursors thereof. The polyimide precursor and the polybenzoxazole precursor contained in the composition according to the embodiment of the present invention become a polyimide resin and a polybenzoxazole resin by forming a coating film of the composition, followed by cyclization thereof. The polyimide precursor and the polybenzoxazole precursor are preferably used in negative development. In particular, the resin according to the embodiment of the present invention preferably contains a polyimide precursor. The polyimide precursor is not particularly limited in type or the like thereof, but preferably contains a repeating unit represented by Formula (5).

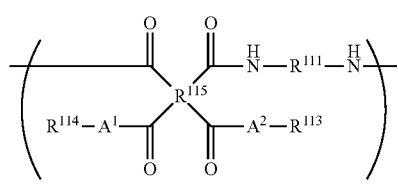

Formula (5)

In Formula (5), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group.

$A^1$ and $A^2$ in Formula (5) are each more preferably an oxygen atom.

$R^{111}$ in Formula (5) represents a divalent organic group. Examples of the divalent organic group include a linear or branched aliphatic group, a cyclic aliphatic group, and an aromatic group, among which a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group consisting of a combination thereof is preferable, and a group consisting of an aromatic group having 6 to 20 carbon atoms is more preferable.

In particular, $R^{113}$ and $R^{114}$ each independently represent a hydrogen atom or a monovalent organic group, and it is preferable that at least one of $R^{113}$ or $R^{114}$ contains a radical polymerizable group and it is more preferable that both of $R^{113}$ and $R^{114}$ contain a radical polymerizable group. The radical polymerizable group is a group capable of undergoing a crosslinking reaction by the action of a radical, and a preferred example thereof is a group having an ethylenically unsaturated bond.

Examples of the group having an ethylenically unsaturated bond include a vinyl group, a (meth)allyl group and a group represented by Formula (5-1).

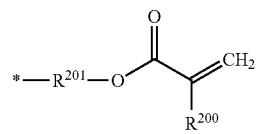

Formula (5-1)

In Formula (5-1), $R^{200}$ represents a hydrogen atom or a methyl group, among which a methyl group is more preferable.

In Formula (5-1), $R^{201}$ represents an alkylene group having 2 to 12 carbon atoms, —$CH_2CH(OH)CH_2$—, or a polyoxyalkylene group having 4 to 30 carbon atoms.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —$CH_2CH(OH)CH_2$—, among which an ethylene group, a propylene group, a trimethylene group, and —$CH_2CH(OH)CH_2$— are more preferable.

Particularly preferably, $R^{200}$ is a methyl group and $R^{201}$ is an ethylene group.

A substituent (for example, a hydrogen atom, 2-hydroxybenzyl, 3-hydroxybenzyl, or 4-hydroxybenzyl) which improves the solubility of a developer is preferably used as the monovalent organic group represented by $R^{113}$ or $R^{114}$.

Specific examples of the polyimide resin and the polyimide precursor are described in paragraphs [0014] to [0046] of WO2018/043467A, the contents of which are incorporated herein by reference.

<<Polymerizable Monomer>>

The composition used for manufacturing the thermal conductive layer according to the embodiment of the present invention preferably contains a polymerizable monomer. The polymerizable monomer is preferably a compound having at least one ethylenically unsaturated double bond and more preferably a compound having at least one terminal ethylenically unsaturated bond, preferably two or more terminal ethylenically unsaturated bonds. In addition, the polymerizable monomer is preferably a compound having 6 or more ethylenically unsaturated double bonds or a compound having 3 or 4 ethylenically unsaturated double bonds and more preferably a compound having 3 or 4 ethylenically unsaturated double bonds. The group having an ethylenically unsaturated bond is preferably a (meth)acryloyl group or a (meth)acryloyloxy group. In addition, the polymerizable monomer is preferably a radical polymerizable monomer. In addition, the polymerizable monomer preferably contains a compound having two or more of at least one selected from the group consisting of a hydroxymethyl group and an alkoxymethyl group in a molecule thereof. The number of carbon atoms in the alkyl chain in the alkoxymethyl group is preferably 1 to 10, more preferably 1 to 5, and still more preferably 1 or 2. That is, the alkoxymethyl group is preferably a methoxymethyl group or an ethoxymethyl group.

The molecular weight of the polymerizable monomer of the present invention is preferably 100 to 3,000. The upper limit of the molecular weight of the polymerizable monomer is preferably less than 2,000 and more preferably less than 1,000. The lower limit of the molecular weight of the polymerizable monomer is preferably 150 or more and more preferably 250 or more.

The polymerizable monomer is preferably a trifunctional to pentadecafunctional (meth)acrylate compound, more preferably a trifunctional to hexafunctional (meth)acrylate compound, and still more preferably a trifunctional or tetrafunctional (meth)acrylate compound. According to this aspect, the solvent resistance of the obtained film and the adhesiveness to a base material can be improved. In addition, the polymerizable monomer is also preferably a hexafunctional or higher functional (meth)acrylate compound.

The polymerizable monomer is also preferably a compound having a group having at least one addition-polymerizable ethylene group and a group having an ethylenically unsaturated bond having a boiling point of 100° C. or higher under normal pressure. Examples thereof include monofunctional acrylates and methacrylates such as polyethylene glycol mono(meth)acrylate, polypropylene glycol mono (meth)acrylate, and phenoxyethyl (meth)acrylate; polyethylene glycol di(meth)acrylate, trimethylolethane tri(meth) acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, and mixtures thereof, among which pentaerythritol tetra(meth)acrylate is preferable.

Polymerizable monomers represented by Formulae (MO-1) to (MO-5) can also be suitably used as the polymerizable monomer. In the formulae, in a case where T is an oxyalkylene group, the terminal on the carbon atom side is bonded to R.

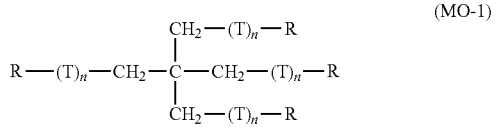
(MO-1)

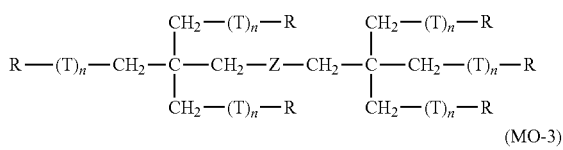
(MO-2)

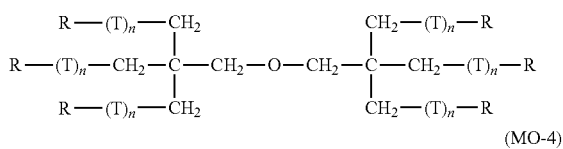
(MO-3)

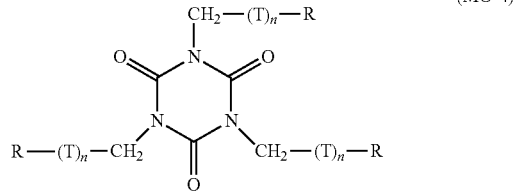
(MO-4)

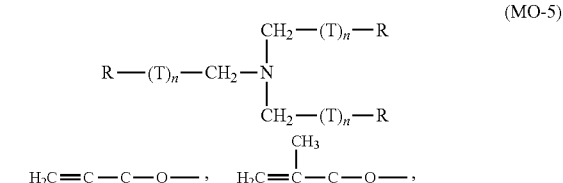
(MO-5)

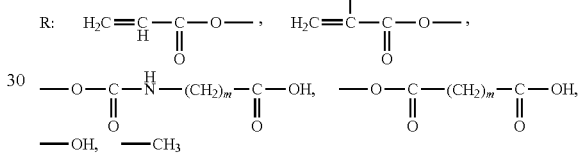

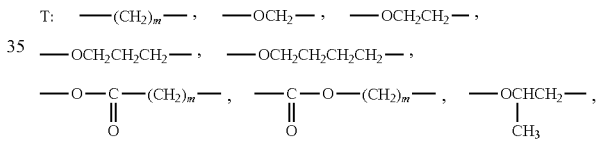

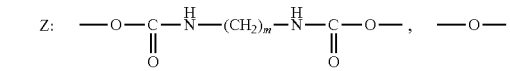

In the above formulae, n is an integer of 0 to 14 and m is an integer of 1 to 8. A plurality of R's and a plurality of T's present in one molecule each may be the same as or different from each other.

In each of the polymerizable monomers represented by Formulae (MO-1) to (MO-5), at least one of the plurality of R's represents a group represented by —OC(=O)CH=CH$_2$ or —OC(=O)C(CH$_3$)=CH$_2$.

The polymerizable monomers represented by Formulae (MO-1) to (MO-5) are, for example, the compounds described in paragraphs [0248] to [0251] of JP2007-269779A.

In addition, the compounds described in JP1998-062986A (JP-H10-062986A), which are obtained by addition of ethylene oxide or propylene oxide to a polyfunctional alcohol, followed by (meth)acrylation, can also be used as the polymerizable monomer.

The polymerizable monomer is preferably pentaerythritol tetraacrylate (as a commercially available product, A-TMMT manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), or dipentaerythritol hexa(meth)acrylate (as a commercially available product, KAYARAD DPHA manufactured by Nippon Kayaku Co., Ltd.) and more preferably pentaerythritol tetraacrylate.

The polymerizable monomer may have an acid group such as a carboxy group, a sulfo group, or a phosphate group. The polymerizable monomer having an acid group can be obtained by, for example, a method in which a part of hydroxyl groups of a polyfunctional alcohol is converted into (meth)acrylate and an acid anhydride is added to the remaining hydroxyl groups to form a carboxy group. The polymerizable monomer having an acid group may be, for example, an ester of an aliphatic polyhydroxy compound and an unsaturated carboxylic acid. The polymerizable monomer having an acid group is preferably a compound in which an unreacted hydroxyl group of an aliphatic polyhydroxy compound is reacted with a non-aromatic carboxylic acid anhydride to give an acid group. Particularly preferably, in this ester, the aliphatic polyhydroxy compound is pentaerythritol and/or dipentaerythritol. Examples of a commercially available product of the polymerizable monomer having an acid group include M-305, M-510, and M-520 of ARONIX series as polybasic acid-modified acrylic oligomers (manufactured by Toagosei Co., Ltd.). The acid value of the polymerizable monomer having an acid group is preferably 0.1 to 40 mgKOH/g. The lower limit of the acid value of the polymerizable monomer having an acid group is preferably 5 mgKOH/g or more. The upper limit of the acid value of the polymerizable monomer having an acid group is preferably 30 mgKOH/g or less.

In addition, the polymerizable monomer is also preferably a polymerizable monomer having a caprolactone structure. The polymerizable monomer having a caprolactone structure is not particularly limited as long as it has a caprolactone structure in the molecule, and examples thereof include ε-caprolactone-modified polyfunctional (meth)acrylate. The ε-caprolactone-modified polyfunctional (meth)acrylate is obtained, for example, by esterifying a polyhydric alcohol (such as trimethylolethane, ditrimethylolethane, trimethylolpropane, ditrimethylolpropane, pentaerythritol, dipentaerythritol, tripentaerythritol, glycerin, diglycerol, or trimethylolmelamine), (meth)acrylic acid, and ε-caprolactone. The polymerizable monomer having a caprolactone structure is preferably a compound represented by Formula (Z-1).

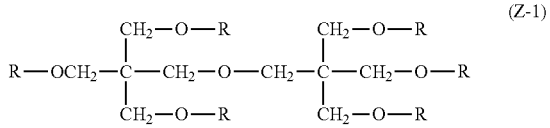
(Z-1)

In Formula (Z-1), all six R's are groups represented by Formula (Z-2), or 1 to 5 R's of the six R's are groups represented by Formula (Z-2) and the remaining R's are groups represented by Formula (Z-3).

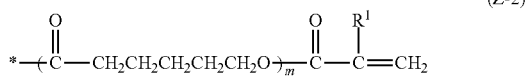
(Z-2)

In Formula (Z-2), $R^1$ represents a hydrogen atom or a methyl group, m represents a number of 1 or 2, and "*" represents a bond.

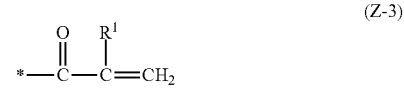
(Z-3)

In Formula (Z-3), $R^1$ represents a hydrogen atom or a methyl group, and "*" represents a bond.

The polymerizable monomer having a caprolactone structure is commercially available, for example, from Nippon Kayaku Co., Ltd. as KAYARAD DPCA series, examples of which include DPCA-20 (a compound in which m=1 in Formula (Z-2), the number of groups represented by Formula (Z-2)=2, and R's are all hydrogen atoms), DPCA-30 (a compound in which m=1 in Formula (Z-2), the number of groups represented by Formula (Z-2)=3, and $R^1$'s are all hydrogen atoms), DPCA-60 (a compound in which m=1 in Formula (Z-2), the number of groups represented by Formula (Z-2)=6, and $R^1$'s are all hydrogen atoms), and DPCA-120 (a compound in which m=2 in Formula (Z-2), the number of groups represented by Formula (Z-2)=6, and $R^1$'s are all hydrogen atoms).

A compound represented by Formula (Z-4) or (Z-5) can also be used as the polymerizable monomer.

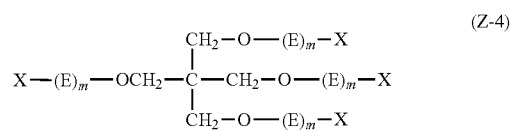
(Z-4)

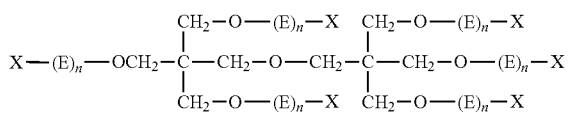
(Z-5)

In Formulae (Z-4) and (Z-5), E's each independently represent $-((CH_2)_yCH_2O)-$, or $-((CH_2)_yCH(CH_3))-$, y's each independently represent an integer of 0 to 10, and X's each independently represent a (meth)acryloyl group, a hydrogen atom, or a carboxy group.

In Formula (Z-4), the total number of (meth)acryloyl groups is 3 or 4, m's each independently represent an integer of 0 to 10, and the sum of each m is an integer of 0 to 40.

In Formula (Z-5), the total number of (meth)acryloyl groups is 5 or 6, n's each independently represent an integer of 0 to 10, and the sum of each n is an integer of 0 to 60.

In Formula (Z-4), m is preferably an integer of 0 to 6 and more preferably an integer of 0 to 4.

In addition, the sum of each m is preferably an integer of 2 to 40, more preferably an integer of 2 to 16, and particularly preferably an integer of 4 to 8.

In Formula (Z-5), n is preferably an integer of 0 to 6 and more preferably an integer of 0 to 4.

In addition, the sum of each n is preferably an integer of 3 to 60, more preferably an integer of 3 to 24, and particularly preferably an integer of 6 to 12.

In addition, $-((CH_2)_yCH_2O)-$ or $-((CH_2)_yCH(CH_3))-$ in Formula (Z-4) or Formula (Z-5) preferably has a form in which the terminal on the oxygen atom side is bonded to X.

The compounds represented by Formula (Z-4) or Formula (Z-5) may be used alone or in combination of two or more thereof. In particular, in Formula (Z-5), a form in which all six X's are acryloyl groups is preferable.

In addition, the total content of the compound represented by Formula (Z-4) or Formula (Z-5) in the polymerizable monomer is preferably 20% by mass or more and more preferably 50% by mass or more.

The compound represented by Formula (Z-4) or Formula (Z-5) can be synthesized by a method including a step of bonding a ring-opening skeleton to pentaerythritol or dipentaerythritol by a ring-opening addition reaction with ethylene oxide or propylene oxide and a step of reacting a hydroxyl group at the terminal of the ring-opening skeleton with, for example, (meth)acryloyl chloride to introduce a (meth)acryloyl group. Since each step is a well-known step, those skilled in the art can easily synthesize the compound represented by Formula (Z-4) or Formula (Z-5).

Among the compounds represented by Formula (Z-4) or Formula (Z-5), more preferred is a pentaerythritol derivative and/or a dipentaerythritol derivative.

Details of such polymerizable monomers are described in WO2017/134998A, the contents of which are incorporated herein by reference.

Urethane acrylates described in JP1973-041708B (JP-S48-041708B), JP1976-037193A (JP-S51-037193A), JP1990-032293B (JP-H02-032293B), and JP1990-016765B (JP-H02-016765B), and urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable as the polymerizable monomer. In addition, addition-polymerizable monomers having an amino structure or a sulfide structure in the molecule, which are described in JP1988-277653A (JP-S63-277653A), JP1988-260909A (JP-S63-260909A), and JP1989-105238A (JP-H01-105238A), are also preferable.

Other commercially available polymerizable monomers include urethane oligomers UAS-10 and UAB-140 (manufactured by Sanyo Kokusaku Pulp Co., Ltd.), U-4HA, U-6LPA, UA-32P, U-10HA, U-10PA, UA-122P, UA-1100H, and UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, and AI-600 (manufactured by Kyoeisha Chemical Co., Ltd.), and UA-9050 and UA-9048 (manufactured by BASF SE).

Regarding these polymerizable monomers, details of a usage method such as a structure, single use, combined use, and an additive amount can be optionally set according to design of a final composition performance. For example, from the viewpoint of sensitivity, a structure having a high content of unsaturated groups per molecule is preferable, and in many cases, a difunctional or higher functional compound is preferable. In addition, from the viewpoint of increasing strength of a cured film, a trifunctional or higher functional compound is preferable. Furthermore, a method of using a compound with different functionalities and/or different polymerizable groups (for example, an acrylic acid ester, a methacrylic acid ester, a styrene-based compound, or a vinyl ether-based compound) in combination to adjust both sensitivity and strength is also effective. Furthermore, it is also preferable to use a polymerizable monomer having a different ethylene oxide chain length in combination as a trifunctional or higher functional compound. According to this aspect, the developability of the composition can be adjusted and therefore an excellent patterned shape can be obtained. In addition, the selection and/or usage of the polymerizable monomer is also an important factor for the compatibility and/or dispersibility with other components (for example, a photopolymerization initiator and a resin) contained in the composition. For example, the compatibility or the like can be improved by using a low-purity compound or by using two or more compounds in combination.

The content of the polymerizable monomer is preferably 0.5% to 50% by mass with respect to the total solid content of the composition. The lower limit of the content of the polymerizable monomer is preferably 1% by mass or more and more preferably 2% by mass or more. The upper limit of the content of the polymerizable monomer is more preferably 30% by mass or less and still more preferably 20% by mass or less.

It is also preferable that the composition used for manufacturing the thermal conductive layer according to the embodiment of the present invention contains a compound having an epoxy group (hereinafter, also referred to as "epoxy compound"). The epoxy compound can improve the solvent resistance of the obtained film. The epoxy compound may be, for example, a cross-linking agent which will be described later. Examples of the epoxy compound include a monofunctional or polyfunctional glycidyl ether compound and a polyfunctional aliphatic glycidyl ether compound. In addition, a compound having an epoxy group as a part of a glycidyl group, such as glycidyl (meth)acrylate or allyl glycidyl ether, or an alicyclic epoxy compound can also be used.

Examples of the epoxy compound include compounds having one or more epoxy groups in one molecule. It is preferable to have 1 to 100 epoxy groups in one molecule. The upper limit of the number of epoxy groups in one molecule may be, for example, 10 or less, or 5 or less. The lower limit of the number of epoxy groups in one molecule is preferably two or more.

The epoxy compound preferably has an epoxy equivalent (=molecular weight of epoxy compound/number of epoxy groups) of 500 g/eq or less, more preferably 100 to 400 g/eq, and still more preferably 100 to 300 g/eq.

The epoxy compound may be a low molecular weight compound (for example, a molecular weight of less than 2,000, further a molecular weight of less than 1,000), or a high molecular weight compound (macromolecule; for example, a molecular weight of 1,000 or more, further a molecular weight of 2,000 or more, and in a case of a polymer, a weight-average molecular weight of 1,000 or more, further a weight-average molecular weight of 2,000 or more). The weight-average molecular weight of the epoxy compound is preferably 200 to 100,000 and more preferably 500 to 50,000. The upper limit of the weight-average molecular weight is preferably 10,000 or less, more preferably 5,000 or less, and still more preferably 3,000 or less.

The compounds described in paragraphs [0034] to [0036] of JP2013-011869A, the contents of which are incorporated herein by reference, paragraphs [0147] to [0156] of JP2014-043556A, the contents of which are incorporated herein by reference, and paragraphs [0085] to [0092] of JP2014-089408A, the contents of which are incorporated herein by reference, can also be used as the epoxy compound.

Regarding commercially available products of the epoxy compound, in a case of bisphenol A type epoxy resin, for example, jER 825, jER 827, jER 828, jER 834, jER 1001, jER 1002, jER 1003, jER 1055, jER 1007, jER 1009, and jER 1010 (all manufactured by Mitsubishi Chemical Corporation), EPICLON 860, EPICLON 1050, EPICLON 1051, and EPICLON 1055 ((all manufactured by DIC Corporation) can be used. In addition, in a case of a bisphenol F type epoxy resin, for example, jER 806, jER 807, jER 4004, jER 4005, jER 4007, and jER 4010 (all manufactured by Mitsubishi Chemical Corporation), EPICLON 830 and EPICLON 835 (both manufactured by DIC Corporation), and LCE-21 and RE-602S (manufactured by Nippon Kayaku Co., Ltd.) can be used. In addition, in a case of phenol novolac type epoxy resin, for example, jER 152, jER 154, jER 157S70, and jER 157S65 (all manufactured by Mitsubishi Chemical Corporation), and EPICLON N-740, EPICLON N-770, and EPICLON N-775 (all manufactured by DIC Corporation) can be used. In addition, in a case of a cresol novolac type epoxy resin, for example, EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.) can be used. In addition, in a case of an aliphatic epoxy resin, for example, ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), and DENACOL EX-212L, EX-214L, EX-216L, EX-321L, and EX-850L (all manufactured by Nagase ChemteX Corporation) can be used. In addition, for example, ADEKA RESIN EP-4000S, ADEKA RESIN EP-4003S, ADEKA RESIN EP-4010S, ADEKA RESIN EP-401S (all manufactured by ADEKA Corporation), NC-2000, NC-3000, NC-7300, XD-1000, EPPN-501, and EPPN-502 (all manufactured by ADEKA Corporation), and jER 1031S (manufactured by Mitsubishi Chemical Corporation) can be used.

A compound having an epoxy group as a part of a glycidyl group, such as glycidyl (meth)acrylate or allyl glycidyl ether, can be used as the epoxy compound. Above all, an unsaturated compound having an alicyclic epoxy group is preferable. With regard to such a compound, reference can be made to, for example, the description in paragraph [0045] of JP2009-265518A, the contents of which are incorporated herein by reference.

The content of the epoxy compound is preferably 0.01% to 50% by mass with respect to the total solid content of the composition. The lower limit of the content of the epoxy compound is preferably 0.1% by mass or more and more preferably 0.5% by mass or more. The upper limit of the content of the epoxy compound is preferably 20% by mass or less and more preferably 10% by mass or less. The epoxy compounds may be used alone or in combination of two or more thereof. In a case where two or more types of epoxy compounds are contained, the total amount thereof is preferably within the above range.

<<Cross-Linking Agent>>

The composition used for manufacturing the thermal conductive layer according to the embodiment of the present invention preferably contains a cross-linking agent. Preferred examples of the cross-linking agent include a hydroxymethylated or alkoxymethylated phenolic compound, an alkoxymethylated melamine-based compound, an alkoxymethylglycoluril-based compound, and an alkoxymethylated urea-based compound, among which a hydroxymethylated or alkoxymethylated phenolic compound is more preferable because a good patterned shape can be obtained. Particularly preferred examples of the cross-linking agent include a phenolic derivative containing 3 to 5 benzene rings in a molecule, having two or more of at least one selected from the group consisting of a hydroxymethyl group and an alkoxymethyl group, and having a molecular weight of 1,200 or less, a melamine-formaldehyde derivative having at least two free N-alkoxymethyl groups, and an alkoxymethyl glycoluril derivative.

From the viewpoint of the patterned shape, it is more preferable that the composition used for manufacturing the thermal conductive layer according to the embodiment of the present invention contains at least two compounds having two or more alkoxymethyl groups in a molecule as a cross-linking agent; it is still more preferable that the composition contains at least two phenolic compounds having two or more alkoxymethyl groups in a molecule; and it is particularly preferable that at least one of the at least two phenolic compounds is a phenolic derivative which contains 3 to 5 benzene rings in a molecule, has two or more alkoxymethyl groups in total, and has a molecular weight of 1,200 or less. The alkoxymethyl group is preferably a methoxymethyl group or an ethoxymethyl group.

Among the cross-linking agents, a phenolic derivative having a hydroxymethyl group can be obtained by reacting a corresponding phenolic compound having no hydroxymethyl group with a formaldehyde in the presence of a base catalyst. In addition, a phenolic derivative having an alkoxymethyl group can be obtained by reacting a corresponding phenolic derivative having a hydroxymethyl group with an alcohol in the presence of an acid catalyst. Among the phenolic derivatives synthesized in the above-mentioned manner, a phenolic derivative having an alkoxymethyl group is particularly preferable in terms of sensitivity and storage stability.

Other preferred examples of the cross-linking agent further include compounds having an N-hydroxymethyl group or an N-alkoxymethyl group such as an alkoxymethylated melamine-based compound, an alkoxymethylglycoluril-based compound, and an alkoxymethylated urea-based compound.

Examples of such compounds include hexamethoxymethyl melamine, hexaethoxymethyl melamine, tetramethoxymethyl glycoluril, 1,3-bismethoxymethyl-4,5-bismethoxyethylene urea, and bismethoxymethyl urea, compounds of which are disclosed in EP033216A, EP0212482A, DE3634671A, and DE3711264A.

Among the cross-linking agents, particularly preferable cross-linking agents are shown below.

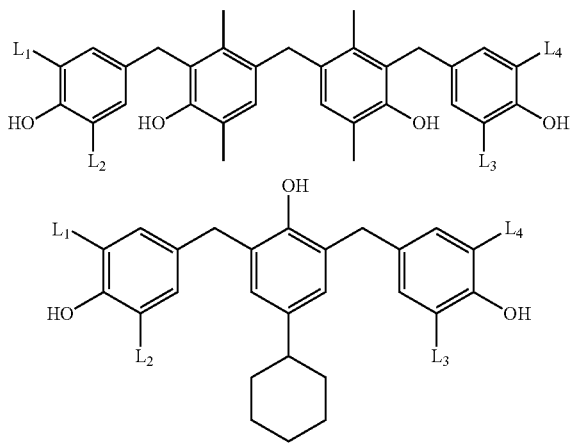

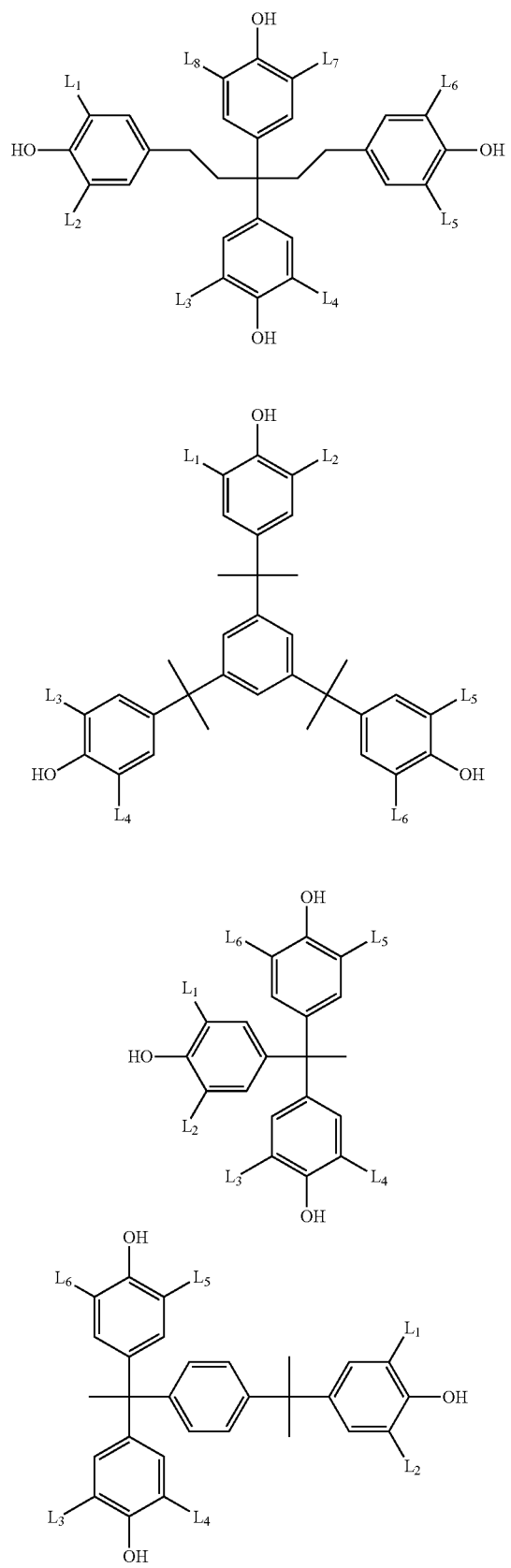
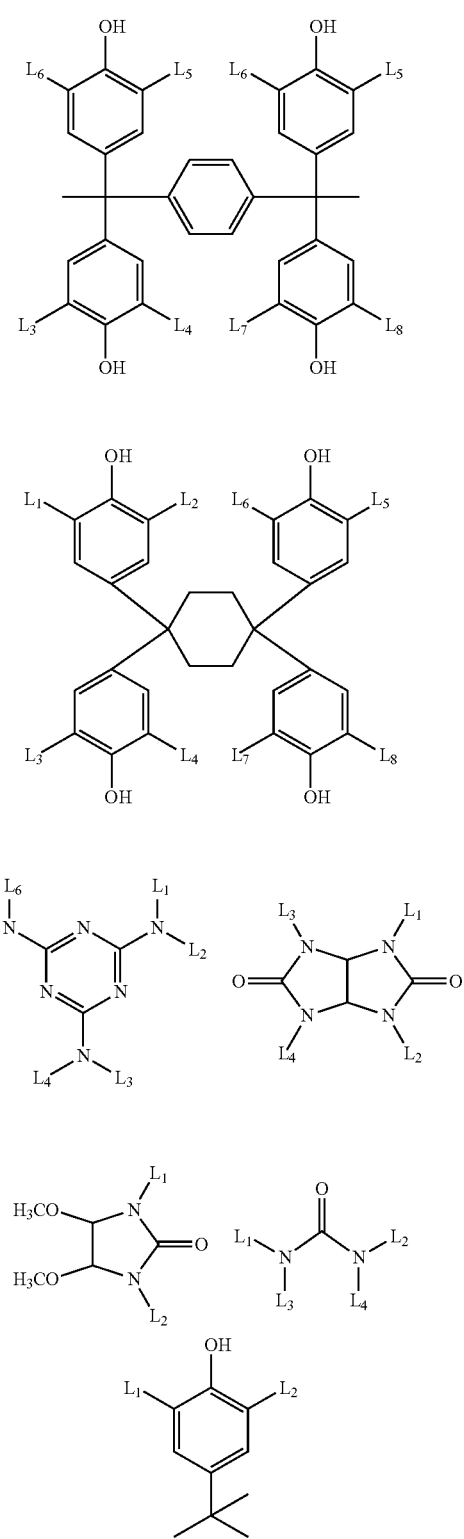
In the formulae, $L_1$ to $L_8$ each independently represent a hydrogen atom, a hydroxymethyl group, a methoxymethyl group, an ethoxymethyl group, or an alkyl group having 1 to 6 carbon atoms.

More specifically, the following compounds are preferable as the cross-linking agent.

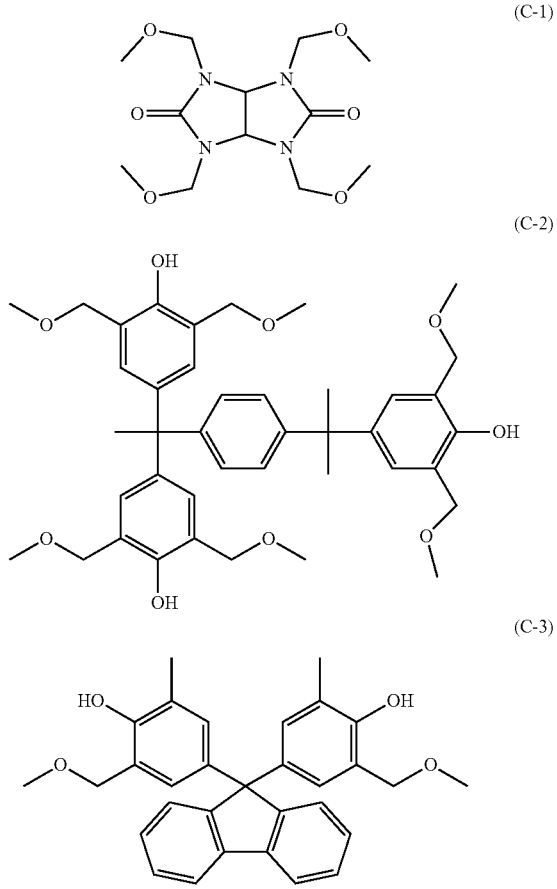

The cross-linking agent is used in an amount of preferably 3% to 65% by mass and more preferably 5% to 50% by mass based on the solid content of the composition used for manufacturing the thermal conductive layer according to the embodiment of the present invention. In a case where the amount of the cross-linking agent added is set to 3% to 65% by mass, it is possible to prevent a decrease in residual film ratio and resolution and to maintain excellent stability of the composition during storage. In a case where the composition used for manufacturing the thermal conductive layer according to the embodiment of the present invention includes an epoxy compound, the above-mentioned amount of the cross-linking agent added means an amount including the epoxy compound.

<<Photopolymerization Initiator>>

The composition used for manufacturing the thermal conductive layer according to the embodiment of the present invention preferably contains a photopolymerization initiator. The photopolymerization initiator is not particularly limited and can be appropriately selected from known photopolymerization initiators. For example, a compound having photosensitivity with respect to light rays in a range from an ultraviolet region to a visible light region, actinic rays or radiation is preferable as the photopolymerization initiator. In particular, the photopolymerization initiator is preferably a photoradical polymerization initiator or a compound that generates an acid upon irradiation with actinic rays or radiation. In addition, the photopolymerization initiator preferably contains at least one compound having a molar light absorption coefficient of at least about 50 within a range of about 300 nm to 800 nm (more preferably 330 nm to 500 nm).

Examples of the photopolymerization initiator include a halogenated hydrocarbon derivative (for example, a compound having a triazine skeleton or a compound having an oxadiazole skeleton), an acylphosphine compound such as acylphosphine oxide, hexaaryl biimidazole, an oxime compound such as an oxime derivative, an organic peroxide, a thio compound, a ketone compound, an aromatic onium salt, a ketoxime ether, an aminoacetophenone compound, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in GB1388492B, the compound described in JP1978-133428A (JP-S53-133428A), the compounds described in DE3337024B, the compounds described in F. C. Schaefer et al., J. Org. Chem.; 29, 1527 (1964), the compounds described in JP1987-058241A (JP-S62-058241A), the compounds described in JP1993-281728A (JP-H05-281728A), the compounds described in JP1993-034920A (JP-H05-034920A), and the compounds described in U.S. Pat. No. 4,212,976A.

In addition, from the viewpoint of exposure sensitivity, the photopolymerization initiator is preferably a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triaryl imidazole dimer, an onium compound, a benzothiazole compound, a benzophenone compound, an acetophenone compound, and derivatives thereof, a cyclopentadiene-benzene-iron complex and a salt thereof, a halomethyl oxadiazole compound, and a 3-aryl-substituted coumarin compound.

A hydroxyacetophenone compound, an aminoacetophenone compound, and an acylphosphine compound can also be suitably used as the photopolymerization initiator. More specifically, for example, the aminoacetophenone-based initiators described in JP1998-291969A (JP-H10-291969A) and the acylphosphine-based initiators described in JP4225898B can also be used. IRGACURE 184, DAROCUR 1173, IRGACURE 500, IRGACURE 2959, and IRGACURE 127 (trade names: all manufactured by BASF SE) can be used as the hydroxyacetophenone-based initiator. Commercially available products such as IRGACURE 907, IRGACURE 369, IRGACURE 379, and IRGACURE 379EG (trade names: all manufactured by BASF SE) can be used as the aminoacetophenone-based initiator. As the aminoacetophenone-based initiator, the compound described in JP2009-191179A, of which an absorption maximum wavelength matches with a light source of a wavelength of 365 nm, 405 nm, or the like, can also be used.

Commercially available products such as IRGACURE 819 and IRGACURE TPO (trade names: all manufactured by BASF SE) can be used as the acylphosphine-based initiator. The acylphosphine-based initiator is preferable from the viewpoint of preventing coloration after exposure to light.

An oxime compound can also be preferably used as the photopolymerization initiator. As specific examples of the oxime compound, the compounds described in JP2001-233842A, the compounds described in JP2000-080068A, and the compounds described in JP2006-342166A can be used.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. In addition, examples of the oxime compound also include the compounds described in J. C. S. Perkin 11 (1979), pp. 1653 to 1660, J. C. S. Perkin II (1979), pp. 156 to 162, Journal of Photopolymer Science and Technology (1995), pp. 202 to 232, JP2000-066385A, JP2000-080068A, JP2004-534797A, and JP2006-342166A. As commercially available products of the oxime compound, IRGACURE OXE01 (manufactured by BASF SE) and IRGACURE OXE02 (manufactured by BASF SE) are also suitably used. In addition, TR-PBG-304 (manufactured by Changzhou Tronly New Electronic Materials Co., Ltd.), and ADEKA ARKLS NCI-930 (manufactured by ADEKA Corporation) can also be used.

In addition, as oxime compounds other than those described above, the compounds described in JP2009-519904A in which oxime is linked to an N-position of a carbazole ring, the compounds described in U.S. Pat. No. 7,626,957B in which a hetero substituent is introduced into a benzophenone moiety, the compounds described in JP2010-015025A and US2009/0292039A in which a nitro group is introduced into a coloring agent moiety, the ketoxime compounds described in JP2009-131189A, the compounds described in U.S. Pat. No. 7,556,910B, which contain a triazine skeleton and an oxime skeleton in the same molecule, the compounds described in JP2009-22114A, which have an absorption maximum at 405 nm and have excellent sensitivity to a light source of g-rays, the compounds described in paragraphs [0076] to [0079] of JP2014-137466A, and the like, may be used.

With regard to preferred examples thereof, reference can be made to paragraphs [0274] and [0275] of JP2013-029760A, the contents of which are incorporated herein by reference.

Specifically, the oxime compound is preferably a compound represented by Formula (OX-1). The oxime compound may be an oxime compound in which an N—O bond of oxime forms an (E) isomer, an oxime compound in which the N—O bond of oxime forms a (Z) isomer, or an oxime compound in which the N—O bond forms a mixture of an (E) isomer and a (Z) isomer.

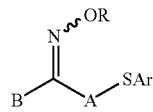

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group. Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-mentioned substituent may be further substituted with another substituent. Examples of the substituent include a halogen atom, an aryloxy group, an alkoxycarbonyl group or an aryloxycarbonyl group, an acyloxy group, an acyl group, an alkyl group, and an aryl group.

In Formula (OX-1), the monovalent substituent represented by B is preferably an aryl group, a heterocyclic group, an arylcarbonyl group, or a heterocyclic carbonyl group. These groups may have one or more substituents. Examples of the substituent include the above-mentioned substituents.

In Formula (OX-1), the divalent organic group represented by A is preferably an alkylene group, a cycloalkylene group, or an alkynylene group, each of which has 1 to 12 carbon atoms. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the contents of which are incorporated herein by reference, Compounds 24, and 36 to 40 described in JP2014-500852A, the contents of which are incorporated herein by reference, and Compound (C-3) described in JP2013-164471A, the contents of which are incorporated herein by reference.

In the present invention, an oxime compound having a nitro group can be used as the photopolymerization initiator. The oxime compound having a nitro group is also preferably a dimer. Specific examples of the oxime compound having a nitro group include the compounds described in paragraphs [0031] to [0047] of JP2013-114249A and paragraphs [0008] to [0012] and [0070] to [0079] of JP2014-137466A, the compounds described in paragraphs [0007] to [0025] of JP4223071B, and ADEKA ARKLS NCI-831 (manufactured by ADEKA Corporation).

Specific examples of the oxime compound preferably used in the present invention are shown below, but the present invention is not limited thereto.

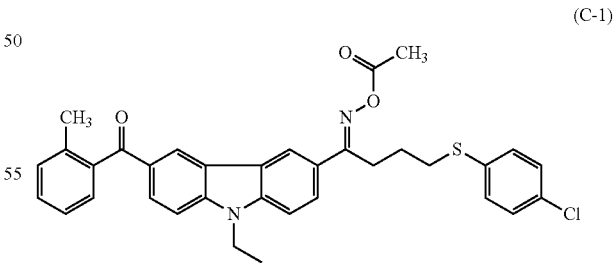

(C-1)

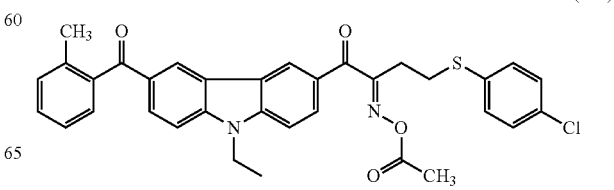

(C-2)

-continued
(C-3)
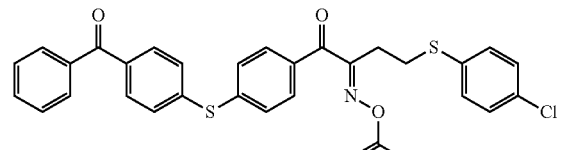
(C-4)
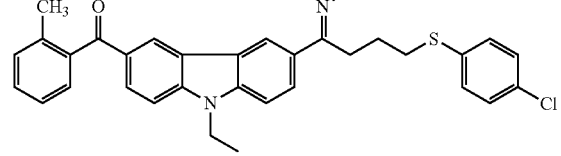
(C-5)
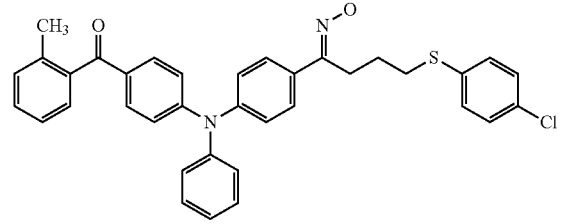
(C-6)
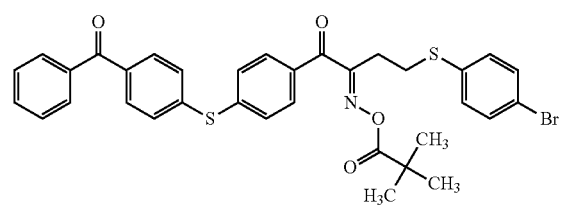
(C-7)
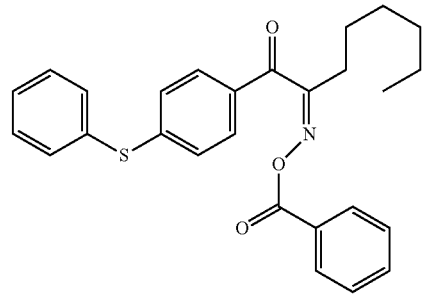
(C-8)
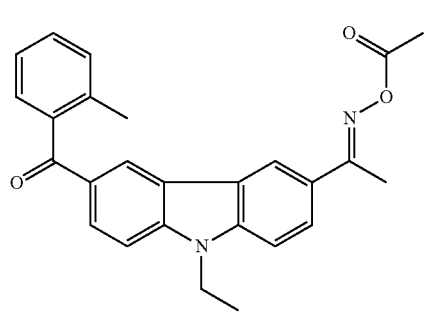
-continued
(C-9)
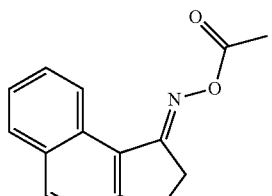
(C-10)
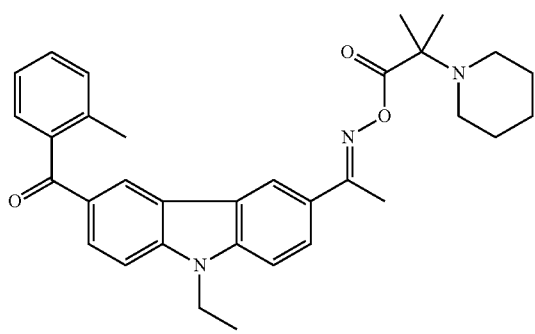
(C-11)
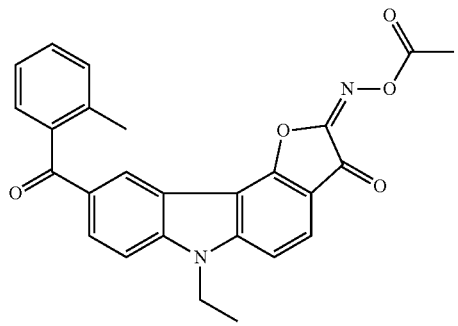
(C-12)
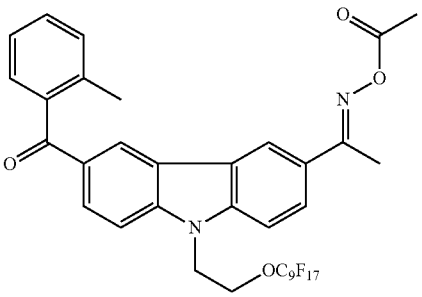
(C-13)
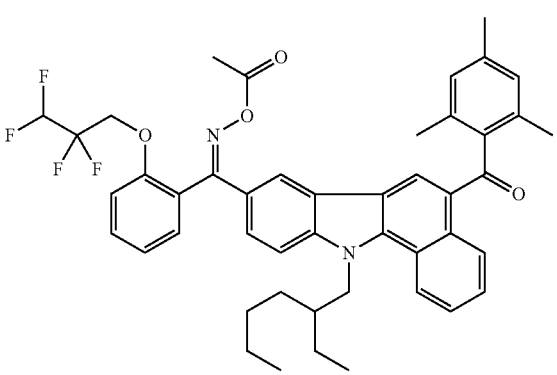

-continued

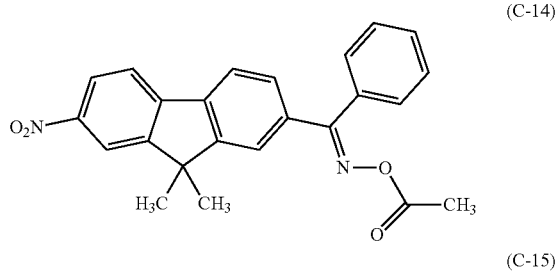
(C-14)

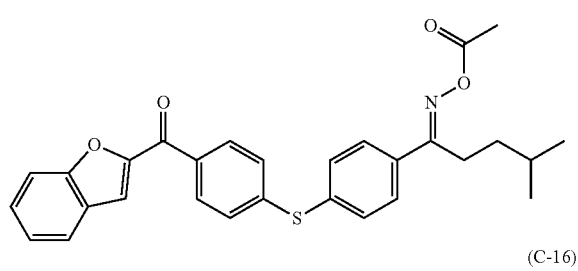
(C-15)

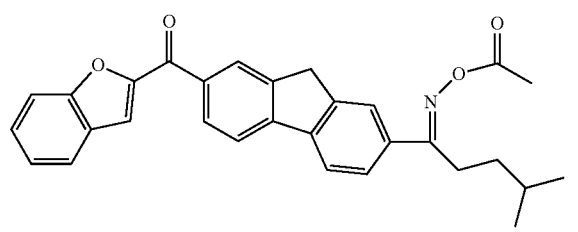
(C-16)

The oxime compound is preferably a compound having an absorption maximum wavelength in a wavelength range of 350 nm to 500 nm, more preferably a compound having an absorption maximum wavelength in a wavelength range of 360 nm to 480 nm, and particularly preferably a compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, a UV-Vis spectrophotometer (Cary-5 spectrophotometer, manufactured by Varian Medical Systems, Inc.) using ethyl acetate as a solvent at a concentration of 0.01 g/L.

<<<Compound that generates acid upon irradiation with actinic rays or radiation>>>

The composition used for manufacturing the thermal conductive layer according to the embodiment of the present invention may contain a compound that generates an acid upon irradiation with actinic rays or radiation (hereinafter, also simply referred to as "acid generator") as the photopolymerization initiator.

The acid generator may be in the form of a low molecular weight compound or may be in the form of being incorporated into a part of a polymer. In addition, the form of the low molecular weight compound and the form of being incorporated into a part of a polymer may be used in combination. In a case where the acid generator is in the form of a low molecular weight compound, the molecular weight thereof is preferably 3,000 or less, more preferably 2,000 or less, and still more preferably 1,000 or less. In a case where the acid generator is in the form of being incorporated in a part of a polymer, the acid generator may be incorporated into a part of the above-mentioned acid-decomposable resin or may be incorporated into a resin different from the acid-decomposable resin.

A preferred form of the acid generator may be, for example, an onium salt compound. Examples of such an onium salt compound include a sulfonium salt, an iodonium salt, and a phosphonium salt.

In addition, another preferred form of the acid generator may be, for example, a compound that generates a sulfonic acid, an imidic acid, or a methide acid upon irradiation with actinic rays or radiation. Examples of the acid generator in such a form include a sulfonium salt, an iodonium salt, a phosphonium salt, an oxime sulfonate, and an imido-sulfonate. The acid generator is preferably a compound that generates an acid upon irradiation with electron beams or extreme ultraviolet rays.

In the present invention, a preferred onium salt compound may be, for example, a sulfonium compound represented by Formula (7) or an iodonium compound represented by Formula (8).

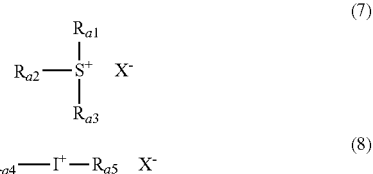

In Formula (7) and Formula (8), $R_{a1}$, $R_{a2}$, $R_{a3}$, $R_{a4}$, and $R_{a5}$ each independently represent an organic group.

$X^-$ represents an organic anion.

Hereinafter, the sulfonium compound represented by Formula (7) and the iodonium compound represented by Formula (8) will be described in detail.

$R_{a1}$, $R_{a2}$, and $R_{a3}$ in Formula (7), and $R_{a4}$ and $R_{a5}$ in Formula (8) each independently represent an organic group, and preferably at least one of $R_{a1}$, $R_{a2}$, or $R_{a3}$ and at least one of $R_{a4}$ or $R_{a5}$ are each an aryl group. The aryl group is preferably a phenyl group or a naphthyl group and more preferably a phenyl group.

The organic anion represented by $X^-$ in Formulae (7) and (8) may be, for example, a sulfonate anion, a carboxylate anion, a bis(alkylsulfonyl)amide anion, or a tris(alkylsulfonyl)methide anion and is preferably an organic anion represented by Formula (9), (10), or (11) and more preferably an organic anion represented by Formula (9).

In Formulae (9), (10), and (11), $R_{c1}$, $R_{c2}$, $R_{c3}$, and $R_{c4}$ each independently represent an organic group.

The organic anion of X⁻ corresponds to a sulfonic acid, an imidic acid, a methide acid, or the like which is an acid generated by actinic rays or radiation.

Examples of the organic group of $R_{c1}$, $R_{c2}$, $R_{c3}$, and $R_{c4}$ include an alkyl group, an aryl group, and a group in which a plurality of these groups are linked. Among these organic groups, an alkyl group whose I-position is substituted with a fluorine atom or a fluoroalkyl group, and a phenyl group substituted with a fluorine atom or a fluoroalkyl group are more preferable. By including a fluorine atom or a fluoroalkyl group, the acidity generated by light irradiation is increased and therefore the sensitivity is improved. However, it is preferable that the terminal group does not contain a fluorine atom as a substituent.

Then, in the present invention, the compound is preferably a compound that generates an acid (more preferably a sulfonic acid) having a volume of 130 Å³ or more, more preferably a compound that generates an acid (more preferably a sulfonic acid) having a volume of 190 Å³ or more, still more preferably a compound that generates an acid (more preferably a sulfonic acid) having a volume of 270 Å³ or more, and particularly preferably a compound that generates an acid (more preferably a sulfonic acid) having a volume of 400 Å³ or more, from the viewpoint of suppressing diffusion of the exposed acid to the unexposed area and improving resolution or a patterned shape. From the viewpoint of sensitivity and solubility in coating solvent, the volume is preferably 2,000 Å³ or less and more preferably 1,500 Å³ or less. The volume value was obtained by using a molecular orbital calculation software "WinMOPAC" (manufactured by Fujitsu Limited).

The acid generators which are particularly preferable in the present invention are shown below. In addition, the calculated volume values are given to some of the examples (unit: Å³). The calculated value obtained here is a volume value of an acid in which a proton is bonded to the anionic portion.

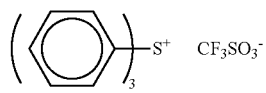

(z1)

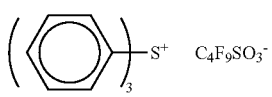

(z2)

113 Å³

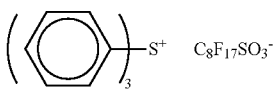

(z3)

220 Å³

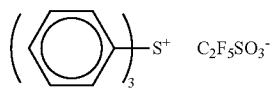

(z4)

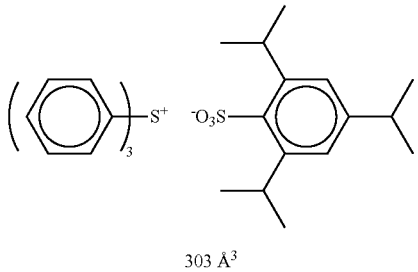

(z5)

303 Å³

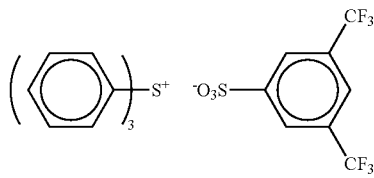

(z6)

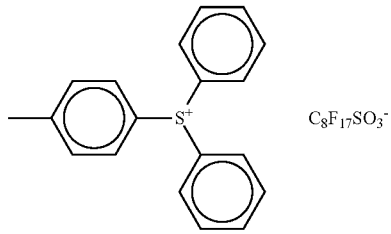

(z7)

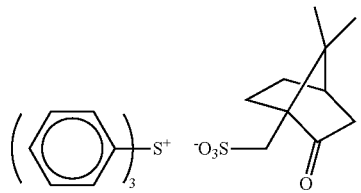

(z8)

216 Å³

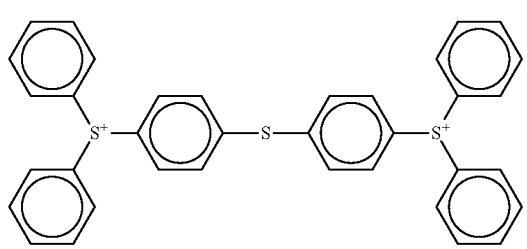

(z-9)

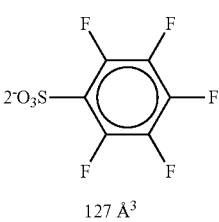

127 Å³

-continued
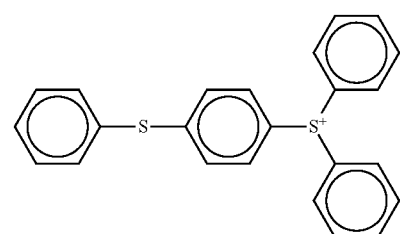
(z-10)
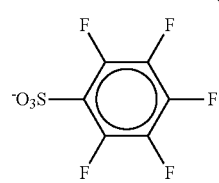
127 Å³
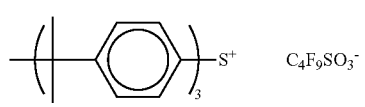
(z-11) C₄F₉SO₃⁻
113 Å³
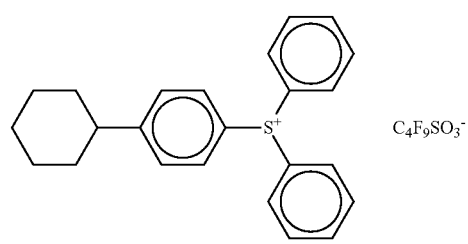
(z-12) C₄F₉SO₃⁻
113 Å³
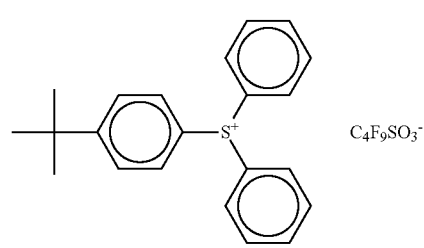
(z-13) C₄F₉SO₃⁻
113 Å³
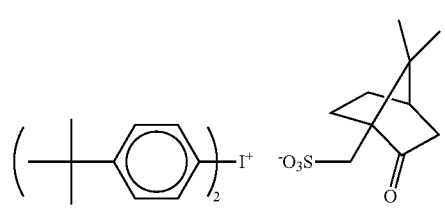
(z-14)
216 Å³
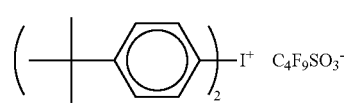
(z-15) C₄F₉SO₃⁻
113 Å³
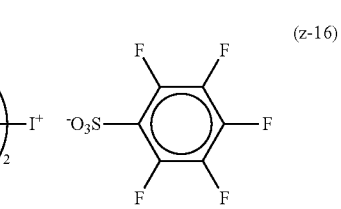
(z-16)
127 Å³
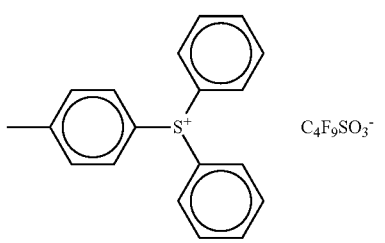
(z-17) C₄F₉SO₃⁻
113 Å³
(z-18)
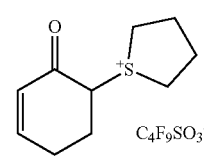
C₄F₉SO₃⁻
113 Å³
(z-19)
C₄F₉SO₃⁻
113 Å³
(z-20)
C₄F₉SO₃⁻
113 Å³
(z21)
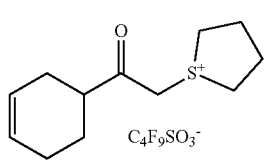
C₄F₉SO₃⁻
113 Å³
(z22)
C₄F₉SO₃⁻
113 Å³

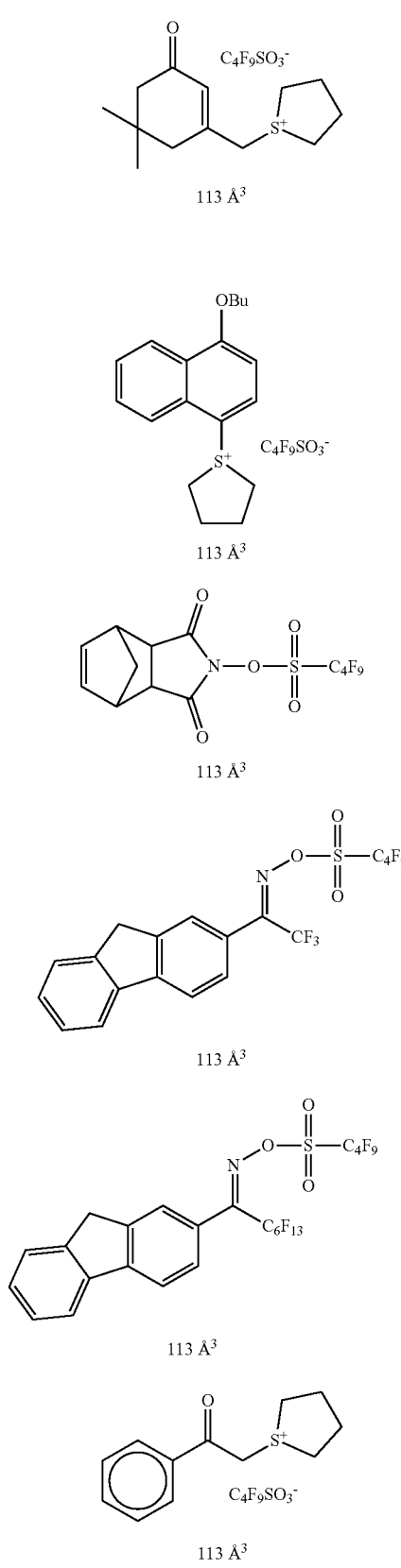

-continued (z35) 113 Å³

(z36) 393 Å³

(z37) 136 Å³

(z38) 136 Å³

(z40) 173 Å³

(z42) 244 Å³

-continued (z43) 113 Å³

(z44) 347 Å³

(z45) 189 Å³

(z46) 136 Å³

(z47) 113 Å³

(z48)
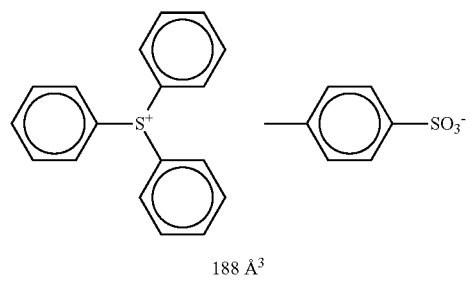
188 Å³
(z49)
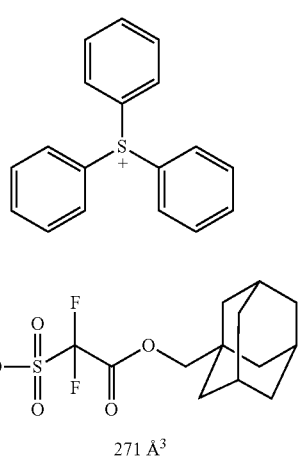
271 Å³
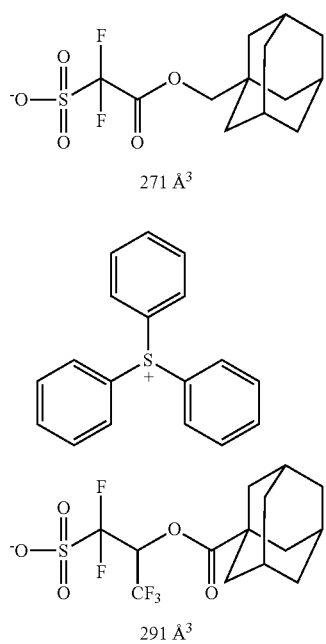
291 Å³
(z50)
(z51)
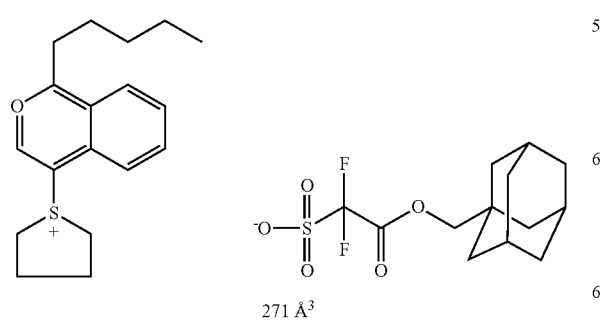
271 Å³
(z52)
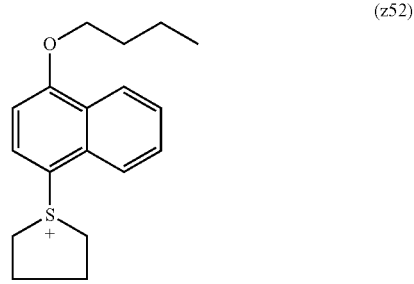
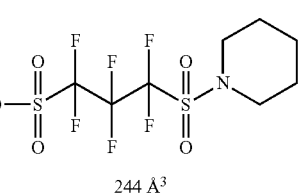
244 Å³
(z)53
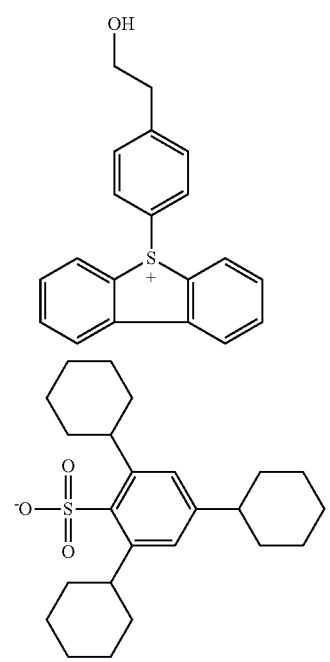
437 Å³
(z54)
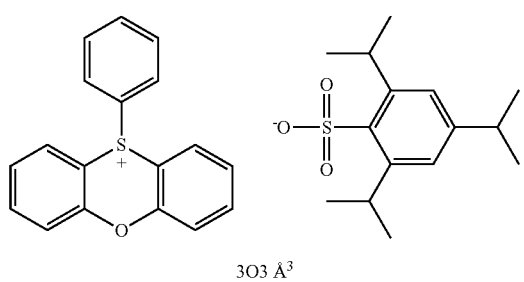
303 Å³

(z55)
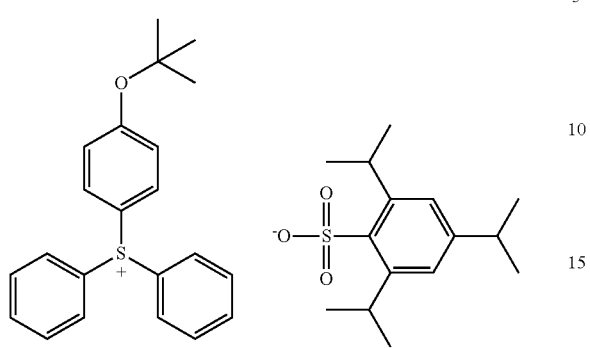
303 Å³
(z56)
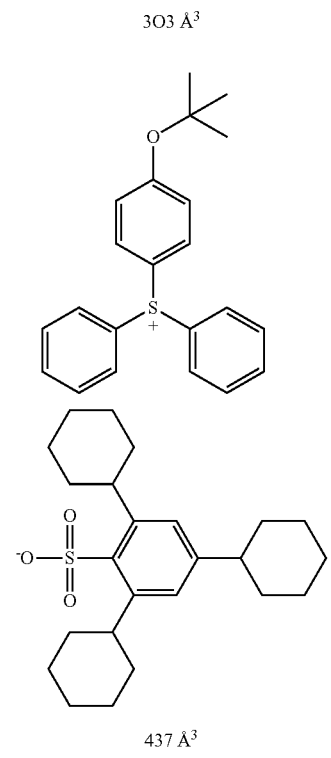
437 Å³
(z57)
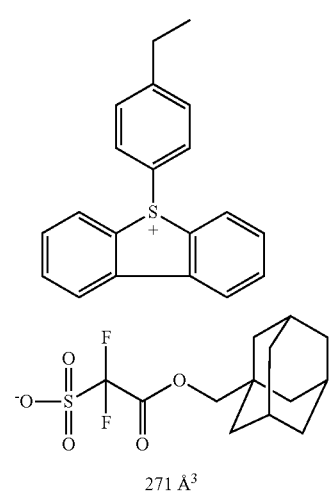
271 Å³
(z58)
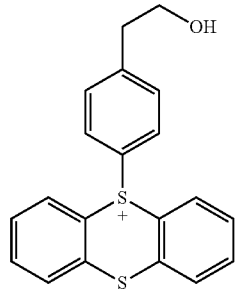
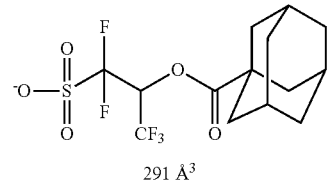
291 Å³
(z59)
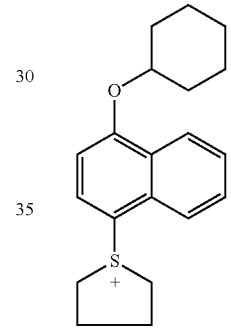
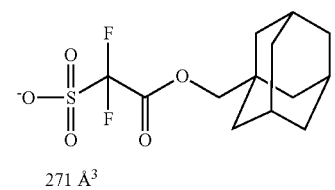
271 Å³
(z60)
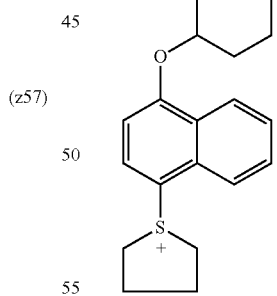
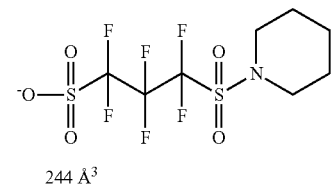
244 Å³
(z61)
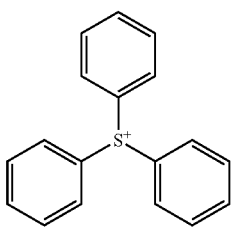

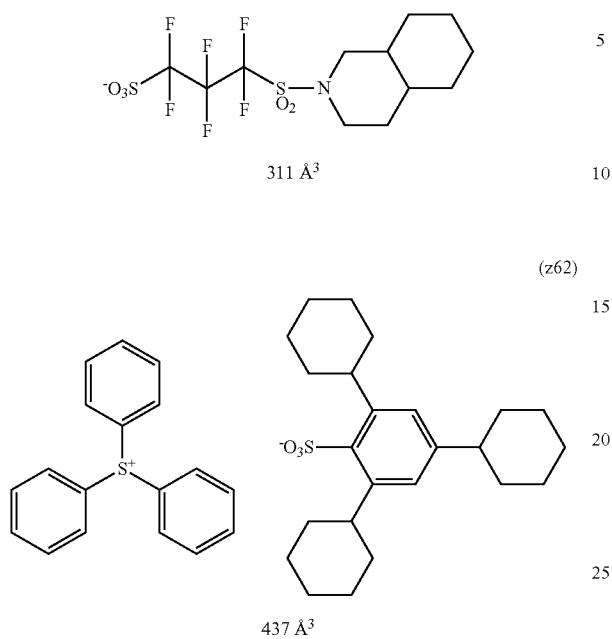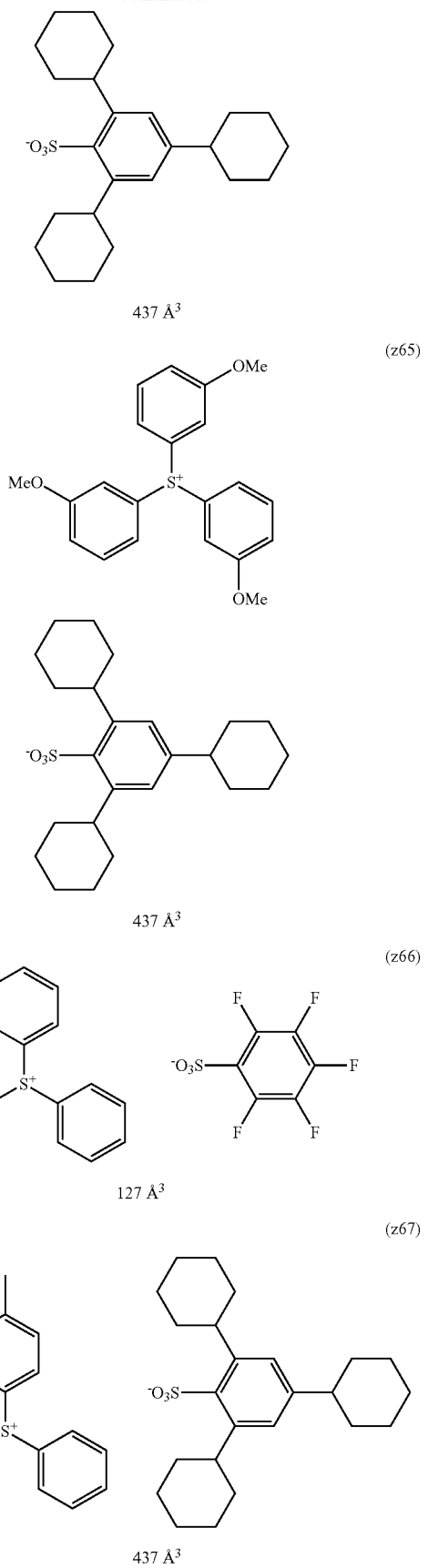

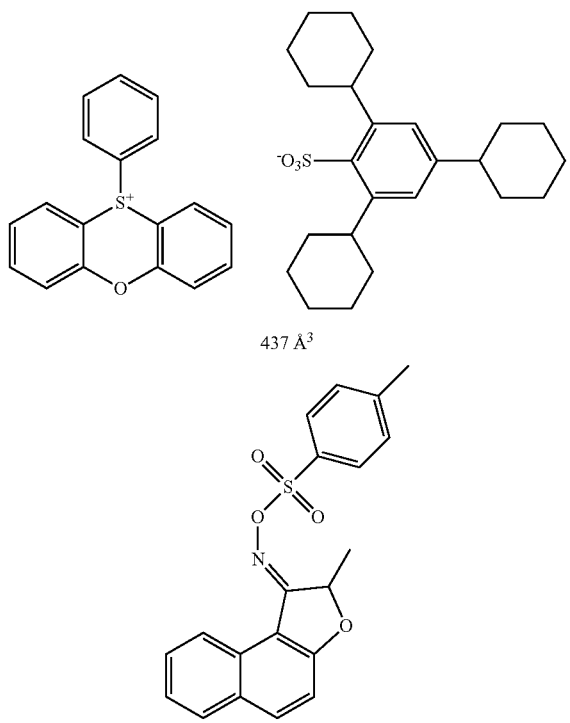

437 Å³

In addition, as the acid generator (preferably, an onium compound) used in the present invention, a polymer type acid generator obtained by introducing a group (photoacid generating group) that generates an acid upon irradiation with actinic rays or radiation into a main chain or side chain of a polymer compound can also be used.

The content of the acid generator in the composition is preferably 0.1% to 25% by mass, more preferably 0.5% to 20% by mass, and still more preferably 1% to 18% by mass based on the total solid content in the composition. The acid generators may be used alone or in combination of two or more thereof. In a case where two or more types of acid generators are used in combination, the total amount thereof is preferably within the above range.

In the present invention, it is also preferable to use two or more photopolymerization initiators in combination. For example, it is also preferable to use a photopolymerization initiator having a light absorption coefficient at 365 nm in methanol of $1.0 \times 10^3$ mL/gcm or more, and a photopolymerization initiator having a light absorption coefficient at 365 nm in methanol of $1.0 \times 10^2$ mL/gcm or less and a light absorption coefficient at 254 nm of $1.0 \times 10^3$ mL/gcm or more in combination. A specific example of such combined use is a combination of an aminoacetophenone compound and an oxime compound. According to this aspect, a film having excellent curability can be manufactured even under low temperature conditions. For example, in a pattern forming step, by exposing the composition in two steps before and after a developing step, the composition can be suitably cured with the initial exposure, and approximately the entirety of the composition can be cured by the next exposure. Therefore, the curability of the composition can be improved even under low temperature conditions.

The content of the photopolymerization initiator is preferably 0.01% to 50% by mass, more preferably 0.1% to 20% by mass, and still more preferably 0.5% to 10% by mass with respect to the total solid content of the composition. Within this range, better sensitivity and pattern formability can be obtained. The composition may contain only one type of photopolymerization initiator and may contain two or more types of photopolymerization initiators. In a case where two or more types of photopolymerization initiators are contained, the total amount thereof is preferably within the above range.

<<Solvent>>

The composition used for manufacturing the thermal conductive layer according to the embodiment of the present invention preferably contains a solvent. Any known solvent can be used as the solvent. The solvent is preferably an organic solvent. Examples of the organic solvent include compounds such as alcohols, esters, ethers, ketones, aromatic hydrocarbons, sulfoxides, and amides.

Suitable examples of esters include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate.

Suitable examples of ethers include methoxymethoxyethanol, diethylene glycol dimethyl ether, tetrahydrofuran, ethylene glycol monomethyl ether, ethylene glycol monomethyl ether acetate, ethylene glycol monoethyl ether, ethylene glycol monoethyl ether acetate, ethylene glycol dimethyl ether, methyl cellosolve acetate, ethyl cellosolve acetate, diethylene glycol monomethyl ether, diethylene glycol monoethyl ether, diethylene glycol monobutyl ether, diethylene glycol dimethyl ether, diethylene glycol diethyl ether, propylene glycol monomethyl ether, propylene glycol monoethyl ether, propylene glycol monomethyl ether acetate, propylene glycol monoethyl ether acetate, and propylene glycol monopropyl ether acetate.

Suitable examples of ketones include acetone, acetylacetone, methyl ethyl ketone, diacetone alcohol, cyclohexanone, cyclopentanone, 2-heptanone, and 3-heptanone.

Suitable examples of aromatic hydrocarbons include toluene, xylene, anisole, and limonene.

Suitable examples of sulfoxides include dimethyl sulfoxide.

Suitable examples of amides include N-methyl-2-pyrrolidone, N-ethyl-2-pyrrolidone, N,N-dimethylacetamide, and N,N-dimethylformamide.

Another suitable organic solvent may be, for example, ethylene dichloride.

From the viewpoint of improving properties of a coated surface or the like, it is also preferable to mix two or more types of solvents. Above all, the solvent is preferably a mixed solution composed of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate. The combined use of dimethyl sulfoxide and γ-butyrolactone is particularly preferable.

The content of the solvent is preferably such that the concentration of solid contents of the composition is 25% to 80% by mass. That is, the content of the solvent is preferably 20% to 75% by mass with respect to all the components of the composition. The upper limit of the content of the solvent is more preferably 70% by mass or less and particularly preferably 60% by mass or less. The lower limit of the content of the solvent is more preferably 25% by mass or more and particularly preferably 30% by mass or more. In a case where the concentration of solid contents of the composition is within the above range, coating properties and coating unevenness of the composition can be improved. The composition may contain only one type of solvent or may contain two or more types of solvents. In a case where two or more types of solvents are contained, the total amount thereof is preferably within the above range.

In the present invention, it is preferable to use a solvent having a low metal content as the solvent. The metal content in the solvent is preferably, for example, 10 ppb or less. If necessary, a solvent having a metal content at a ppt level may be used, and such a high-purity solvent is available from, for example, Toyo Gosei Co., Ltd. (The Chemical Daily (Kagaku Kogyo Nippo), Nov. 13, 2015).

Examples of a method for removing impurities such as metals from a solvent include distillation (molecular distillation, thin film distillation, or the like), and filtration using a filter. The filter pore diameter of the filter used for filtration is preferably 10 nm or less, more preferably 5 nm or less, still more preferably 3 nm or less. A filter made of polytetrafluoroethylene, polyethylene, or nylon is preferable as the filter.

The solvent may contain isomers (compounds having the same number of atoms and different structures). In addition, the solvent may contain only one type of isomer or may contain plural types of isomers.

<<Adhesive Agent>>

The composition used for manufacturing the thermal conductive layer according to the embodiment of the present invention can contain an adhesive agent, and the adhesive agent is, for example, a silane coupling agent. According to this aspect, it is possible to improve the adhesiveness between the base material such as a wafer or the underlying base such as metal wiring and the film. In the present invention, the silane coupling agent means a silane compound having a hydrolyzable group and a functional group other than the hydrolyzable group. In addition, the hydrolyzable group refers to a substituent which can be directly linked to a silicon atom to generate a siloxane bond by a hydrolysis reaction and/or a condensation reaction. Examples of the hydrolyzable group include a halogen atom, an alkoxy group, and an acyloxy group, among which an alkoxy group is preferable. That is, the silane coupling agent is preferably a compound having an alkoxysilyl group. In addition, the functional group other than the hydrolyzable group is preferably a group which interacts with or forms a bond with a resin, and thus, exhibits affinity. Examples of the functional group include a (meth)acryloyl group, a phenyl group, a mercapto group, an epoxy group, and an oxetanyl group, among which a (meth)acryloyl group and an epoxy group are preferable. That is, the silane coupling agent is preferably a compound having an alkoxysilyl group and a (meth)acryloyl group and/or an epoxy group, and more preferably a compound having an alkoxysilyl group and a (meth)acryloyl group.

Examples of the silane coupling agent include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, phenyltrimethoxysilane, methyltrimethoxysilane, dimethyldimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, hexamethyldisilazane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminomethylethyl)-3-aminopropylmethyldimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, a hydrochloride of N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatopropyltriethoxysilane.

For example, an alkoxy oligomer can be used as the adhesive agent. In addition, a compound having the following structure can also be used as the adhesive agent.

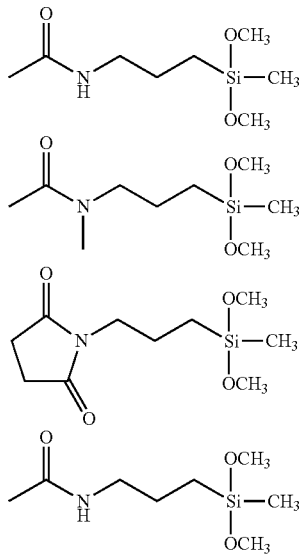

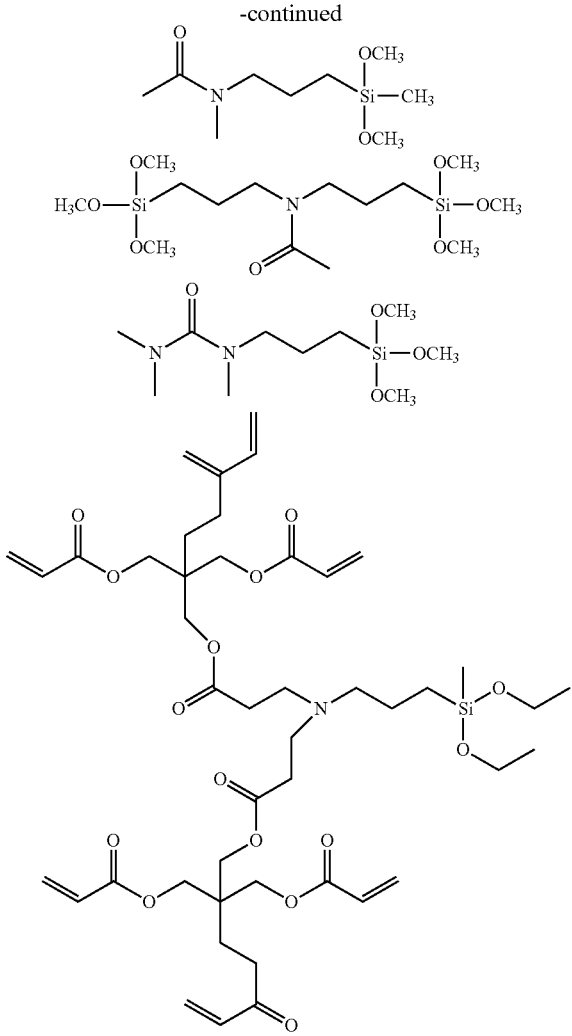

Examples of a commercially available product of the adhesive agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238, manufactured by Shin-Etsu Silicone Co., Ltd. In addition, examples of the adhesive agent include the compounds described in paragraphs [0018] to [0036] of JP2009-288703A, the contents of which are incorporated herein by reference, and the compounds described in paragraphs [0056] to [0066] of JP2009-242604A, the contents of which are incorporated herein by reference.

The content of the adhesive agent is preferably 0.001% to 10.0% by mass and more preferably 0.01% to 5.0% by mass with respect to the total solid content of the composition. The adhesive agents may be used alone or in combination of two or more thereof. In a case where two or more types of adhesive agents are contained, the total amount thereof is preferably within the above range.

<<Co-Sensitizer>>

It is also preferable that the composition used for manufacturing the thermal conductive layer according to the embodiment of the present invention further contains a co-sensitizer. The co-sensitizer has functions of further improving the sensitivity of a photopolymerization initiator or a sensitizer to actinic radiation, suppressing the inhibition of polymerization of a polymerizable monomer due to oxygen, and the like. With regard to the co-sensitizer, for example, reference can be made to the description in paragraphs [0254] to [0257] of JP2010-106268A (<0277> to <0279> of corresponding US2011/0124824A), the contents of which are incorporated herein by reference.

The content of the co-sensitizer is preferably 0.01% to 30% by mass, more preferably 0.1% to 15% by mass, and still more preferably 0.5% to 10% by mass with respect to the total solid content of the composition, from the viewpoint of increasing the polymerization growth rate and the curing rate. The co-sensitizers may be used alone or in combination of two or more thereof. In a case where two or more types of co-sensitizers are used in combination, the total amount thereof is preferably within the above range.

<<Polymerization Inhibitor>>

The composition used for manufacturing the thermal conductive layer according to the embodiment of the present invention preferably contains a polymerization inhibitor in order to inhibit unnecessary polymerization of a compound having a polymerizable ethylenically unsaturated double bond (for example, a polymerizable monomer) during the production or storage of the composition.

Examples of the polymerization inhibitor include the following compounds:

compounds containing a phenol-based hydroxyl group (preferably a compound selected from the group consisting of hydroquinone, 4-methoxyphenol, di-t-butyl-p-cresol, pyrogallol, t-butyl catechol, benzoquinone, 4,4-thiobis(3-methyl-6-t-butylphenol), 2,2'-methylenebis(4-methyl-6-t-butylphenol), 2,6-di-t-butyl-4-methylphenol (BHT), phenolic resins, and cresol resins);

N-oxide compounds (preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide);

piperidine 1-oxyl free radical compounds (preferably a compound selected from the group consisting of a piperidine 1-oxyl free radical, a 2,2,6,6-tetramethylpiperidine 1-oxyl free radical, a 4-oxo-2,2,6,6-tetramethylpiperidine 1-oxyl free radical, a 4-hydroxy-2,2,6,6-tetramethylpiperidine-1-oxyl free radical, a 4-acetamido-2,2,6,6-tetramethylpiperidine 1-oxyl free radical, a 4-maleimido-2,2,6,6-tetramethylpiperidine 1-oxyl free radical, and a 4-phosphonoxy-2,2,6,6-tetramethylpiperidine 1-oxyl free radical);

pyrrolidine 1-oxyl free radical compounds (preferably a 3-carboxyproxyl free radical (3-carboxy-2,2,5,5-tetramethylpyrrolidine 1-oxyl free radical));

N-nitrosophenylhydroxylamines (preferably a compound selected from the group consisting of an N-nitrosophenylhydroxylamine cerous salt and an N-nitrosophenylhydroxylamine aluminum salt);

diazonium compounds (preferably a compound selected from the group consisting of hydrogen sulfate of 4-diazophenyldimethylamine, tetrafluoroborate of 4-diazodiphenylamine, and hexafluorophosphate of 3-methoxy-4-diazodiphenylamine);

cationic dyes;

sulfide group-containing compounds;

nitro group-containing compounds; and transition metal compounds such as $FeCl_3$ and $CuCl_2$.

Specific examples of the polymerization inhibitor include the compounds described in paragraphs [0211] to [0223] of JP2015-034961A, the contents of which are incorporated herein by reference.

The content of the polymerization inhibitor is preferably 0.01% by mass to 10% by mass, more preferably 0.01% by mass to 8% by mass, and most preferably 0.01% by mass to 5% by mass with respect to the photopolymerization initiator. By setting the content of the polymerization inhibitor to the above range, suppression of a curing reaction in an unexposed area and acceleration of a curing reaction in an exposed area are sufficiently carried out, and therefore the image formability and the sensitivity are improved. The polymerization inhibitors may be used alone or in combination of two or more thereof. In a case where two or more types of polymerization inhibitors are used in combination, the total amount thereof is preferably within the above range.

<<Surfactant>>

The composition used for manufacturing the thermal conductive layer according to the embodiment of the present invention may contain various surfactants from the viewpoint of further improving coating properties. Various surfactants such as a fluorine-based surfactant, a non-ionic surfactant, a cationic surfactant, an anionic surfactant, and a silicone-based surfactant can be used as the surfactant.

In particular, in a case where the composition contains a fluorine-based surfactant, liquid characteristics (in particular, fluidity) in a case of preparation of a coating liquid using the composition are further improved. Therefore, coating thickness uniformity or liquid saving properties can be further improved.

That is, in a case where a film is formed using a coating liquid to which a composition containing a fluorine-based surfactant has been applied, the interface tension between a surface to be coated and the coating liquid is reduced to improve wettability with respect to the surface to be coated, and enhance coating properties with respect to the surface to be coated. As a result, even in a case where a thin film having a thickness in several micrometers is formed with a small amount of the liquid, a film with a uniform thickness which exhibits a small extent of thickness unevenness can be more suitably formed, which is thus effective.

The fluorine content in the fluorine-based surfactant is preferably 3% to 40% by mass. The lower limit of the fluorine content is preferably 5% by mass or more and more preferably 7% by mass or more. The upper limit of the fluorine content is preferably 30% by mass or less and more preferably 25% by mass or less. The fluorine content which falls within the above-mentioned range is effective in terms of uniformity of the coating film thickness and liquid saving properties, and also leads to satisfactory solubility.

Examples of the fluorine-based surfactant that can be used include the surfactants described in paragraphs [0060] to [0064] of JP2014-041318A (paragraphs 0060 to 0064 of corresponding WO2014/017669A), the contents of which are incorporated herein by reference, and the surfactants described in paragraphs [0117] to [0132] of JP2011-132503A, the contents of which are incorporated herein by reference. Examples of a commercially available product of the fluorine-based surfactant include MEGAFAC F-171, MEGAFAC F-172, MEGAFAC F-173, MEGAFAC F-176, MEGAFAC F-177, MEGAFAC F-141, MEGAFAC F-142, MEGAFAC F-143, MEGAFAC F-144, MEGAFAC R30, MEGAFAC F-437, MEGAFAC F-444, MEGAFAC F-475, MEGAFAC F-479, MEGAFAC F-482, MEGAFAC F-554, and MEGAFAC F-780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by Asahi Glass Co., Ltd.), and PolyFox PF636, PF656, PF6320, PF6520, and PF7002 (manufactured by OMNOVA Solutions Inc.). The compounds described in paragraphs [0015] to [0158] of JP2015-117327A can also be used as the fluorine-based surfactant. In addition, a mixture of compounds having the following structures can also be used as the fluorine-based surfactant. Here, $L_1$, $L_2$, $M_1$, $M_2$, $N_1$, and $N_2$ written together with each repeating unit represent the ratio (molar ratio) of the repeating unit. In addition, "/" attached to the numerical value indicates the mixing ratio (% by mass) of each of the left and right groups.

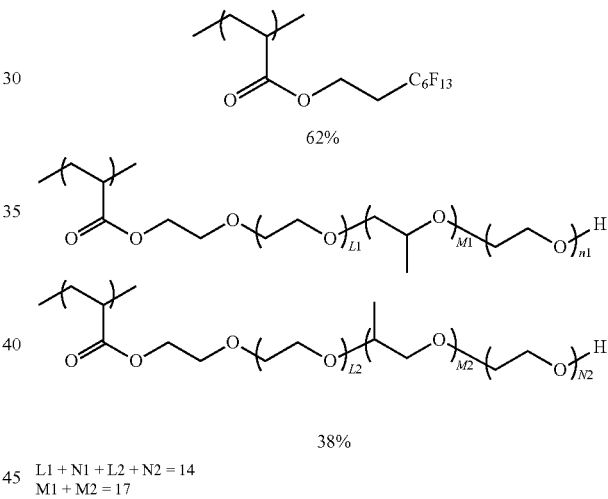

$L1 + N1 + L2 + N2 = 14$
$M1 + M2 = 17$

The weight-average molecular weight of the above compounds is preferably 3,000 to 50,000 and is, for example, 14,000.

In addition, a fluorine-containing polymer having a group having an ethylenically unsaturated bond in a side chain thereof can also be used as the fluorine-based surfactant. Examples of such a fluorine-based surfactant that can be used include the compounds described in paragraphs [0050] to [0090] and paragraphs [0289] to [0295] of JP2010-164965A, such as MEGAFAC RS-101, RS-102, and RS-718K (all manufactured by DIC Corporation) which are commercially available.

Examples of the non-ionic surfactant that can be used include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid ester (PLURONIC L10, L31, L61, L62, 10R5, 17R2, and 25R2, and TETRONIC 304, 701, 704, 901, 904, and 150R1 manufactured by BASF SE), and PIONIN D-6512, D-6414, D-6112, D-6115, D-6120, D-6131, D-6108-W, D-6112-W, D-6115-W, D-6115-X, and D-6120-X (manufactured by Takemoto Oil & Fat Co., Ltd.).

Examples of the cationic surfactant that can be used include an organosiloxane polymer KP341 (manufactured by Shin-Etsu Chemical Co., Ltd.), (meth)acrylic acid-based (co)polymers POLYFLOW No. 75, No. 90, and No. 95 (manufactured by Kyoeisha Chemical Co., Ltd.), and W001 (manufactured by Yusho Co., Ltd.).

Examples of the anionic surfactant that can be used include W004, W005, and W017 (manufactured by Yusho Co., Ltd.).

Examples of the silicone-based surfactant that can be used include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and "BYK307", "BYK323", and "BYK330" (all manufactured by BYK-Chemie GmbH).

The content of the surfactant is preferably 0.001% by mass to 2.0% by mass and more preferably 0.005% by mass to 1.0% by mass with respect to the total solid content of the composition. The surfactants may be used alone or in combination of two or more thereof.

In a case where two or more types of surfactants are used in combination, the total amount thereof is preferably within the above range.

<<Ultraviolet Absorber>>

The composition used for manufacturing the thermal conductive layer according to the embodiment of the present invention may contain an ultraviolet absorber. The ultraviolet absorber is preferably a conjugated diene-based compound and more preferably a compound represented by Formula (I).

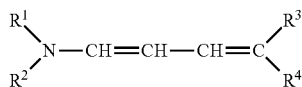

(I)

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, provided that both of $R^1$ and $R^2$ do not represent a hydrogen atom at the same time.

$R^1$ and $R^2$ may form a cyclic amino group together with a nitrogen atom to which $R^1$ and $R^2$ are bonded. The cyclic amino group is, for example, a piperidino group, a morpholino group, a pyrrolidino group, a hexahydroazepino group, or a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each independently represent an electron withdrawing group. Here, the electron withdrawing group is an electron withdrawing group having a Hammett's substituent constant σp value (hereinafter, simply referred to as "σp value") of 0.20 or more and 1.0 or less. Preferred is an electron withdrawing group having a σp value of 0.30 or more and 0.8 or less. $R^3$ and $R^4$ may be bonded to each other to form a ring. $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

At least one of $R^1$, $R^2$, $R^3$, or $R^4$ may be in the form of a polymer derived from a monomer which is bonded to a vinyl group through a linking group. At least one of $R^1$, $R^2$, $R_3$, or $R_4$ may be a copolymer with another monomer.

The ultraviolet absorber represented by Formula (I) is, for example, a compound having the following structure. With regard to the description of the substituent of the ultraviolet absorber represented by Formula (I), reference can be made to the description in paragraphs [0024] to [0033] of WO2009/123109A (<0040> to <0059> of corresponding US2011/0039195A), the contents of which are incorporated herein by reference. With regard top referred specific examples of the compound represented by Formula (I), reference can be made to the exemplary compounds (1) to (14) in paragraphs [0034] to [0037] of WO2009/123109A (<0060> of corresponding US2011/0039195A), the contents of which are incorporated herein by reference.

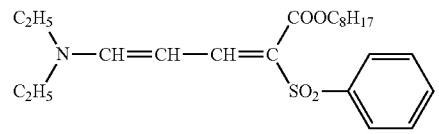

The content of the ultraviolet absorber is preferably 0.1% to 10% by mass, more preferably 0.1% to 5% by mass, and particularly preferably 0.1% to 3% by mass with respect to the total solid content of the composition. In addition, in the present invention, the ultraviolet absorber may be only one type or may be two or more types. In a case where two or more types of ultraviolet absorbers are used in combination, the total amount thereof is preferably within the above range.

<<Migration Inhibitor>>

The composition according to the embodiment of the present invention preferably further includes a migration inhibitor. Incorporation of the migration inhibitor makes it possible to effectively inhibit the movement of metal ions derived from a metal layer (metal wiring) into a film.

The migration inhibitor is not particularly limited, and examples thereof include compounds having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, or a triazine ring), thioureas and compounds having a mercapto group, hindered phenol-based compounds, salicylic acid derivative-based compounds, and hydrazide derivative-based compounds. In particular, triazole-based compounds such as 1,2,4-triazole and benzotriazole, and tetrazole-based compounds such as 1H-tetrazole and 5-phenyltetrazole can be preferably used.

Other examples of the migration inhibitor that can be used include the rust inhibitors described in paragraph [0094] of JP2013-015701A, the compounds described in paragraphs [0073] to [0076] of JP2009-283711A, the compounds described in paragraph [0052] of JP2011-059656A, and the compounds described in paragraphs [0114], [0116] and [0118] of JP2012-194520A.

<<Curing Accelerator>>

The composition according to the embodiment of the present invention may include a curing accelerator. The curing accelerator may be a thermal curing accelerator or a photo-curing accelerator. In a case where the composition contains a polyimide precursor, the curing accelerator is preferably a thermal curing accelerator. The thermal curing accelerator is preferably a compound that generates a base upon heating. Such a thermal curing accelerator is preferably, for example, the following compound.

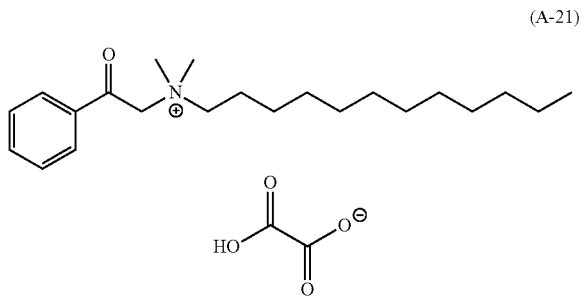

(A-21)

The molecular weight of the thermal curing accelerator is preferably 100 or more and less than 2,000, and more preferably 200 to 1,000.

Specific examples of the thermal curing accelerator include an acidic compound that generates a base upon heating to 40° C. or higher and an ammonium salt having an anion having a pKa1 of 0 to 4 and an ammonium cation, described in WO2015/199219A, the contents of which are incorporated herein by reference.

In a case where the thermal curing accelerator is used, the content of the thermal curing accelerator in the composition is preferably 0.01% to 50% by mass with respect to the total solid content of the composition. The lower limit of the content of the thermal curing accelerator is more preferably 0.05% by mass or more and still more preferably 0.1% by mass or more. The upper limit of the content of the thermal curing accelerator is more preferably 10% by mass or less and still more preferably 5% by mass or less.

The thermal curing accelerators may be used alone or in combination of two or more thereof. In a case where two or more types of thermal curing accelerators are contained, the total amount thereof is preferably within the above range. In addition, the composition according to the embodiment of the present invention may be configured to be substantially free of a thermal curing accelerator. The phrase "substantially free of" means that the content of the thermal curing accelerator is less than 0.01% by mass and more preferably less than 0.005% by mass with respect to the total solid content of the composition.

<<Other Additives>>

Further, the composition may contain known additives such as a plasticizer and an oil sensitizer in order to improve the physical properties of a cured film. Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerin. The content of the plasticizer is preferably 10% by mass or less with respect to the total mass of the polymerizable monomer and the resin. As a commercially available product of the plasticizer, for example, 0-180A (manufactured by ADEKA Corporation) can be used.

<Photosensitive Material>

The thermal conductive layer according to the embodiment of the present invention is preferably formed of a photosensitive layer containing a filler and a photosensitive material.

In the present invention, regarding the photosensitive layer, a volume reduction rate at the time of forming the thermal conductive layer is preferably 5% or more, more preferably 10% or more, still more preferably 15 or more, and even still more preferably 30% or more.

The effect of promoting thermal conduction is further exhibited by setting the volume reduction rate to 5% or more. It is considered that such an effect is due to the fact that, in a case where the volume of the photosensitive material is reduced during the formation of the thermal conductive layer, the spacing between the fillers is reduced and then the number of contact points is increased. The photosensitive material consists of a photosensitizer (for example, a photoradical polymerization initiator) and a material (for example, a photoradical polymerizable monomer) that is cured by the action of the photosensitizer. In addition, the "volume reduction rate at the time of forming the thermal conductive layer" means a reduction rate of the volume after curing with respect to the volume after carrying out coating and drying in a thermal conductive layer forming process of coating, drying, and curing. The curing here means curing carried out in the thermal conductive layer forming process, and preferably includes at least one of thermal curing or photocuring. The composition having a large volume reduction rate is, for example, a photosensitive composition including polyimide or the like.

In a case where the composition according to the embodiment of the present invention includes the above-mentioned photosensitive material as a resin, the composition becomes the photosensitive composition according to the embodiment of the present invention.

<Method for Preparing Composition>

The above-mentioned composition can be prepared by mixing the above-mentioned components.

Upon preparation of the composition, the respective components may be formulated with each other collectively or may be formulated with each other sequentially after being dissolved and/or dispersed in a solvent. In addition, there is no particular restriction on the order of addition or working conditions during formulation.

In addition, examples of a process for dispersing a filler include processes using compression, pressing, impact, shearing, cavitation, and the like as a mechanical force used to disperse the filler. Specific examples of these processes include a beads mill, a sand mill, a roll mill, a high speed impeller, a sand grinder, a flow jet mixer, high pressure wet atomization, and ultrasonic dispersion. In addition, the process and dispersing machine described in "Dispersion Technology Comprehension", issued by Johokiko Co., Ltd., Jul. 15, 2005; and "Actual comprehensive data collection on dispersion technology and industrial application centered on suspension (solid/liquid dispersion system), issued by Publication Department, Management Development Center, Oct. 10, 1978" can be suitably used.

The composition can be stirred using, for example, a stirrer (stir bar) or a stirring blade. The rotation speed is preferably, for example, 10 to 2,000 rpm. The lower limit of the rotation speed is preferably 100 rpm or more and more preferably 300 rpm or more. The upper limit of the rotation speed is preferably 1,500 rpm or less and more preferably 1,000 rpm or less. In addition, the stirring can also be carried out by a method such as bubbling or ultrasonic waves.

A conventionally known storage container can be used as a storage container for the composition according to the embodiment of the present invention. In addition, as the storage container, it is also preferable to use a multi-layer bottle in which an inner wall of the container is made of 6 types of 6 layers of resin, or a bottle made of 6 types of resin in 7 layers structure, for the purpose of suppressing the incorporation of impurities into the raw materials and the compositions. Such a container may be, for example, the container described in JP2015-123351A.

It is preferable that, in the preparation of the composition, filtration is carried out using a filter for the purpose of removing foreign matters, reducing defects, or the like. With regard to the filter, any filter can be used without particular limitation as long as it has been conventionally used for filtration applications or the like in the related art. Examples of the filter include filters formed of, for example, a fluorine resin such as polytetrafluoroethylene (PTFE), a polyamide-based resin such as nylon (for example, Nylon-6 or Nylon-6,6), and a polyolefin resin (including a polyolefin resin having a high density or an ultrahigh molecular weight) such as polyethylene or polypropylene (PP). Among those materials, polypropylene (including a high-density polypropylene) and nylon are preferable.

The pore diameter of the filter is suitably about 0.01 to 100 µm, preferably about 0.1 to 50 µm, and more preferably about 1 to 30 µm. By setting the pore diameter of the filter to the above range, fine foreign matters which inhibit the preparation of a uniform composition in the subsequent step can be reliably removed. In addition, a fibrous filter material is also preferably used, and examples of the filter material include a polypropylene fiber, a nylon fiber, and a glass fiber. For example, filter cartridges of SBP type series (such as SBP008), TPR type series (such as TPR002 and TPR005), and SHPX type series (such as SHPX003) manufactured by Roki Techno Co., Ltd. can be used as fibrous filter material.

In a case of using the filter, different filters may be combined. Here, the filtration through a first filter may be carried out only once or may be carried out twice or more times. For example, the filtration through the first filter may be carried out with only a dispersion liquid, the other components may be mixed therewith, and then the filtration through a second filter may be carried out.

In addition, the first filters having different pore diameters within the above-mentioned range may be combined. With regard to the pore diameter of the filter herein, reference can be made to nominal values of filter manufacturers. A commercially available filter may be selected from various filters provided by Nihon Pall Corporation (DFA4201NXEY and the like), Advantec Toyo Roshi Kaisha., Ltd., Nihon Entegris K. K. (formerly Nippon Microlith Co., Ltd.), Kitz Micro Filter Corporation, or the like, for example.

As the second filter, those formed of the same material or the like as that of the above-mentioned first filter may be used.

<Method for Manufacturing Film>

The thermal conductive layer according to the embodiment of the present invention is formed by exposing a film (photosensitive layer) formed by applying the composition according to the embodiment of the present invention and drying the applied composition. That is, the manufacturing method for a thermal conductive layer according to the embodiment of the present invention includes a step of applying a composition onto a base material and drying the applied composition to form a photosensitive layer, and a step of exposing the photosensitive layer. At the time of application, the composition may be gradually heated. For example, it is also preferable to carry out a first heating treatment at 30° C. to 40° C. and a second heating treatment at 40° C. to 60° C. In addition, the heating treatment may be carried out by raising the temperature continuously or stepwise.

Examples of the application method include a spin coating method, a screen printing method, a spray coating method, an ink jet method, a slit coating method, a cast coating method, a roll coating method, and a dropwise addition method (drop casting). Among them, the spin coating method, the screen printing method, and the spray coating method are preferable, and the spin coating method is more preferable. In particular, the manufacturing method for a thermal conductive layer according to the embodiment of the present invention is suitable for application using the spin coating method. In addition, for the application using the spin coating method, from the viewpoint of coating suitability, the spin coating is preferably carried out in a range of 300 to 6,000 rpm and more preferably in a range of 400 to 3,000 rpm. In addition, a substrate temperature during spin coating is preferably 10° C. to 100° C. and more preferably 20° C. to 70° C. Within the above range, the coating uniformity is excellent and it is therefore easy to manufacture a film having suppressed coating unevenness.

The base material is not particularly limited and is appropriately selected depending on the applications. Examples of the base material include alkali-free glass used for a liquid crystal display device or the like, soda glass, Pyrex (registered trademark) glass, quartz glass, a substrate obtained by attaching a transparent conductive film to such a glass, a photoelectric conversion element substrate used for a solid-state imaging element or the like, a silicon substrate, and a complementary metal oxide film semiconductor (CMOS). In addition, an undercoat layer may be provided on these base materials, as desired, for the purpose of improving adhesiveness to the upper layer, preventing diffusion of substances, or planarizing the surface.

The coating thickness of the film is not particularly limited and is appropriately adjusted depending on the applications. In a case where a composition including a filler and a photopolymerization initiator is used, the coating film thickness is preferably 0.2 to 50 µm from the viewpoint of resolution and developability. The lower limit of the coating film thickness is more preferably 0.5 µm or more and still more preferably 1.0 µm or more. The upper limit of the coating film thickness is more preferably 35 µm or less and still more preferably 20 µm or less. In addition, the dry film thickness of the film is not particularly limited and is appropriately adjusted depending on the applications. The dry film thickness of the film is preferably, for example, 0.1 to 50 µm. From the viewpoint of adhesiveness and insulation, the lower limit of the dry film thickness is more preferably 0.2 µm or more and still more preferably 0.5 µm or more. From the viewpoint of thermal resistance, the upper limit of the dry film thickness is more preferably 30 µm or less and still more preferably 15 µm or less.

In the manufacturing method for a thermal conductive layer according to the embodiment of the present invention, the composition applied onto the base material may be dried by heating. The drying conditions are not particularly limited, and examples of the drying method include a method in which drying is carried out under the conditions of 70° C. to 110° C. for about 2 to 4 minutes.

The manufacturing method for a thermal conductive layer according to the embodiment of the present invention may further include a step of forming a pattern on the photosensitive layer. In a case where the thermal conductive layer is used as a flat film, the step of forming a pattern on the photosensitive layer may not be carried out. In a case where the step of forming a pattern on the photosensitive layer is further carried out, the composition preferably includes a photopolymerization initiator and a polymerizable monomer. In addition, the resin preferably contains an alkali-soluble resin. Hereinafter, the step of forming a pattern on the photosensitive layer will be described in detail.

The step of forming a pattern preferably includes a step of patternwise exposing the photosensitive layer formed on the base material (exposing step), and a step of developing and removing an unexposed area or an exposed area to form a pattern (developing step). As a result, a thermal conductive layer having a patterned shape is formed.

In the exposing step, for example, the photosensitive layer on the base material can be subjected to patternwise exposure by carrying out exposure through a mask having a predetermined mask pattern, using an exposure device such as a stepper. Thereby, for example, the exposed area can be cured.

The radiation (light) that can be used in the exposure is preferably ultraviolet rays such as g-rays or i-rays, and particularly preferably i-rays. The irradiation dose (exposure dose) is, for example, preferably 0.03 to 2.5 $J/cm^2$, and more preferably 0.05 to 1.0 $J/cm^2$.

The oxygen concentration during the exposure can be appropriately selected, and the exposure may be carried out not only in an atmospheric air but also, for example, in a low-oxygen atmosphere having an oxygen concentration of 19% by volume or less (for example, in an atmosphere having an oxygen concentration of 15% by volume, in an atmosphere having an oxygen concentration of 5% by volume, or in an atmosphere substantially free of oxygen) or in a high-oxygen atmosphere having an oxygen concentration of more than 21% by volume (for example, in an atmosphere having an oxygen concentration of 22% by volume, in an atmosphere having an oxygen concentration of 30% by volume, or in an atmosphere having an oxygen concentration of 50% by volume). In addition, the exposure illuminance can be set appropriately and can be selected from a range of usually 1,000 $W/m^2$ to 100,000 $W/m^2$ (for example, 5,000 $W/m^2$, 15,000 $W/m^2$, or 35,000 $W/m^2$). Appropriate conditions of each of the oxygen concentration and the exposure illuminance may be combined, and for example, a combination of the oxygen concentration of 10% by volume and the illuminance of 10,000 $W/m^2$, a combination of the oxygen concentration of 35% by volume and the illuminance of 20,000 $W/m^2$, or the like is available.

Next, for example, the unexposed area is developed and removed to form a pattern. The development and removal of the unexposed area can be carried out using a developer. Thus, the composition layer of the unexposed area in the exposing step is eluted into the developer, and as a result, only a photo-cured area remains. The developer may be either an alkaline developer or an organic solvent. The temperature of the developer is preferably, for example, 20° C. to 30° C. The development time is preferably 20 to 180 seconds and more preferably 20 to 90 seconds.

The alkaline developer is, for example, an alkaline aqueous solution containing alkaline agents, such as inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; tetraalkylammonium hydroxides such as dimethylbis(2-hydroxyethyl)ammonium hydroxide, tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide; quaternary ammonium salts such as trimethylphenylammonium hydroxide, trimethylbenzylammonium hydroxide, and triethylbenzylammonium hydroxide, and cyclic amines such as pyrrole and piperidine. Further, an appropriate amount of alcohols or a surfactant may also be added to the alkaline aqueous solution before use. The concentration of the alkaline agent in the alkaline developer is preferably 0.001% to 20% by mass, more preferably 0.01% to 10% by mass, and still more preferably 0.1% to 1% by mass. The pH of the alkaline developer is preferably 10.0 to 15.0. The alkaline agent concentration and pH of the alkaline developer can be appropriately adjusted before use. The alkaline developer may be used after adding an appropriate amount of a water-soluble organic solvent such as methanol or ethanol, a surfactant, or the like.

As will be described later in the Examples, the thermal conductive layer according to the embodiment of the present invention also has excellent alkaline development resistance. Therefore, according to the thermal conductive layer according to the embodiment of the present invention, it is possible to use a solvent having a stronger alkalinity than that of the related art, which can broaden the range of material selection and contribute to shortening the development time.

On the other hand, it is also preferable to use a developer containing an organic solvent. The developer using an organic solvent preferably contains 50% by mass or more, more preferably 70% by mass or more, and still more preferably 90% by mass or more of the organic solvent. The organic solvent used in the developer can be selected from the organic solvents that may be formulated in the composition according to the embodiment of the present invention, among which cyclopentanone is particularly preferable. The organic solvent may be one type or may be two or more types. In a case where two or more types of organic solvents are contained, the total amount thereof is preferably within the above range. The developer containing an organic solvent is preferably used for the development of a polyimide precursor or a polybenzoxazole precursor.

After the development, heating and/or exposure may be further carried out. According to this aspect, the curing of the film can be further advanced to manufacture a more firmly cured film. The heating temperature (maximum heating temperature) in the heating step is preferably 50° C. to 500° C., more preferably 80° C. to 450° C., still more preferably 140° C. to 400° C., and even still more preferably 160° C. to 350° C. For example, in a case where the thermal conductive layer contains a polyimide precursor, a cyclization reaction of the polyimide precursor proceeds in the heating step.

The film thickness of the thermal conductive layer obtained by the above-mentioned manufacturing method according to the embodiment of the present invention is preferably 0.2 to 50 μm. The lower limit of the film thickness is more preferably 0.5 μm or more and still more preferably 1.0 μm or more. The upper limit of the film thickness is more preferably 40 μm or less and still more preferably 30 μm or less.

<Laminate and Semiconductor Device>

As shown in FIG. 1, a laminate 5 according to the embodiment of the present invention has a base material 1 and a thermal conductive layer 4 or photosensitive layer according to the embodiment of the present invention formed on the base material 1. The laminate may further have a heat absorbing portion which is in contact with the thermal conductive layer. The heat absorbing portion is a cooling module and is, for example, a heat radiation fin, a heat pipe, a Peltier module, or the like.

Figure 2:
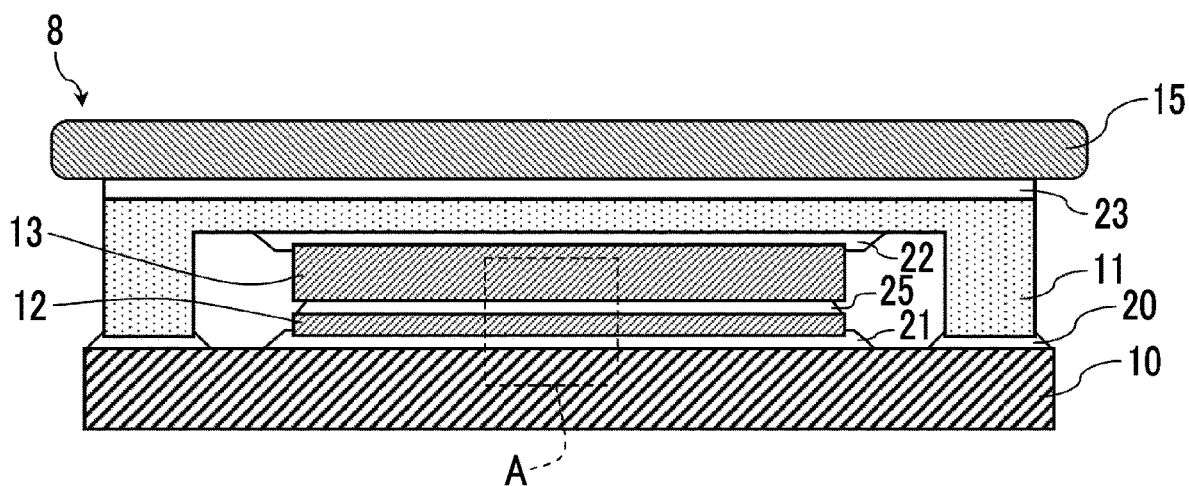
FIG. 2 is a schematic cross-sectional view showing a semiconductor module having the thermal conductive layer and the laminate according to the embodiment of the present invention.
Figure 3:
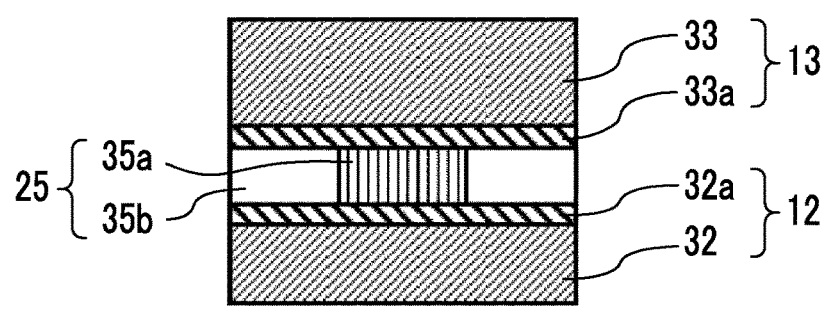
FIG. 3 is a partially enlarged view of a region A in FIG. 2.

The semiconductor device according to the embodiment of the present invention is a semiconductor device having the thermal conductive layer or laminate according to the embodiment of the present invention. The thermal conductive layer according to the embodiment of the present invention is suitably used as an insulating layer or an adhesive layer in a semiconductor module 8 as shown in FIG. 2, for example. The semiconductor module 8 of FIG. 2 has a support substrate 10, a lid 11 bonded to the support substrate 10 by an adhesive layer 20, and a cooling module 15 bonded on the lid 11 by an adhesive layer 23. Further, the semiconductor module 8 has a laminated chip in which a first semiconductor chip 12 and a second semiconductor chip 13 are bonded through an interlayer 25 in a space formed between the support substrate 10 and the lid 11, with the first semiconductor chip 12 side of the laminated chip being bonded to the support substrate 10 by an adhesive layer 21, and the second semiconductor chip 13 side of the laminated chip being bonded to a back surface of a central portion of the lid 11 by an adhesive layer 22. FIG. 3 is a partially enlarged view of a region A in FIG. 2. The first semiconductor chip 12 has an LSI chip 32 and a wiring layer 32a formed on the surface of the LSI chip 32 on the interlayer 25 side. The second semiconductor chip 13 has an LSI chip 33 and a wiring layer 33a formed on the surface of the LSI chip 33 on the interlayer 25 side. The interlayer 25 has a solder bump 35a that electrically connects the wiring layers 32a and 33a, and a resin insulating layer 35b that fills the periphery of the solder bump 35a. The first semiconductor chip 12 and the second semiconductor chip 13 are electrically connected to each other through the solder bump 35a and integrally form a laminated LSI.

The laminated LSI as described above can be manufactured, for example, as follows. (a) to (d) of FIG. 4 are conceptual diagrams showing a part of a manufacturing process of the laminated LSI as described above. First, the photosensitive composition according to the embodiment of the present invention is applied onto the surface of a semiconductor wafer (a wafer on which a semiconductor device, the first semiconductor chip 12, and the like are formed) and then the applied photosensitive composition is dried to form a photosensitive layer 35c ((a) of FIG. 4). Then, the exposing step and the developing step described above are carried out on the photosensitive layer 35c to form holes 36 having a desired cross section (or desired patterns) in the photosensitive layer 35c, and therefore a part of the wiring layer 32a (electrode) of the semiconductor chip 12 is exposed ((b) of FIG. 4). Then, the solder bump 35a is supplied on the exposed wiring layer 32a to thereby obtain the interlayer 25 having the solder bump 35a and the resin insulating layer 35b filling the periphery thereof ((c) of FIG. 4). Further, the wiring layer 33a (electrode) of the second semiconductor chip 13 is heated while being temporarily bonded to the interlayer 25, whereby the wiring layer 33a and the solder bump 35a can be electrically connected ((d) of FIG. 4). At the time of the heating, since the interlayer 25 includes the resin insulating layer 35b which is the thermal conductive layer according to the embodiment of the present invention, heat can be efficiently transmitted to the solder bump and solder connection can be carried out while maintaining excellent insulation.

In the method for manufacturing a semiconductor device as described above, an electrically conductive paste may be used instead of the solder bump. The electrically conductive paste is a bonding material in which, for example, a resin responsible for fixing and a metal responsible for electrical conductivity (electrically conductive filler) are mixed, and has both a property of conducting electricity and a property of fixing substances together. Generally, an epoxy resin and a silver (Ag) filler are often combined. The bonding surfaces are bonded together using the electrically conductive paste, and then the electrically conductive paste is cured by applying heat, whereby the bonding surfaces are bonded while ensuring electrical conductivity. The heating conditions at the time of bonding are, for example, about 150° C. and about 30 minutes. As the electrically conductive paste, for example, the following commercial products can be used.

Dodent Model No. NH-070A(L): product name, manufactured by Nihon Handa Co., Ltd.

3300 series Model No. 380B: product name, two-component epoxy conductive adhesive, manufactured by Three Bond Co., Ltd.

In the method for manufacturing a semiconductor device as described above, as a method for forming a patterned thermal conductive layer according to the embodiment of the present invention, a conventionally known printing method such as a screen printing method or an ink jet printing method can be used in addition to the photolithography method as described above. Further, a method of mechanically removing a part of the continuous film-shaped thermal conductive layer can also be used. For example, a continuous film-shaped thermal conductive layer with a sufficient thickness to fill the gaps between the copper pillars is formed on a semiconductor wafer with a copper pillar, and then a part of the thermal conductive layer is mechanically removed using an instrument such as a grinder to expose the copper pillar, whereby the thermal conductive layer can be patterned.

In addition, the semiconductor chip can be manufactured by dicing a semiconductor wafer. Then, in the method for manufacturing a semiconductor device as described above, the bonding method using the solder bump or the electrically conductive paste is appropriately selected according to the type of the object to be bonded. For example, in a case where the objects to be bonded are a semiconductor wafer and a semiconductor chip, these objects can be bonded using a device for chip-on-wafer bonding. In addition, in a case where the objects to be bonded are semiconductor wafers, these objects can be bonded using a device for wafer-wafer bonding, and in a case where the objects to be bonded are semiconductor chips, these objects can be bonded using a device for chip-chip bonding. As the device for chip-chip bonding and chip-on-wafer bonding, for example, bonding devices of various companies such as Toray Engineering Co., Ltd., Shibuya Kogyo Co., Ltd., Shinkawa Co., Ltd., and Yamaha Motor Co., Ltd. can be used. On the other hand, as the device for wafer-wafer bonding, for example, bonding devices of various companies such as Mitsubishi Heavy Industries Machine Tool Co., Ltd., Bond Tech Co., Ltd., PMT Co., Ltd., Ayumi Industries Company Limited, Tokyo Electron (TEL) Co., Ltd., EVG, SUSS MicroTec SE, and Musashino Engineering Co., Ltd. can be used. After the above-mentioned bonding, placing the objects in a reflow oven makes it possible to improve the reliability of electrical bonding by the solder bump or the electrically conductive paste.

Furthermore, the thermal conductive layer according to the embodiment of the present invention can also be used as a pre-coated wafer level non-conductive paste (NCP) and a pre-coated panel level non-conductive paste (NCP). Specifically, it is also possible to manufacture a semiconductor chip in such a manner that an electronic circuit including the thermal conductive layer according to the embodiment of the present invention as a non-conductive portion is collectively formed on a circular substrate such as a semiconductor wafer or a rectangular substrate such as a panel, and then the substrate is divided into individual pieces (processed into chips). By using the semiconductor chip manufactured by the above method for chip-chip bonding or chip-on-wafer bonding, the productivity of semiconductor devices is further improved. In addition, the thermal conductive layer according to the embodiment of the present invention can also be used for die attachment (fixation of a semiconductor chip to an adherend).

The atmosphere at the time of bonding can be selected from an atmospheric air, an inert atmosphere such as a nitrogen atmosphere, a reduced pressure atmosphere including a vacuum atmosphere, and a reducing atmosphere such as hydrogen or formic acid. In a case of the inert atmosphere, oxidation of an electrode surface of a semiconductor device can be suppressed. In a case of the reduced pressure atmosphere, generation of voids can be suppressed. In a case of the reducing atmosphere, satisfactory bonding can be achieved even in a case where the electrode surface of the semiconductor device is oxidized. Furthermore, it is also possible to carry out the bonding while applying ultrasonic waves. The heating temperature at the time of bonding is not particularly limited to the above-mentioned temperature conditions and can be selected in a range of 100° C. to 400° C. It is also possible to heat in a stepwise manner, and in particular, it is also possible to sequentially raise the heating temperature in several stages to carry out the bonding. The pressure (load) at the time of bonding is also not particularly limited, and it is possible to pressurize rapidly or stepwise in accordance with physical properties such as strength of the object to be bonded.

The electrode, which is exposed by patterning the thermal conductive layer according to the embodiment of the present invention by the above method, can be used not only for the flip chip bonding described above but also for bonding with a bonding wire.

The patterned portion of the thermal conductive layer according to the embodiment of the present invention can be used as an alignment mark. The alignment mark is used for alignment such that no positional displacement occurs during bonding. The alignment using the alignment mark is not particularly limited as long as the alignment mark image or reflection image can be obtained and the alignment mark position information can be obtained, and a known alignment method can be appropriately used.

In the semiconductor module 8 as described above, the thermal conductive layer according to the embodiment of the present invention is used for, for example, the portions of the adhesive layers 20 to 23 and the resin insulating layer 35$b$, particularly the portions of the adhesive layers 22 and 23 and the resin insulating layer 35$b$ between the cooling module and the semiconductor chip which is a heat generation source.

The semiconductor device according to the embodiment of the present invention is, for example, an LSI device, but the semiconductor device according to the embodiment of the present invention is not limited thereto and the present invention can be applied to various semiconductor devices.

The present invention is also applicable to logic integrated circuits such as an application specific integrated circuit (ASIC), a field programmable gate array (FPGA), and an application specific standard product (ASSP). In addition, the present invention is also applicable to microprocessors such as a central processing unit (CPU) and a graphics processing unit (GPU). In addition, the present invention is also applicable to memories such as a dynamic random access memory (DRAM), a hybrid memory cube (HMC), a magnetoresistive random access memory (MRAM), a phase-change memory (PCM), a resistance random access memory (ReRAM), a ferroelectric random access memory (FeRAM), and a flash memory. In addition, the present invention is also applicable to analog integrated circuits such as a light emitting diode (LED), a power device, a direct current (DC)-direct current (DC) converter, and an insulated gate bipolar transistor (IGBT). In addition, the present invention is also applicable to micro electro mechanical systems (MEMS) such as an acceleration sensor, a pressure sensor, a vibrator, and a gyroscope sensor. In addition, the present invention is also applicable to, for example, a global positioning system (GPS), frequency modulation (FM), near field communication (NFC), an RF expansion module (RFEM), a monolithic microwave integrated circuit (MMIC), a wireless element such as a wireless local area network (WLAN), a discrete element, a complementary metal oxide semiconductor (CMOS), a CMOS image sensor, a camera module, a passive device, a surface acoustic wave (SAW) filter, a radio frequency (RF) filter, and an integrated passive device (IPD).

The final product on which the semiconductor device according to the embodiment of the present invention as described above is mounted is not particularly limited, and examples thereof include smart TVs, mobile communication terminals, mobile phones, smartphones, tablet terminals, desktop PCs, notebook PCs, network devices (such as router and switching), wired infrastructure equipment, digital cameras, gaming consoles, controllers, data centers, servers, mining PCs, HPC, graphic cards, network servers, storage, chipsets, vehicle-mounted equipment (such as electronic control equipment and driving assistance system), car navigation, PND, lighting (such as general lighting, vehicle lighting, LED lighting, and OLED lighting), TVs, displays, display panels (liquid crystal panel, organic EL panel, and electronic paper), music playback terminals, industrial equipment, industrial robots, inspection equipment, medical equipment, white goods, space/aircraft equipment, and wearable devices.

The thermal conductive layer according to the embodiment of the present invention is not limited to adhesion of the semiconductor device as described above, and can also be applied to adhesion of, for example, a housing of electronic equipment to a component such as a battery, a substrate, or a cooling module (such as a heat pipe). Furthermore, the thermal conductive layer according to the embodiment of the present invention can also be applied to adhesion of a component such as vehicle-mounted electronic equipment, a battery, or a power conversion device to a cooling device using an air cooling mechanism or a water cooling mechanism.

In addition, the thermal conductive layer according to the embodiment of the present invention can also be used for applications other than adhesion. For example, by forming the thermal conductive layer according to the embodiment of the present invention into a fine pattern, the thermal conductive layer can be used as a fine heat radiating fin.

EXAMPLES

Hereinafter, the present invention will be described more specifically with reference to examples. The materials, used amounts, ratios, treatment contents, treatment procedures, and the like shown in the following examples can be appropriately changed without departing from the spirit of the present invention. Therefore, the scope of the present invention is not limited to the specific examples shown below. "Parts" and "%" are based on mass unless otherwise specified.

In addition, in the following examples, the weight-average molecular weight (Mw) and the number-average molecular weight (Mn) are each defined as a value in terms of polystyrene measured by gel permeation chromatography (GPC). For example, the weight-average molecular weight (Mw) and number-average molecular weight (Mn) in the examples can be determined using HLC-8220 (manufactured by Tosoh Corporation), and using TSKgel Super AWM-H (manufactured by Tosoh Corporation, 6.0 mm (inner diameter)×15.0 cm) as a column and a 10 mmol/L lithium bromide N-methylpyrrolidinone (NMP) solution as an eluent.

Examples of the present invention are shown below.
<Preparation of Raw Materials>
As raw materials for forming the composition according to the embodiment of the present invention, the following dispersion liquids 1 to 14, an alkali-soluble resin, a photopolymerization initiator, a polymerizable monomer, an adhesive agent, an epoxy compound, and a surfactant were used.
<<Dispersion Liquid>>
A mixture containing 50% by mass of a filler shown in Table 1, 0.5% by mass of a dispersant shown in Table 1, and 49.5% by mass of a solvent was subjected to a dispersion treatment using a circulation type dispersion apparatus (beads mill) to prepare dispersion liquids 1 to 15. The solvent is propylene glycol-1-monomethyl ether-2-acetate (PGMEA).

TABLE 1

| | Characteristics of filler | | | |
|---|---|---|---|---|
| | Material | Average primary particle diameter μm | Aspect ratio | Dispersant | Content of filler in dispersion liquid % by volume |
| Dispersion liquid 1 | Boron nitride | 0.5 | 5 | X-3 | 30 |
| Dispersion liquid 2 | Aluminum | 2 | 2 | X-1 | 50 |
| Dispersion liquid 3 | Titanium oxide | 0.25 | 2 | X-4 | 60 |

TABLE 1-continued

| | Characteristics of filler | | | |
|---|---|---|---|---|
| | Material | Average primary particle diameter μm | Aspect ratio | Dispersant | Content of filler in dispersion liquid % by volume |
| Dispersion liquid 4 | Silicon carbide | 3 | 2 | X-1 | 50 |
| Dispersion liquid 5 | Graphene surface-treated with silica | 0.5 | 500 | X-2 | 20 |
| Dispersion liquid 6 | Aluminum surface-treated with silica | 2 | 2 | X-2 | 20 |
| Dispersion liquid 7 | Boron nitride | 15 | 5 | X-3 | 30 |
| Dispersion liquid 8 | Boron nitride | 0.5 | 1 | X-3 | 30 |
| Dispersion liquid 9 | Boron nitride | 0.5 | 5 | X-3 | 10 |
| Dispersion liquid 10 | Boron nitride | 0.5 | 5 | X-3 | 70 |
| Dispersion liquid 11 | Aluminum nitride whisker | 5 | 25 | X-3 | 20 |
| Dispersion liquid 12 | Hollow glass | 10 | 2 | X-2 | 50 |
| Dispersion liquid 13 | Alumina | 3 | 1 | X-3 | 30 |
| Dispersion liquid 14 | Alumina | 3 (70% by mass) 0.4 (30% by mass) | 1 | X-3 | 60 |
| Dispersion liquid 15 | Alumina | 0.4 | 1 | X-3 | 60 |

The alumina used in the dispersion liquid 14 is a material that is adjusted and mixed such that the mass ratio of particles having an average primary particle diameter of 3 μm and particles having an average primary particle diameter of 0.4 m is 7:3.

In addition, the manufacturers and product numbers of the fillers shown in Table 1 are as follows. In particular, the "graphene surface-treated with silica" is a filler obtained by surface-treating the following graphene material with silica, and the "aluminum surface-treated with silica" is a filler obtained by surface-treating the following aluminum material with silica.

Boron nitride (average primary particle diameter: 0.5 μm, aspect ratio: 5): product number MBN-010, manufactured by Mitsui Chemicals, Inc.
Boron nitride (average primary particle diameter: 15 μm, aspect ratio: 5): product number PCTP16, manufactured by Saint-Gobain S.A.
Boron nitride (average primary particle diameter: 0.5 μm, aspect ratio: 1): manufactured by DENKA Company Limited
Aluminum: product number TFH-A02P, manufactured by Toyo Aluminium K.K.
Titanium oxide: product number PT-301, manufactured by Ishihara Sangyo Kaisha Ltd.
Silicon carbide: product number GP #4000, manufactured by Shinano Electric Refining Co., Ltd.
Graphene: product number E324, manufactured by Graphene Platform Corporation
Aluminum nitride whisker: manufactured by U-MaP Co., Ltd.
Hollow glass: product number Sphericel (registered trademark) series 110P8, manufactured by Potters-Ballotini Co., Ltd.

Alumina (particle diameter: 3 μm, aspect ratio: 1): product number AA-3, manufactured by Sumitomo Chemical Co., Ltd.

Alumina (particle diameter: 0.4 μm, aspect ratio: 1): product number AA-04, manufactured by Sumitomo Chemical Co., Ltd.

Regarding "Graphene surface-treated with silica" and "Aluminum surface-treated with silica" in Table 1, the surface treatment with silica was carried out using a sol-gel reaction method described below.

50 parts by mass of tetraethyl silicate, 86.4 parts by mass of water, 10.8 parts by mass of methanol, and 0.08 parts by mass of phosphoric acid (85%) were mixed and stirred for 40 minutes to prepare a sol-gel reaction solution. Then, 5 parts by mass of graphene or aluminum powder was mixed with the sol-gel reaction solution, and the mixture was stirred for 1 minute and then dried to obtain "graphene surface-treated with silica" and "aluminum surface-treated with silica". Here, in the drying step, the above-mentioned mixture was sequentially subjected to first drying at 150° C. using a spray dryer SD-1000 (manufactured by Tokyo Rikakikai Co., Ltd.), washing with pure water, and second drying at 150° C. using the same spray dryer.

In addition, the operating conditions of the above dispersion apparatus are as follows.

Operating Conditions
Bead material: zirconia
  Bead diameter: 0.2 mm in diameter
  Bead filling rate: 65% by volume
  Circumferential speed: 6 m/sec
  Pump supply: 10.8 kg/hour
  Cooling water: tap water
  Beads mill annular passage internal volume: 0.15 L
  Amount of mixture for dispersion treatment: 0.65 kg
After the start of dispersion, the average primary particle diameter of the filler was measured at intervals of 30 minutes. The average primary particle diameter of the filler decreased with the dispersion time, but the amount of change gradually decreased. The dispersion treatment was terminated in a case where there was no change in d50 (integrated value 50%) in the particle size distribution.

Dispersants X-1, X-2, X-3, and X-4 are as follows.

X-1: Solsperse 36000 (manufactured by Lubrizol Corporation).

X-2: Solsperse 41000 (manufactured by Lubrizol Corporation).

X-3: a resin having the following structure (Mw=13,000). The numerical value written together with each repeating unit represents the content [molar ratio] of each repeating unit. The numerical value written together with the side chain repeating portion indicates the number of repetitions of the side chain repeating portion.

X-4: a resin having the following structure (Mw=13,000). The numerical value written together with each repeating unit represents the content [molar ratio] of each repeating unit. The numerical value written together with the side chain repeating portion indicates the number of repetitions of the side chain repeating portion.

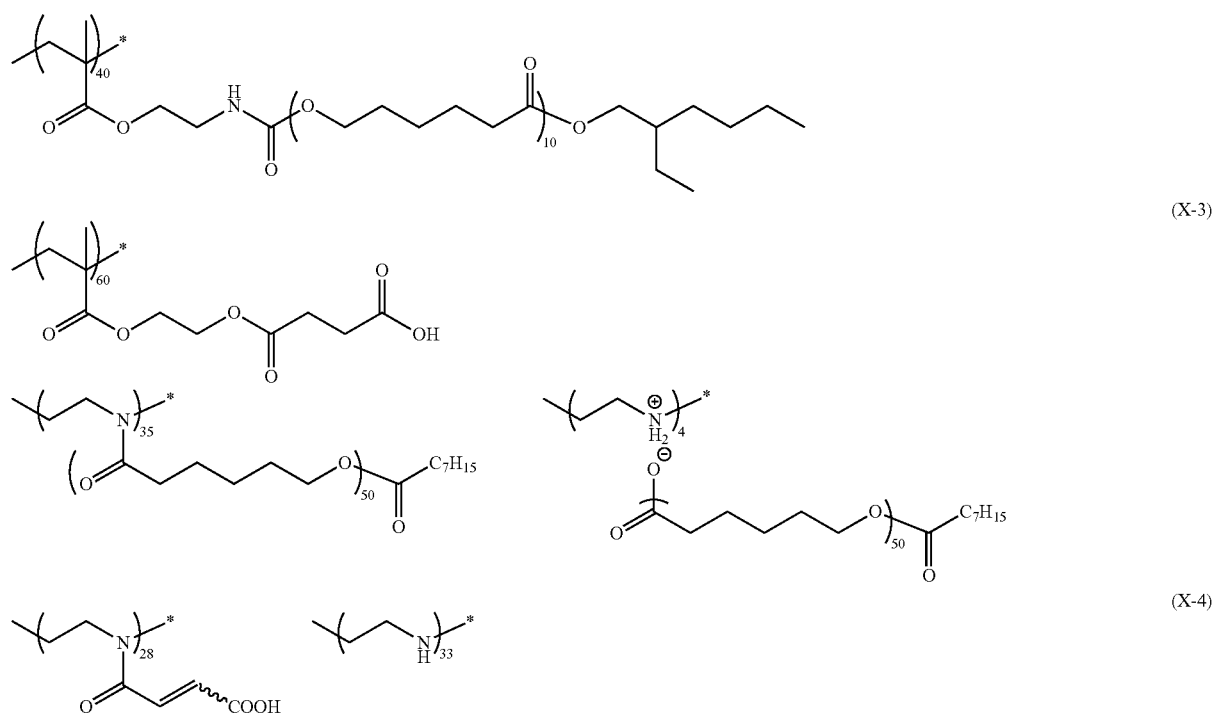

<<Alkali-Soluble Resin>>

B-1: poly(parahydroxystyrene) (Mw=4,000, acid value=467 mgKOH/g).

B-2: a resin having the following structure (Mw=30,000, acid value=105 mgKOH/g). The numerical value written together with each repeating unit represents the content [molar ratio] of each repeating unit.

B-3: a resin having the following structure (Mw=11,000, acid value=70 mgKOH/g). The numerical value written together with each repeating unit represents the content [molar ratio] of each repeating unit. Here, Me represents a methyl group.

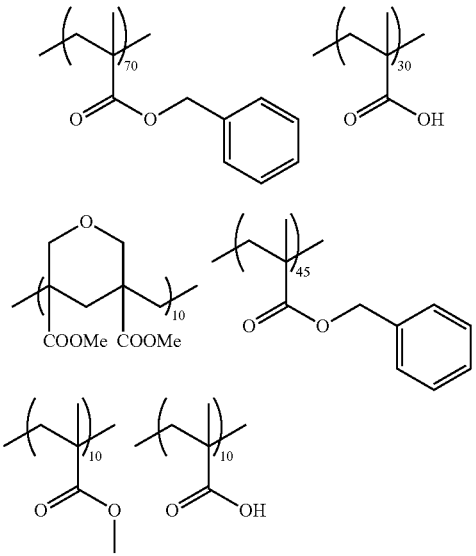

B-2

B-3

<<Photopolymerization Initiator>>

C-1: IRGACURE OXE01 (manufactured by BASF SE).

C-2: a compound having the following structure (methylnaphtho[2,1-b]furan-1(2H)-one-O-tosyloxime).

C-3: a photobase generator WPBG-041 (manufactured by FUJIFILM Wako Pure Chemical Industries, Ltd.).

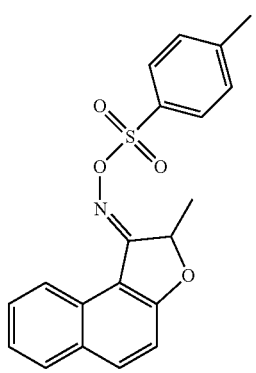 [SMILES: Cc1ccc(S(=O)(=O)O/N=C2/c3c(ccc4ccccc34)OC2C)cc1]

C-2

<<Polymerizable Monomer and Cross-Linking Agent>>

D-1: a compound having the following structure

D-2: NK ester A-TMMT (manufactured by Shin-Nakamura Chemical Co., Ltd.).

D-3: pentaerythritol acrylate (M-305, manufactured by Toagosei Co., Ltd.).

D-1

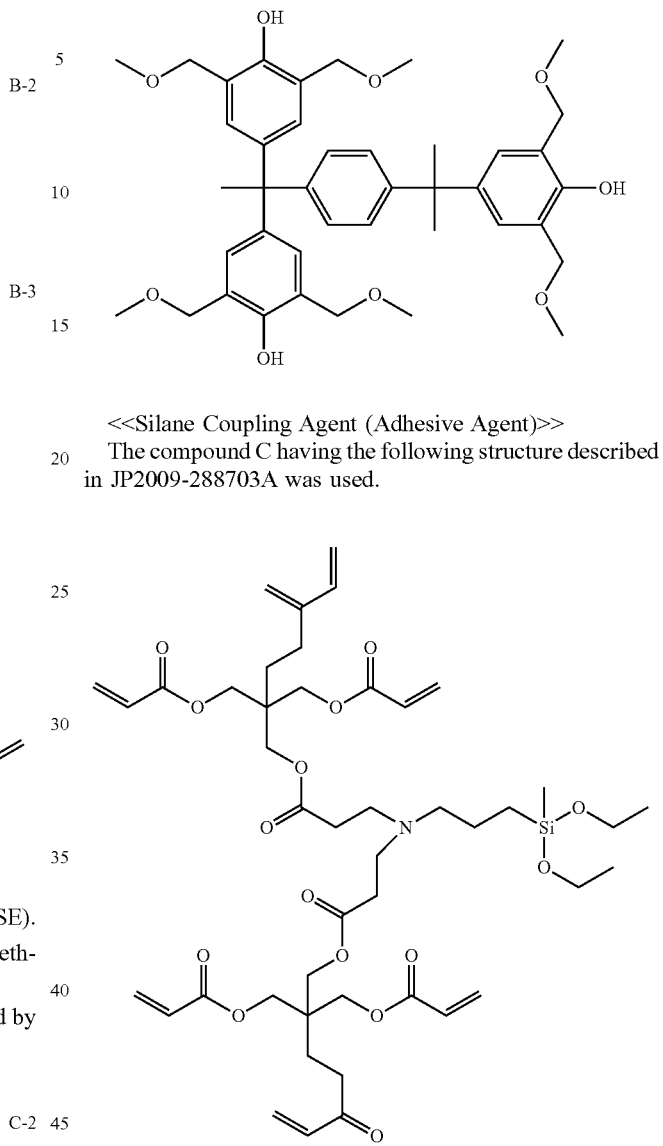

<<Silane Coupling Agent (Adhesive Agent)>>

The compound C having the following structure described in JP2009-288703A was used.

<<Epoxy Compound>>

E-1: EHPE 3150 (manufactured by Daicel Corporation).

E-2: tetraphenylol ethane glycidyl ether (manufactured by Merck & Co., Inc.).

<<Surfactant>>

A mixture M (Mw=14,000) containing a compound having the following structure was used. Here, $L_1$, $L_2$, $M_1$, $M_2$, $N_1$, and $N_2$ written together with each repeating unit represent the ratio (molar ratio) of the repeating unit. In addition, "%" attached to the numerical value indicates the mixing ratio (% by mass) of each of the left and right groups.

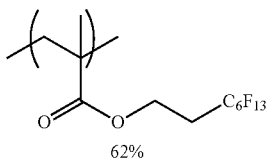

62%

-continued

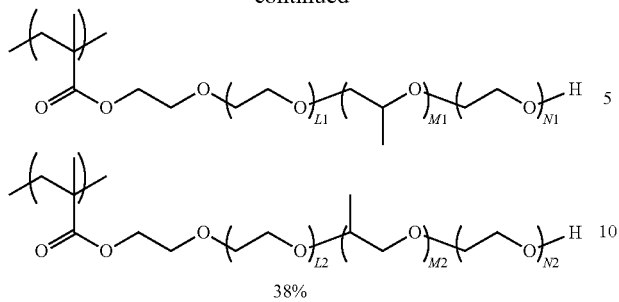

L1 + N1 + L2 + N2 = 14
M1 + M2 = 17

Compositions According to Examples and Comparative Examples

As shown in Table 2, the above-mentioned raw materials were mixed and filtered through a polytetrafluoroethylene membrane filter (manufactured by Wintec, Inc.) having a nominal pore diameter of 20 to 30 μm to prepare compositions according to Examples 1 to 9, 11 to 20 and Comparative Examples 1 and 2.

On the other hand, for Example 10, a composition was prepared as follows. A composition was prepared by dissolving 82.62 parts by mass of a polyimide precursor, 12.4 parts by mass of a radical polymerizable monomer, 2.86 parts by mass of a photo radical polymerization initiator, 1.65 parts by mass of an adhesive agent, 0.27 parts by mass of a migration inhibitor, 0.17 parts by mass of a polymerization inhibitor, 0.17 parts by mass of a thermal base generator (thermal curing accelerator), 0.1 parts by mass of a surfactant, and 0.05 parts by mass of a plasticizer in a solvent such that the concentration of solid contents was 50 parts by mass, based on total solid content.

The specific raw materials at this time are as follows.
Polyimide precursor: a compound obtained by the synthetic method described below
  Radical polymerizable monomer: NK ester A-9300 (manufactured by Shin-Nakamura Chemical Co., Ltd.)
  Photo radical polymerization initiator: IRGACURE OXE-01 (manufactured by BASF SE)
Adhesive agent: KBM-602 (manufactured by Shin-Etsu Chemical Co., Ltd.)
Migration inhibitor: 1H-tetrazole
Polymerization inhibitor: 4-methoxyphenol
Thermal base generator: a compound A-21 having the following structure Surfactant: MEGAFAC F-444 (manufactured by DIC Corporation)
Plasticizer: O-180A (manufactured by ADEKA Corporation)
Solvent: dimethyl sulfoxide (DMSO): γ-butyrolactone (GBL)=2:8 (mass ratio)

(A-21)

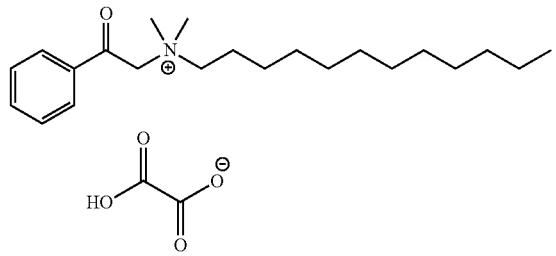

Synthesis Example of Polyimide Precursor of Example 10

14.06 g (64.5 mmol) of pyromellitic dianhydride (dried at 140° C. for 12 hours) and 16.33 g (131.58 mmol) of 3-hydroxybenzyl alcohol were suspended in 50 mL of N-methylpyrrolidone and dried with a molecular sieve. The suspension was heated at 100° C. for 3 hours. A clear solution was obtained after a few minutes of heating. The reaction mixture was cooled to room temperature and 21.43 g (270.9 mmol) pyridine and 90 mL N-methylpyrrolidone were added thereto. The reaction mixture was then cooled to −10° C. and 16.12 g (135.5 mmol) thionyl chloride was added thereto over 10 minutes keeping the temperature at −10° C.±4° C. The viscosity increased during the addition of thionyl chloride. After diluting with 50 mL of N-methylpyrrolidone, the reaction mixture was stirred at room temperature for 2 hours. Then, a solution of 11.08 g (58.7 mmol) of 4,4'-diaminodiphenyl ether dissolved in 100 mL of N-methylpyrrolidone was added dropwise to the reaction mixture at 20° C. to 23° C. over 20 minutes. The reaction mixture was then stirred overnight at room temperature. The polyimide precursor was then precipitated in 5 L of water and the water-polyimide precursor mixture was stirred for 15 minutes at a speed of 5,000 rpm. The polyimide precursor was filtered off, stirred again in 4 L of water for 30 minutes and filtered again. Then, the obtained polyimide precursor was dried under reduced pressure at 45° C. for 3 days. This polyimide precursor had Mw=22,800 and Mn=8,100.

TABLE 2

| | Dispersion liquid No. | Dispersion liquid % by mass | Solvent | % by mass | Alkali-soluble resin | % by mass | Photopolymerization initiator | % by mass |
|---|---|---|---|---|---|---|---|---|
| Example 1 | 1 | 50 | PGMEA | 25.01 | B-3 | 11.63 | C-1 | 2.20 |
| Comparative Example 1 | 2 | 50 | PGMEA | 29.59 | B-3 | 9.50 | C-1 | 1.80 |
| Example 2 | 3 | 50 | PGMEA | 35.92 | B-3 | 6.55 | C-1 | 1.24 |
| Example 3 | 4 | 50 | PGMEA | 31.93 | B-3 | 8.41 | C-1 | 1.59 |
| Example 4 | 5 | 50 | PGMEA | 38.23 | B-3 | 5.48 | C-1 | 1.04 |
| Example 5 | 6 | 50 | PGMEA | 38.23 | B-3 | 5.48 | C-1 | 1.04 |
| Example 6 | 7 | 50 | PGMEA | 25.01 | B-3 | 11.63 | C-1 | 2.20 |
| Example 7 | 8 | 50 | PGMEA | 25.01 | B-3 | 11.63 | C-1 | 2.20 |
| Example 8 | 9 | 20 | PGMEA | 39.97 | B-3 | 18.63 | C-1 | 3.53 |

TABLE 2-continued

| | | | | | | | | |
|---|---|---|---|---|---|---|---|---|
| Example 9 | 10 | 50 | PGMEA | 45.59 | B-3 | 2.05 | C-1 | 0.39 |
| Example 10 | 1 | 50 | DMSO:GBL = 2:8 | 25.00 | Details are stated in specification | | | |
| Example 11 | 11 | 50 | PGMEA | 19.42 | B-3 | 14.23 | C-1 | 2.70 |
| Comparative Example 2 | 12 | 50 | PGMEA | 26.93 | B-3 | 10.73 | C-1 | 2.03 |
| Example 12 | 1 | 50 | PGMEA | 25.01 | B-3 | 11.63 | C-1 | 2.20 |
| Example 13 | 13 | 65 | PGMEA | 18.30 | B-3 | 10.00 | C-1 | 0.18 |
| Example 14 | 14 | 84 | PGMEA | 13.22 | B-3 | 4.57 | C-1 | 0.08 |
| Example 15 | 14 | 72 | PGMEA | 12.75 | B-1 | 11.80 | C-2 | 1.20 |
| Example 16 | 14 | 72 | PGMEA | 14.52 | B-1 | 7.97 | C-2 | 0.81 |
| Example 17 | 14 | 72 | PGMEA | 16.10 | B-1 B-2 | 7.03 2.14 | C-2 | 0.71 |
| Example 18 | 14 | 75 | PGMEA | 10.36 | B-2 | 10.36 | C-2 | 1.72 |
| Example 19 | 14 | 75 | PGMEA | 10.36 | B-2 | 10.36 | C-3 | 1.72 |
| Example 20 | 15 | 27 | PGMEA | 49.91 | B-2 | 15.60 | C-2 | 2.60 |

| | Polymerizable monomer or cross-linking agent % by mass | | Silane coupling agent % by mass | | Compound having epoxy group % by mass | | Surfactant % by mass | |
|---|---|---|---|---|---|---|---|---|
| Example 1 | D-2 | 8.26 | Compound C | 1.53 | E-1 | 1.35 | Mixture M | 0.02 |
| Comparative Example 1 | D-2 | 6.75 | Compound C | 1.25 | E-1 | 1.10 | Mixture M | 0.02 |
| Example 2 | D-2 | 4.66 | Compound C | 0.86 | E-1 | 0.76 | Mixture M | 0.01 |
| Example 3 | D-2 | 5.97 | Compound C | 1.11 | E-1 | 0.97 | Mixture M | 0.01 |
| Example 4 | D-2 | 3.89 | Compound C | 0.72 | E-1 | 0.63 | Mixture M | 0.01 |
| Example 5 | D-2 | 3.89 | Compound C | 0.72 | E-1 | 0.63 | Mixture M | 0.01 |
| Example 6 | D-2 | 8.26 | Compound C | 1.53 | E-1 | 1.35 | Mixture M | 0.02 |
| Example 7 | D-2 | 8.26 | Compound C | 1.53 | E-1 | 1.35 | Mixture M | 0.02 |
| Example 8 | D-2 | 13.24 | Compound C | 2.45 | E-1 | 2.16 | Mixture M | 0.03 |
| Example 9 | D-2 | 1.46 | Compound C | 0.27 | E-1 | 0.24 | Mixture M | 0.003 |
| Example 10 | Details are stated in specification | | | | | | | |
| Example 11 | D-2 | 10.11 | Compound C | 1.87 | E-1 | 1.65 | Mixture M | 0.02 |
| Comparative Example 2 | D-2 | 7.63 | Compound C | 1.41 | E-1 | 1.24 | Mixture M | 0.02 |
| Example 12 | D-2 | 8.26 | Compound C | 1.53 | E-1 | 1.35 | Mixture M | 0.02 |
| Example 13 | D-3 | 6.46 | Compound C | 0.03 | None | — | Mixture M | 0.03 |
| Example 14 | D-3 | 2.95 | Compound C | 0.01 | None | — | Mixture M | 0.014 |
| Example 15 | D-1 | 2.25 | None | — | None | — | None | — |
| Example 16 | D-1 | 1.52 | None | — | E-2 | 3.19 | None | — |
| Example 17 | D-1 | 1.34 | None | — | E-2 | 0.67 | None | — |
| Example 18 | None | — | None | — | E-2 | 2.56 | None | — |
| Example 19 | None | — | None | — | E-2 | 2.56 | None | — |
| Example 20 | None | — | None | — | E-2 | 4.89 | None | — |

In the compositions of Examples 1 to 20 and Comparative Examples 1 and 2, the ratio of the filler to the total solid content is as shown in Table 3.

TABLE 3

| | | Content of filler in composition | | Volume reduction rate |
|---|---|---|---|---|
| | Filler | % by mass | % by volume | % |
| Example 1 | Boron nitride | 50 | 30 | 14 |
| Comparative Example 1 | Aluminum | 55 | 30 | 14 |
| Example 2 | Titanium oxide | 64 | 30 | 14 |
| Example 3 | Silicon carbide | 58 | 30 | 14 |
| Example 4 | Graphene surface-treated with silica | 68 | 60 | 8 |
| Example 5 | Aluminum surface-treated with silica | 68 | 60 | 8 |
| Example 6 | Boron nitride | 50 | 30 | 14 |
| Example 7 | Boron nitride | 50 | 30 | 14 |
| Example 8 | Boron nitride | 20 | 10 | 18 |
| Example 9 | Boron nitride | 85 | 70 | 6 |
| Example 10 | Boron nitride | 50 | 30 | 21 |
| Example 11 | Aluminum nitride whisker | 45 | 20 | 16 |
| Comparative Example 2 | Hollow glass | 52 | 30 | 14 |
| Example 12 | Boron nitride | 50 | 30 | 4 |
| Example 13 | Alumina (3 μm) | 60 | 30 | 9 |
| Example 14 | Two types of alumina | 90 | 70 | 2 |
| Example 15 | Two types of alumina | 80 | 50 | 3 |
| Example 16 | Two types of alumina | 80 | 50 | 3 |
| Example 17 | Two types of alumina | 80 | 50 | 3 |
| Example 18 | Two types of alumina | 80 | 50 | 3 |
| Example 19 | Two types of alumina | 80 | 50 | 3 |
| Example 20 | Alumina (0.4 μm) | 50 | 20 | 12 |

<Pattern Manufacturing Method>

Each composition obtained above was applied onto a 8-inch silicon wafer (1 inch is 2.54 cm) using a spin coater such that the thickness after drying was 20.0 μm (however, 5.0 m for Example 20), and the applied film was subjected to a heat treatment (pre-baking) for 120 seconds using a hot plate at 100° C. to form a photosensitive layer. Then, using an i-line stepper exposure apparatus FPA-3000i5+(manufactured by Canon Inc.), the photosensitive layer was subjected to an exposure treatment by irradiation with light having a wavelength of 365 nm at 1000 mJ/cm$^2$ through a mask having two hole patterns with diameters of 50 μm and 10 μm. Then, the silicon wafer on which the exposed photosensitive layer was formed was placed on a horizontal rotary table of a spin shower developing machine (DW-30 type, manufactured by Chemitronics Co., Ltd.), and puddle development was carried out at 23° C. for 65 seconds using a 0.3% by mass aqueous solution of tetramethylammonium hydroxide (TMAH) to form a thermal conductive layer having a hole pattern on the silicon wafer.

The silicon wafer on which the thermal conductive layer was formed was fixed on a horizontal rotary table by a vacuum chuck method, and while rotating the silicon wafer at a rotation speed of 50 rpm by a rotating device, pure water was supplied from above the center of rotation in the form of a shower from a jet nozzle to carry out a rinse treatment, followed by spray drying. Then, the silicon wafer was heated on a hot plate at 200° C. for 5 minutes to cure the thermal conductive layer, and then cooled to room temperature. However, in Example 12, the heating conditions on the hot plate were changed to 150° C. for 1 minute.

Particularly in Example 10, after the exposure, the resin film having an exposed area and an unexposed area was spin-washed with cyclopentanone for 60 seconds to remove the unexposed area (negative development). Furthermore, the residue was removed by rinsing with PGMEA to obtain a thermal conductive layer. Next, the temperature was raised from room temperature, and after the maximum heating temperature reached 350° C., heating was carried out for 1 hour to cure the thermal conductive layer, and then the temperature was cooled to room temperature.

The volume reduction rates of the thermal conductive layers of Examples 1 to 20 and Comparative Examples 1 and 2 were as shown in Table 3.

<Evaluation>

As the characteristic evaluation of the thermal conductive layers obtained above, individual items of fine pattern formability, thermal conductivity, electrical insulation, alkaline development resistance, adhesiveness to silicon oxide film, and adhesiveness to copper were evaluated by the following methods.

<<Fine Pattern Formability>>

The characteristics were evaluated according to the following three grades.

A: Both the 50 μm pattern and the 10 μm pattern were resolvable.

B: The 50 μm pattern was resolvable, but the 10 μm pattern was not resolvable.

C: Both the 50 μm pattern and the 10 μm pattern were not resolvable.

<<Thermal Conductivity>>

The thermal conductivity was evaluated based on the thermal diffusivity. The thermal diffusivity was measured by a thermal diffusivity measuring device FTC-RT (manufactured by Advance Riko, Inc.) based on a periodic heating method (in accordance with The International Standard ISO 22007-3: Plastics). The measurement was carried out by acquiring reference data of a silicon wafer having the same thickness and calculating the difference therebetween. The thermal diffusivity was measured by contacting the device with a portion where no hole pattern was formed, and evaluated according to the following three grades.

A: The thermal diffusivity is $1.0 \times 10^{-6}$ m$^2$ s$^{-1}$ or more.

B: The thermal diffusivity is $5.0 \times 10^{-7}$ m$^2$ s$^{-1}$ or more and less than $1.0 \times 10^{-1}$ m$^2$ s$^{-1}$.

C: The thermal diffusivity is less than $5.0 \times 10^{-7}$ m$^2$ s$^{-1}$.

<<Electrical Insulation>>

The substrate was changed from a silicon wafer to a substrate obtained by sputtering gold on a silicon wafer, and the thermal conductive layer was formed using the compositions according to Examples 1 to 20 and Comparative Examples 1 and 2 in the same manner as above. The electrical insulation was evaluated based on the volume resistivity. The volume resistivity was measured using a HIRESTA-UX MCP-HT800 (in accordance with JIS K6911) as a resistivity meter for high resistance, and evaluated according to the following three grades.

A: The volume resistivity is $1.0 \times 10^{12}$ Ω·cm or more.

B: The volume resistivity is $1.0 \times 10^{11}$ Ω·cm or more and less than $1.0 \times 10^{12}$ Ω·cm.

C: The volume resistivity is less than $1.0 \times 10^{11}$ Ω·cm.

<<Alkaline Development Resistance>>

On the thermal conductive layer on which the hole pattern was formed, a color resist was applied and pre-baked, only a color resist of the hole portion was exposed using a mask that can expose only the hole portion, an alkali developing treatment was then carried out to remove the color resist other than the hole portion, and a thermal conductive layer filled with the color resist was formed in the hole pattern. Then, the thermal diffusivity was measured again, and the degree of resistance of the thermal conductive layer to alkaline development was evaluated according to the following three grades, based on the value of the thermal diffusivity.

A: The thermal diffusivity is $1.0 \times 10^{-6}$ m$^2$s$^{-1}$ or more.

B: The thermal diffusivity is $5.0 \times 10^{-7}$ m$^2$ s$^{-1}$ or more and less than $1.0 \times 10^{-6}$ m$^2$ s$^{-1}$.

C: The thermal diffusivity is less than $5.0 \times 10^{-7}$ m$^2$ s$^{-1}$.

<<Adhesiveness to Silicon Oxide Film>>

First, an 8-inch silicon wafer with a silicon oxide film and a 5 mm square silicon chip with a silicon oxide film prepared by dicing the same type of wafer were prepared. Then, the silicon wafer with a silicon oxide film was used instead of the 8-inch silicon wafer in the section of "Pattern manufacturing method" described in the above Example, and the steps up to the developing step in the section of "Pattern manufacturing method" were carried out to form two hole patterns in the thermal conductive layer. Next, the silicon chip was bonded to the remaining thermal conductive layer portion so as to cover the two hole patterns. This bonding was carried out by treating the silicon chip placed on the thermal conductive layer at 200° C. for 5 minutes using a chip bonder (DB250, manufactured by Shibuya Kogyo Co., Ltd.). As described above, a laminate in which the semiconductor wafer and the semiconductor chip were bonded was obtained. In Example 10, after bonding, the laminate was further heated at 350° C. for 60 minutes using an oven.

The sample after bonding was subjected to a die shear test using a universal bond tester (DAGE4000, manufactured by DAGE Holdings Limited), and the adhesiveness between the thermal conductive layer and the silicon chip was evaluated according to the following standards.

A: The peeling strength is 120% or more based on the peeling strength of Example 1.

B: The peeling strength is less than 120% and 80% or more based on the peeling strength of Example 1.

C: The peeling strength is less than 80% and 50% or more based on the peeling strength of Example 1.

D: The peeling strength is less than 50% based on the peeling strength of Example 1.

<<Adhesiveness to Copper>>

A copper film having a thickness of 100 nm was formed on an 8-inch silicon wafer by a sputtering method to prepare a copper sputtered wafer. In addition, a copper sputtered wafer formed separately by the same method was diced to prepare a 5 mm square copper sputtered chip. Then, these copper sputtered wafers and copper sputtered chips were bonded by the same bonding method as described in the section of "Adhesiveness to silicon oxide film", and then the adhesiveness between the thermal conductive layer and the copper sputtered chip was evaluated by the same evaluation method as described in the section of "Adhesiveness to silicon oxide film".

<<Confirmation of Heat Dissipation>>

A hole pattern was formed on the surface of the semiconductor wafer by using the composition of Example 1 in accordance with the section of "Pattern manufacturing method" described in the above-mentioned examples to expose an electrode on the surface of the semiconductor wafer. A solder bump was formed on the electrode by solder plating. At this time, the plating time was adjusted such that the height of the solder bump was the same as the film thickness of the thermal conductive layer. Next, a semiconductor chip on the opposite side to be bonded was prepared, and a laminate was obtained in which the semiconductor wafer and the semiconductor chip were bonded to each other by carrying out a treatment under heating conditions of 200° C. for 5 minutes using the chip bonder. At this time, the positions of the electrodes of the semiconductor wafer and the semiconductor chip were aligned by alignment marks formed in advance on the corners of the chip so as not to be misaligned. The alignment mark on the semiconductor wafer side was formed by the pattern of the thermal conductive layer. After the bonding, the laminate was heated at 260° C. for 30 seconds in a reflow oven. Thereafter, the laminate was trimmed by dicing, and the trimmed laminate was molded with a resin to manufacture a semiconductor package A.

Further, the same semiconductor package B was manufactured using the composition of Comparative Example 2 instead of the composition of Example 1 in the above semiconductor package manufacturing method.

In a case where each semiconductor package was operated while observing by thermography, it was confirmed that the semiconductor package A had less heat storage during operation than the semiconductor package B, and was able to dissipate heat efficiently.

<<Evaluation Results>>

Table 4 shows the evaluation results of individual items. The items with "—" in the table were not evaluated.

TABLE 4

|  | Fine pattern formability | Thermal conductivity | Electrical insulation | Alkaline development resistance | Adhesiveness to silicon oxide film | Adhesiveness to copper |
| --- | --- | --- | --- | --- | --- | --- |
| Example 1 | A | A | A | A | — | — |
| Comparative Example 1 | A | A | C | C | C | C |
| Example 2 | A | B | A | B | — | — |
| Example 3 | A | A | B | A | — | — |
| Example 4 | B | A | B | A | — | — |
| Example 5 | A | A | B | B | — | — |
| Example 6 | B | A | A | A | B | B |
| Example 7 | A | B | A | B | B | B |
| Example 8 | A | B | A | B | — | — |
| Example 9 | B | A | A | A | — | — |
| Example 10 | B | A | A | A | A | A |
| Example 11 | A | A | A | A | — | — |
| Comparative Example 2 | A | C | A | C | — | — |
| Example 12 | A | B | A | A | B | B |
| Example 13 | B | B | A | A | — | — |
| Example 14 | B | A | A | A | — | — |
| Example 15 | A | A | B | A | B | B |
| Example 16 | B | A | B | A | A | A |
| Example 17 | B | A | B | A | A | A |
| Example 18 | — | A | B | — | A | A |
| Example 19 | — | A | A | — | A | A |
| Example 20 | — | B | B | — | A | A |

As shown in Table 4, novel thermal conductive layers having both high thermal conductivity and high electrical insulation were obtained in Examples 1 to 20 of the present invention. Further, it was also found that the thermal conductive layers of Examples 1 to 17 of the present invention were more excellent in fine pattern formability and alkaline development resistance than Comparative Examples, and were therefore useful as an insulating material for semiconductor devices. In addition, it was also found that the thermal conductive layers of Examples 6, 7, 10, 12, and 15 to 20 of the present invention were more excellent in adhesiveness to a silicon oxide film and adhesiveness to copper than Comparative Examples, and were therefore useful as an adhesive for semiconductor devices.

By setting the volume reduction rate of the photosensitive layer at the time of forming the thermal conductive layer to 5% or more, a thermal conductive layer having higher thermal conductivity was obtained (comparison between Example 1 and Example 12).

EXPLANATION OF REFERENCES

1: base material
2: resin film
3: filler
4: thermal conductive layer
5: laminate
8: semiconductor module
10: support substrate
11: lid
12: first semiconductor chip
13: second semiconductor chip
15: cooling module
20 to 23: adhesive layer
25: interlayer
32, 33: LSI chip
32a, 33a: wiring layer
35a: solder bump
35b: resin insulating layer
35c: photosensitive layer
36: hole for solder bump
E: heat energy (heat dissipation)

What is claimed is:

1. A thermal conductive layer comprising:
   at least one filler,
   wherein the thermal conductive layer has a thermal diffusivity of $5.0\times10^{-7}$ m$^2$s$^{-1}$ or more and a volume resistivity of $1.0\times10^{11}$ Ω·cm or more,
   wherein the thermal conductive layer is formed of a photosensitive layer comprising the at least one filler and a photosensitive material,
   wherein a content of the at least one filler of the photosensitive layer is 70% by mass or less with respect to the total mass of the photosensitive layer,
   wherein the filler has an aspect ratio of 5 or more,
   wherein a content of the at least one filler of the photosensitive layer is 20% to 60% by volume with respect to the total volume of the photosensitive layer.

2. The thermal conductive layer according to claim 1, wherein the filler has a thermal diffusivity of $1.0\times10^{-6}$ m$^2$s$^{-1}$ or more and a volume resistivity of $1.0\times10^{11}$ Ω·cm or more.

3. The thermal conductive layer according to claim 1, wherein a material of the filler is at least one of boron nitride, aluminum nitride, silicon nitride, aluminum oxide, magnesium oxide, zinc oxide, or beryllium oxide.

4. The thermal conductive layer according to claim 1, wherein the filler has an average primary particle diameter of 10 μm or less.

5. The thermal conductive layer according to claim 1, wherein the thermal conductive layer includes at least one of a polyimide resin, an acrylic resin, or a compound having an epoxy group.

6. The thermal conductive layer according to claim 1, wherein the thermal conductive layer has a patterned shape.

7. The thermal conductive layer according to claim 1, wherein the photosensitive layer has a volume reduction rate of 5% or more in a case where the thermal conductive layer is formed.

8. A photosensitive composition for forming the thermal conductive layer or the photosensitive layer according to claim 1, the photosensitive composition comprising:
   at least one filler; and
   a photosensitive material.

9. A manufacturing method for a thermal conductive layer, comprising:
   a step of applying the photosensitive composition according to claim 8 onto a base material to form a photosensitive layer for forming a thermal conductive layer;
   a step of exposing the photosensitive layer to light; and
   a step of developing the exposed photosensitive layer.

10. A laminate comprising:
    the thermal conductive layer according to claim 1; and
    a base material.

11. The laminate according to claim 10,
    wherein the laminate has a heat absorbing portion that is in contact with the thermal conductive layer.

12. A laminate comprising:
    the thermal conductive layer according to claim 1; and
    a base material.

13. A semiconductor device comprising:
    the thermal conductive layer according to claim 1.

14. The thermal conductive layer according to claim 1,
    wherein the filler has a thermal diffusivity of $1.0\times10^{-6}$ m$^2$s$^{-1}$ or more and a volume resistivity of $1.0\times10^{11}$ Ω·cm or more,
    wherein the thermal conductive layer is formed of a layer comprising the at least one filler, a photopolymerization initiator, and a polymerizable monomer,
    wherein a content of the at least one filler of the layer is 70% by mass or less with respect to the total mass of the layer.

15. A thermal conductive layer comprising:
    at least one filler,
    wherein the thermal conductive layer has a thermal diffusivity of $5.0\times10^{-7}$ m$^2$s$^{-1}$ or more and a volume resistivity of $1.0\times10^{11}$ Ω·cm or more,
    wherein the thermal conductive layer is formed of a layer comprising the at least one filler, an alkali-soluble resin, and a polymerizable monomer,
    wherein a content of the at least one filler of the layer is 70% by mass or less with respect to the total mass of the layer,
    wherein the filler has an aspect ratio of 5 or more,
    wherein a content of the at least one filler of the layer is 20% to 60% by volume with respect to the total volume of the layer.

16. A thermal conductive layer comprising:
    at least one filler,
    wherein the thermal conductive layer has a thermal diffusivity of $5.0\times10^{-7}$ or more and a volume resistivity of $1.0\times10^{11}$ Ω·cm or more,
    wherein the thermal conductive layer is formed of a layer comprising the at least one filler and a polyimide precursor,
    wherein the filler has an aspect ratio of 5 or more,
    wherein a content of the at least one filler of the layer is 20% to 60% by volume with respect to the total volume of the layer.

17. The thermal conductive layer according to claim 16,
    wherein a content of the at least one filler of the layer is 70% by mass or less with respect to the total mass of the layer.

18. The thermal conductive layer according to claim 16,
    wherein the polyimide precursor comprises a repeating unit represented by Formula (5):

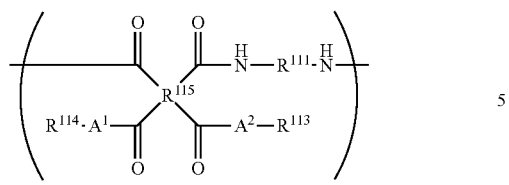

in Formula (5), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group.

19. The thermal conductive layer according to claim 16, wherein a content of the at least one filler of the layer is 50% by mass or more and 70% by mass or less with respect to the total mass of the layer.

* * * * *